(12) United States Patent
Park et al.

(10) Patent No.: US 8,233,313 B2
(45) Date of Patent: Jul. 31, 2012

(54) CONDUCTIVE ORGANIC NON-VOLATILE MEMORY DEVICE WITH NANOCRYSTALS EMBEDDED IN AN AMORPHOUS BARRIER LAYER

(75) Inventors: Jea-Gun Park, Ichon-shi (KR); Sung-Ho Seo, Ichon-shi (KR); Woo-Sik Nam, Ichon-shi (KR); Young-Hwan Oh, Ichon-shi (KR); Yool-Guk Kim, Ichon-shi (KR); Hyun-Min Seung, Ichon-shi (KR); Jong-Dae Lee, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/286,861

(22) Filed: Nov. 1, 2011

(65) Prior Publication Data

US 2012/0044767 A1 Feb. 23, 2012

Related U.S. Application Data

(62) Division of application No. 12/108,465, filed on Apr. 23, 2008, now Pat. No. 8,050,081.

(30) Foreign Application Priority Data

Apr. 25, 2007 (KR) .................. 10-2007-0040519
Apr. 14, 2008 (KR) .................. 10-2008-0034118

(51) Int. Cl.
 *G11C 13/02* (2006.01)
 *H01L 27/28* (2006.01)
(52) U.S. Cl. ........ 365/151; 365/148; 365/153; 365/163; 977/943; 438/780
(58) Field of Classification Search .................. 365/130, 365/151, 153, 159, 163, 148; 977/943, 932; 257/40, 9, 2; 438/780
See application file for complete search history.

(56) References Cited

U.S. PATENT DOCUMENTS 7,170,779 B2   1/2007   Miyawaki et al.
(Continued)

FOREIGN PATENT DOCUMENTS

| KR | 1020050107238 A | 11/2005 |
| KR | 1020060089536 A | 8/2006 |
| KR | 1020060100581 A | 9/2006 |

(Continued)

OTHER PUBLICATIONS

Bozano et al., "Mechanism for bistability in organic memory elements," *Applied Physics Letters* 84:607-609 (2004).

*Primary Examiner* — Andrew Q Tran
(74) *Attorney, Agent, or Firm* — Kilpatrick Townsend & Stockton LLP

(57) ABSTRACT

A non-volatile memory device includes a plurality of unit cells. Each unit cell includes lower and upper electrodes over a substrate, a conductive organic material layer between the lower and the upper electrodes, and a nanocrystal layer located within the conductive organic material layer, wherein the nanocrystal layer includes a plurality of nanocrystals surrounded by an amorphous barrier. The unit cell receives a plurality of voltage ranges to perform a plurality of operations. A read operation is performed when an input voltage is in a first voltage range. A first write operation is performed when the input voltage is in a second voltage range higher than the first voltage range. A second write operation is performed when the input voltage is in a third voltage range higher than the second voltage range. An erase operation is performed when the input voltage is higher than the third voltage range.

14 Claims, 55 Drawing Sheets

U.S. PATENT DOCUMENTS

| | | |
|---|---|---|
| 7,463,509 B2 | 12/2008 | Kim et al. |
| 7,539,038 B2 | 5/2009 | Lee et al. |
| 8,050,081 B2 * | 11/2011 | Park et al. .................. 365/151 |
| 2004/0027849 A1 | 2/2004 | Yang et al. |
| 2009/0040805 A1 | 2/2009 | Park et al. |

FOREIGN PATENT DOCUMENTS

| | | |
|---|---|---|
| KR | 100652134 B | 11/2006 |
| KR | 100652135 B1 | 11/2006 |
| KR | 1020060134763 A | 12/2006 |
| KR | 100855559 B1 | 8/2008 |

* cited by examiner

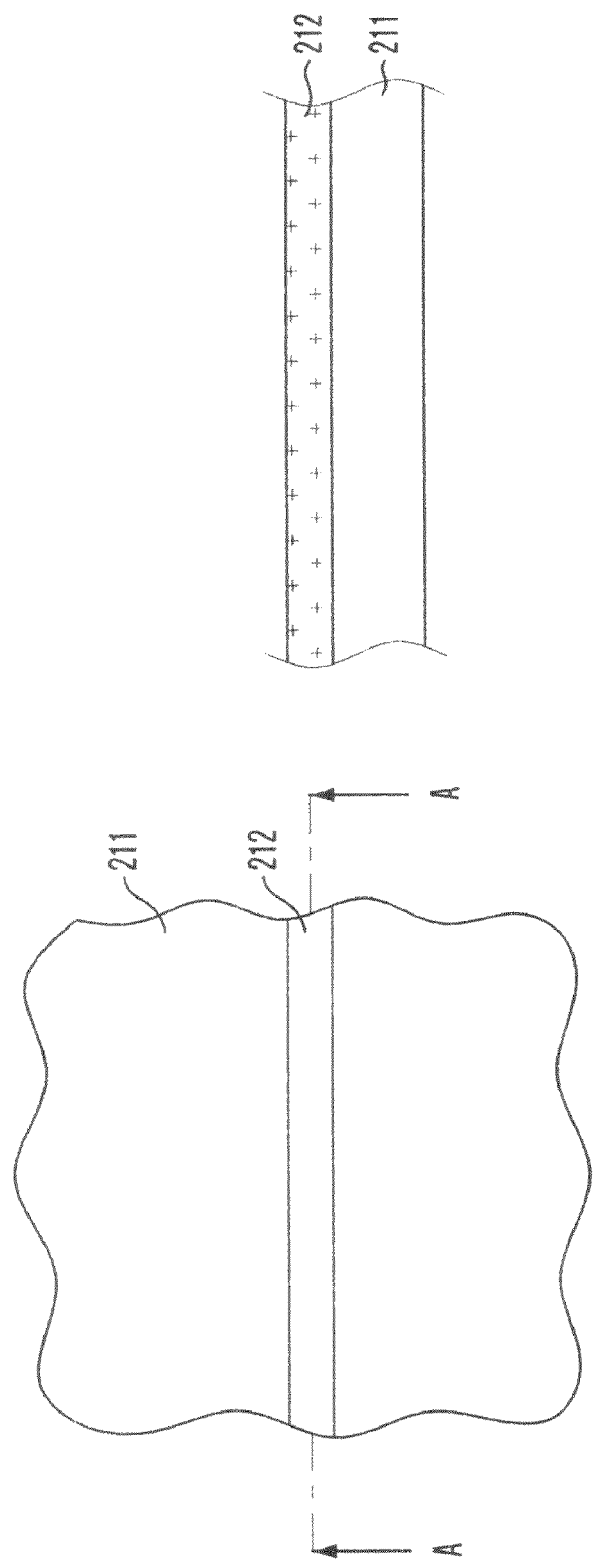

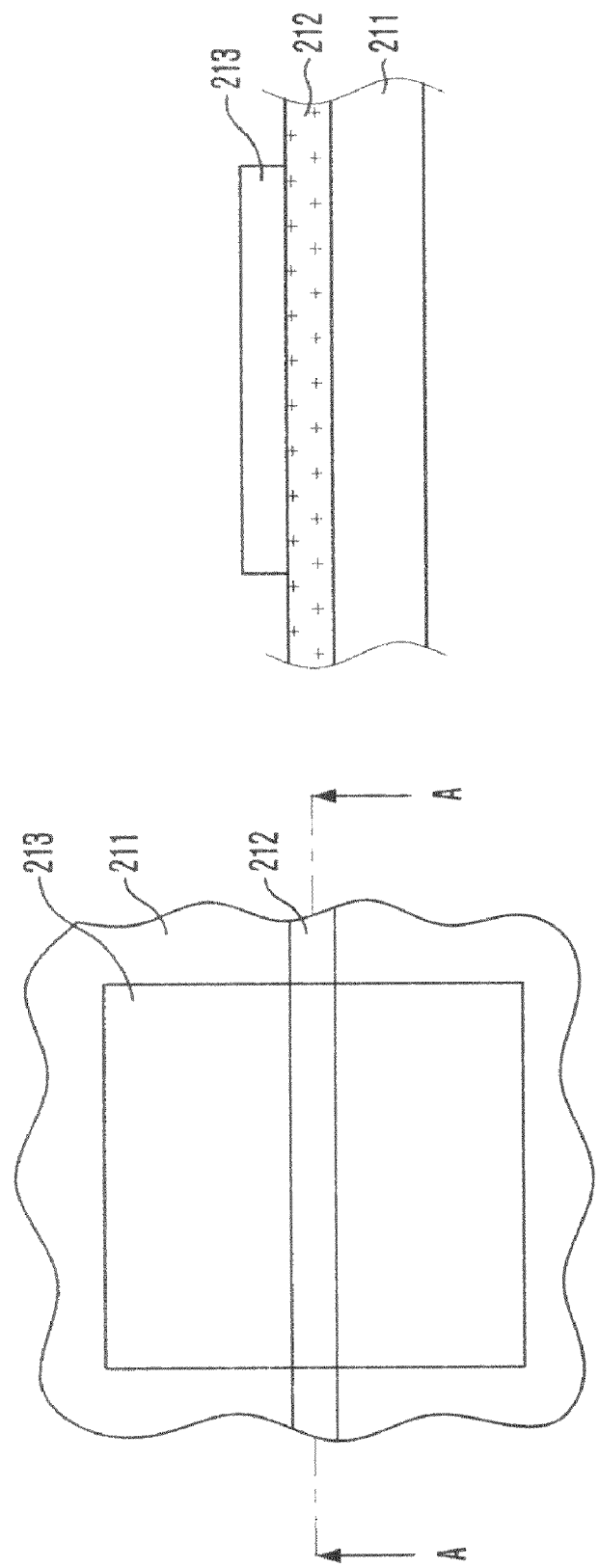

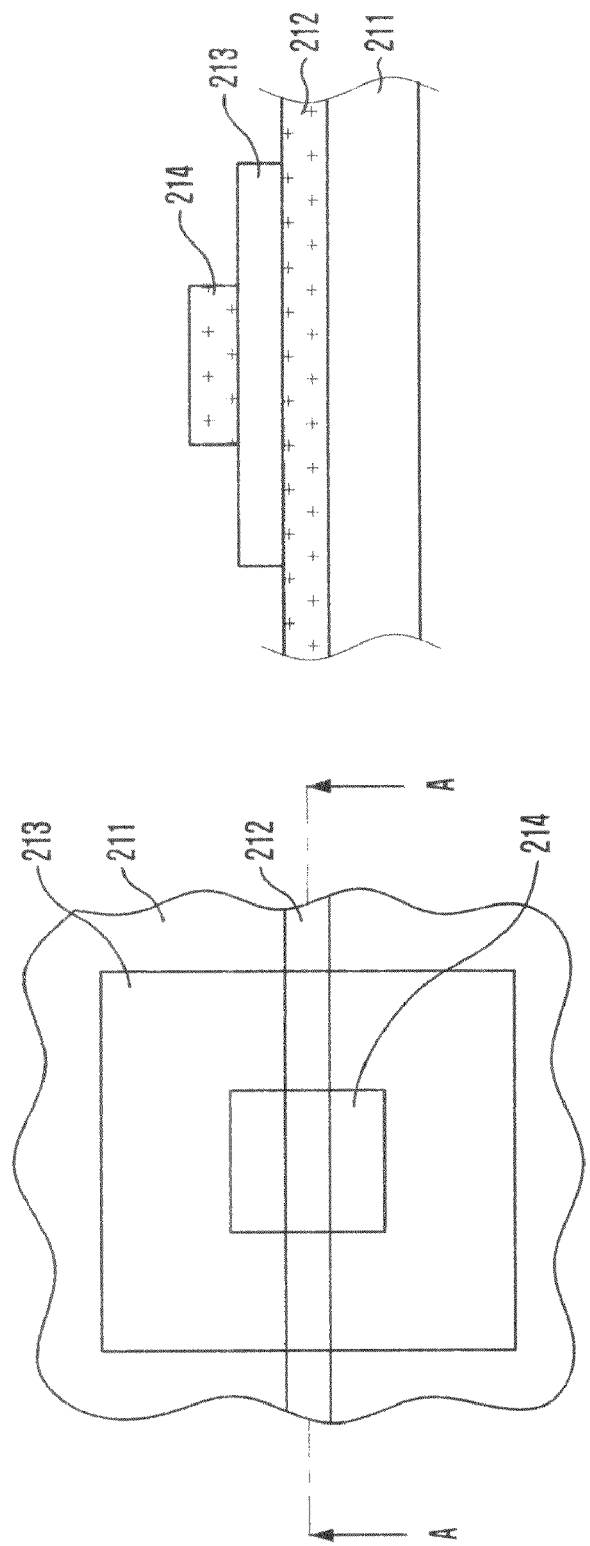

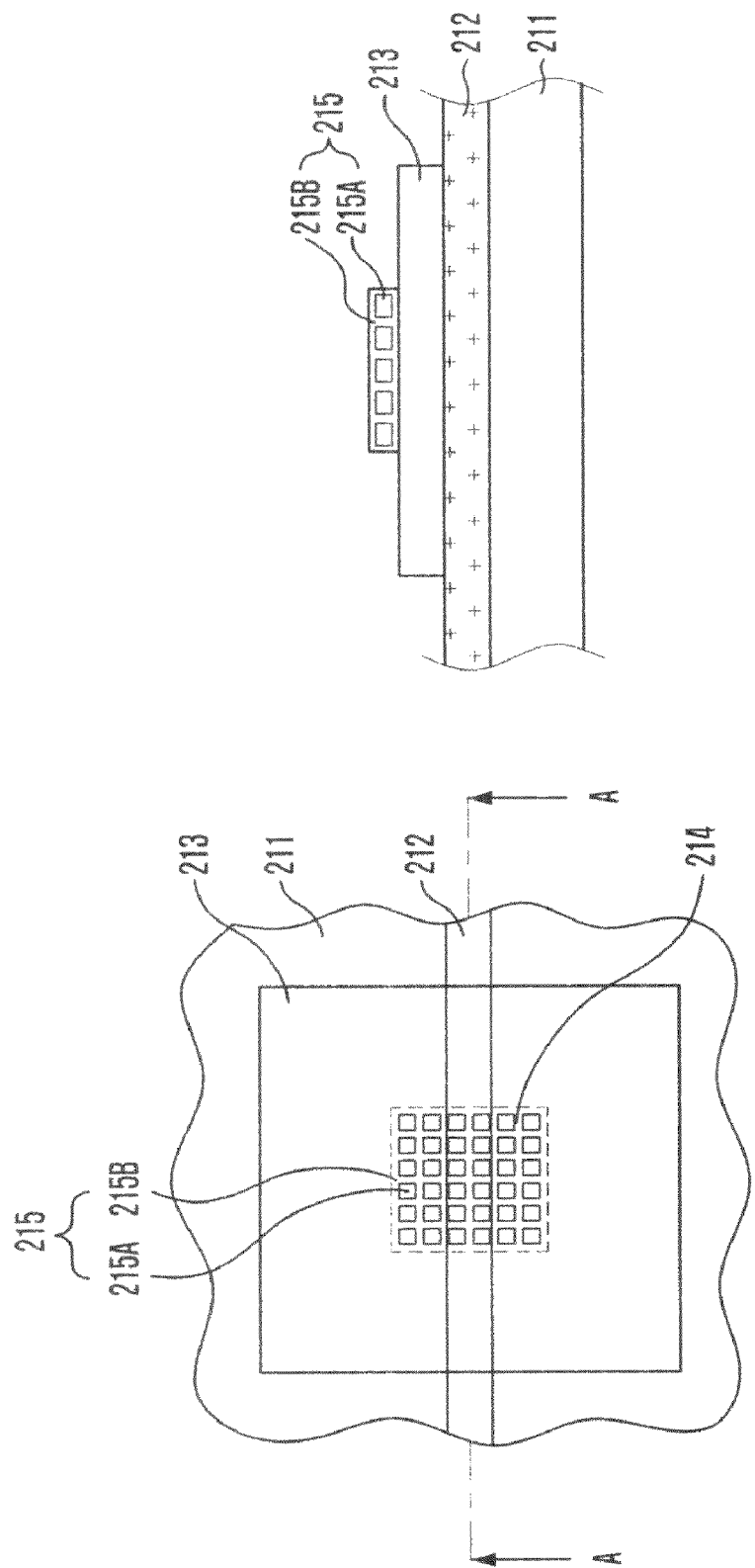

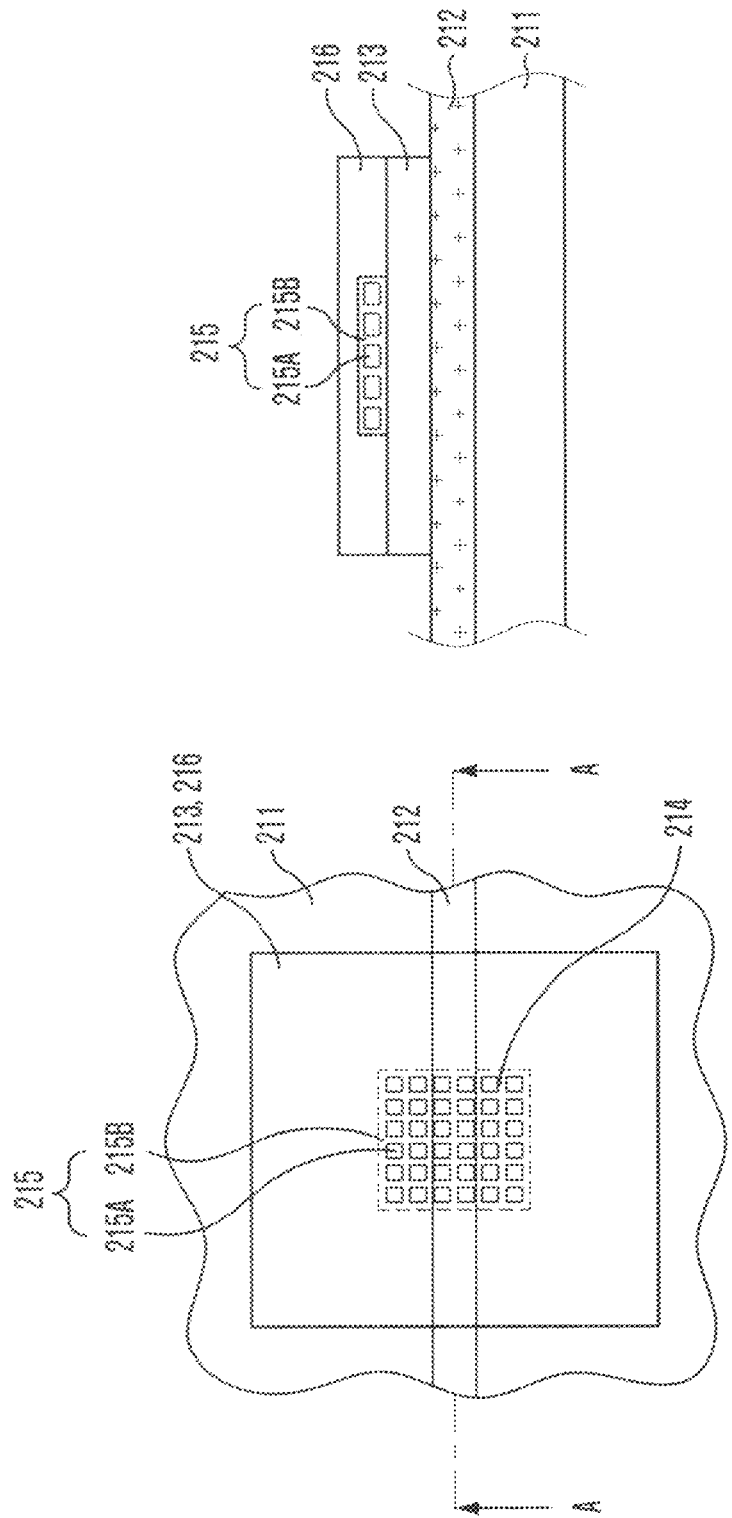

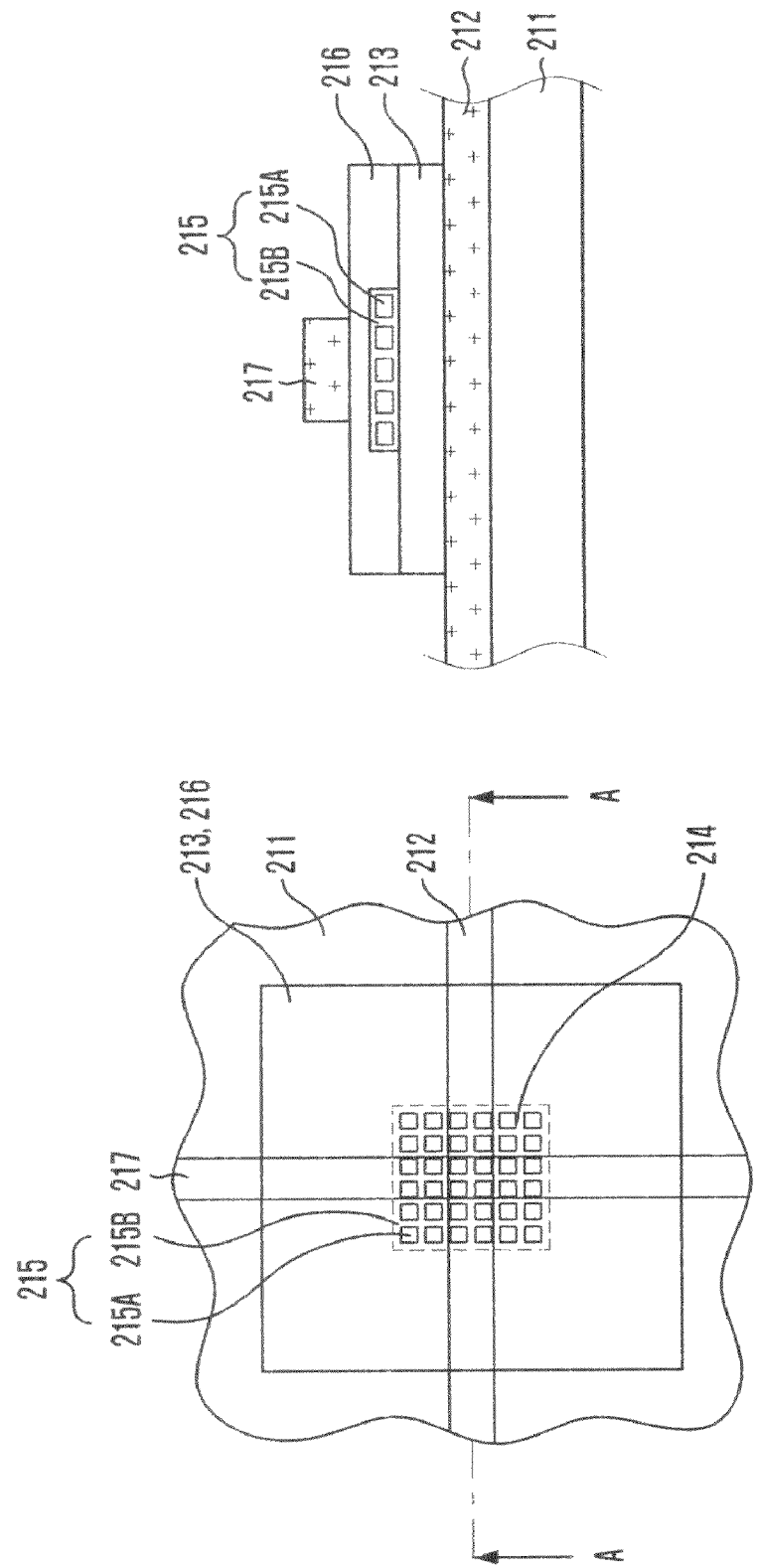

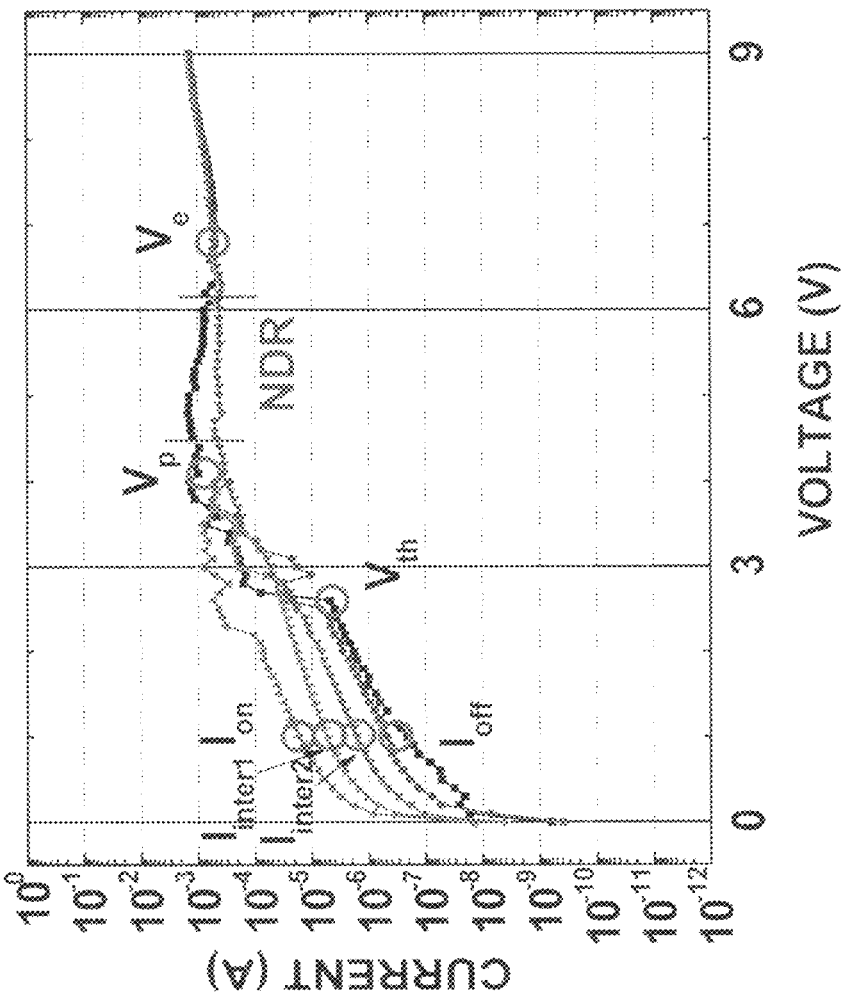

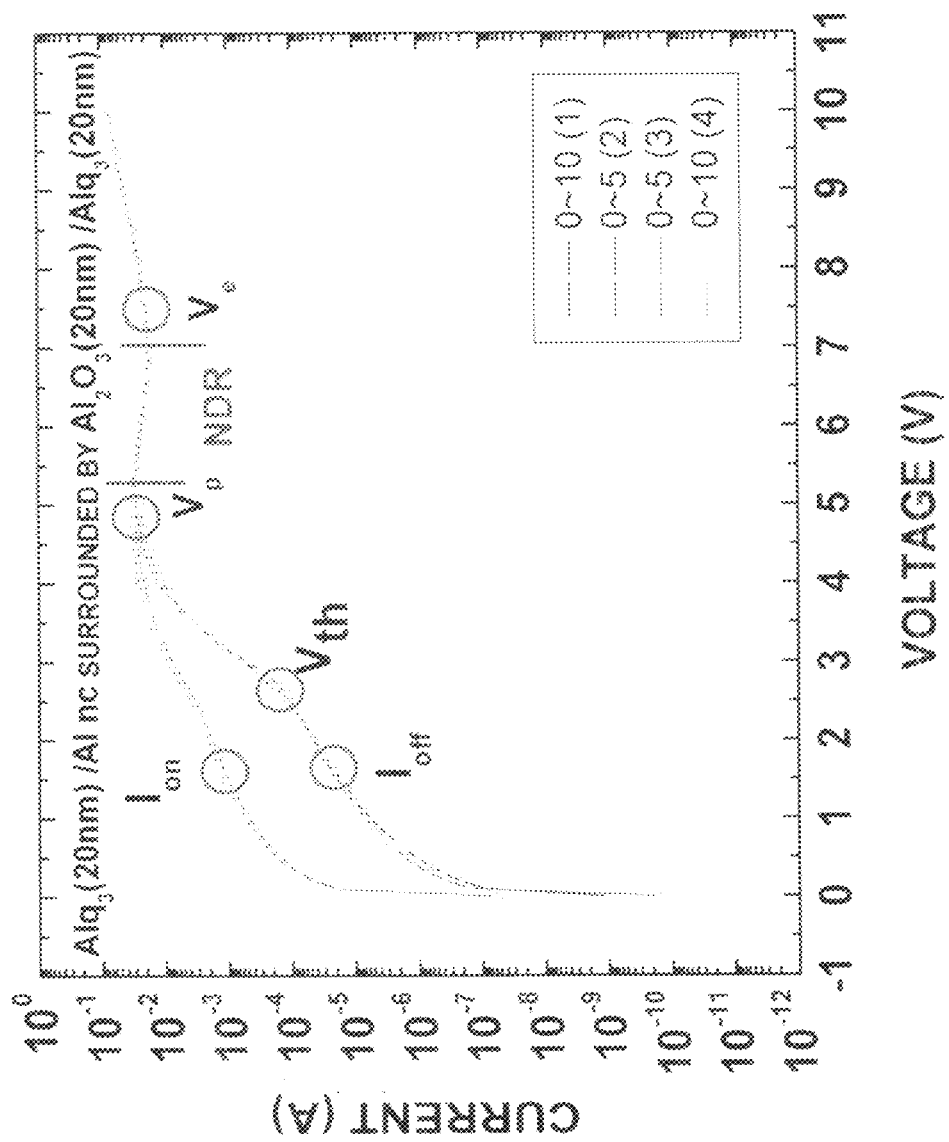

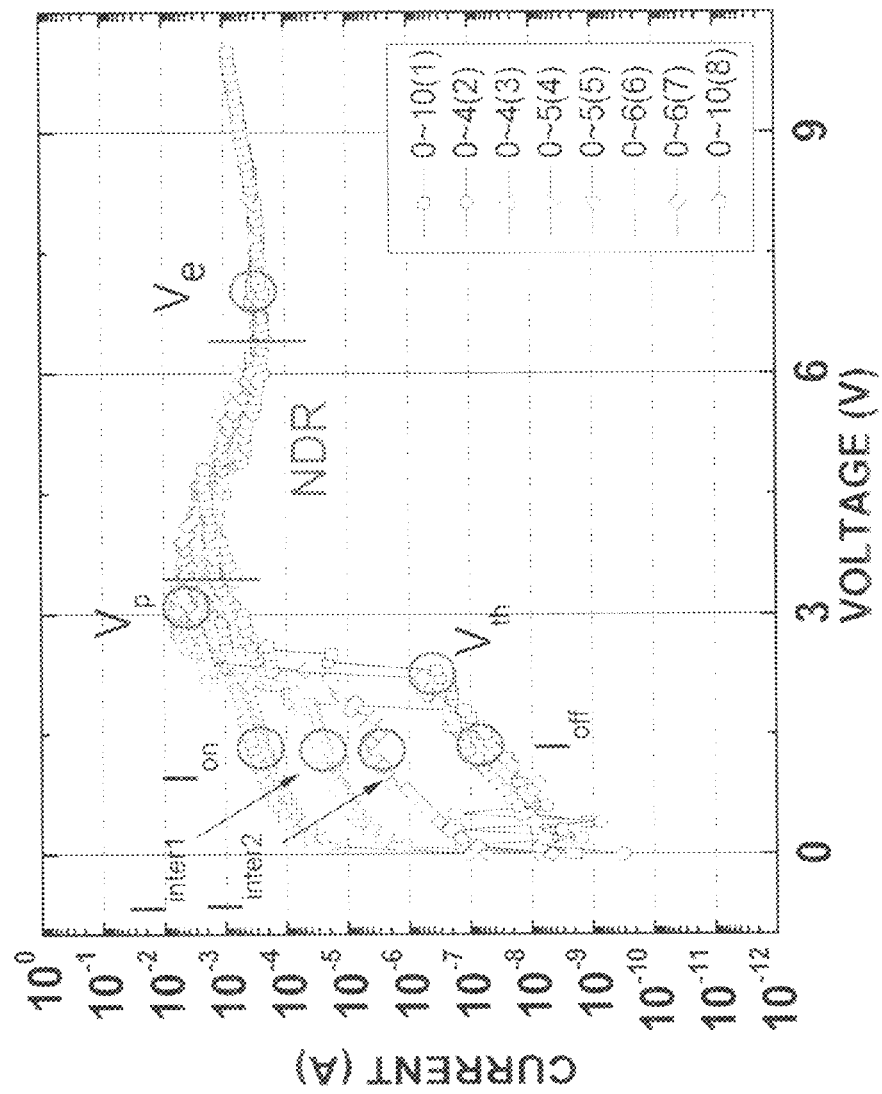

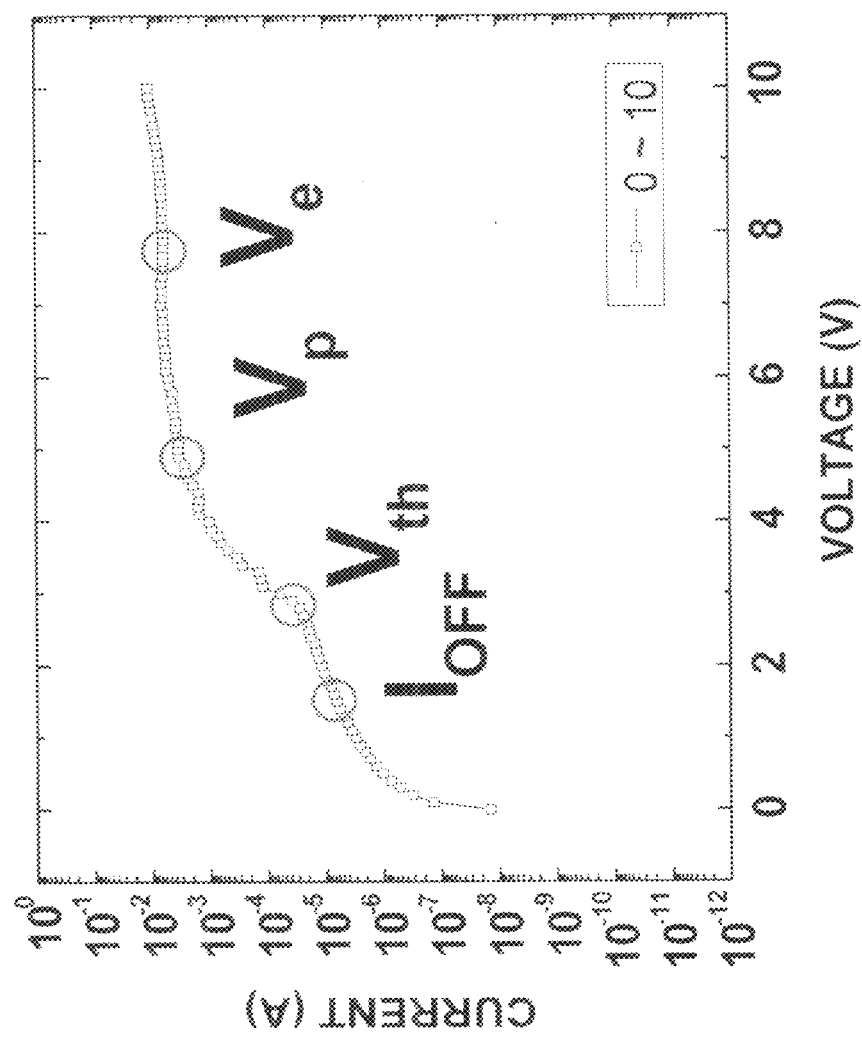

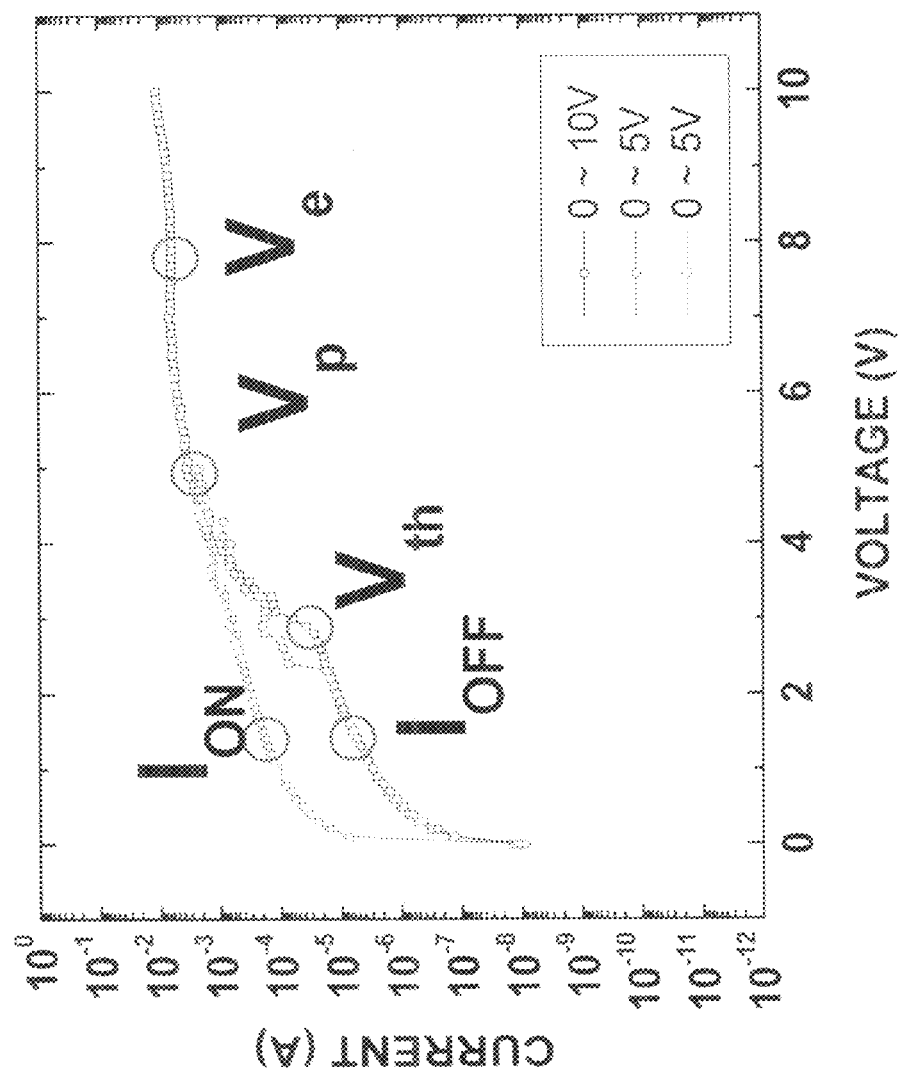

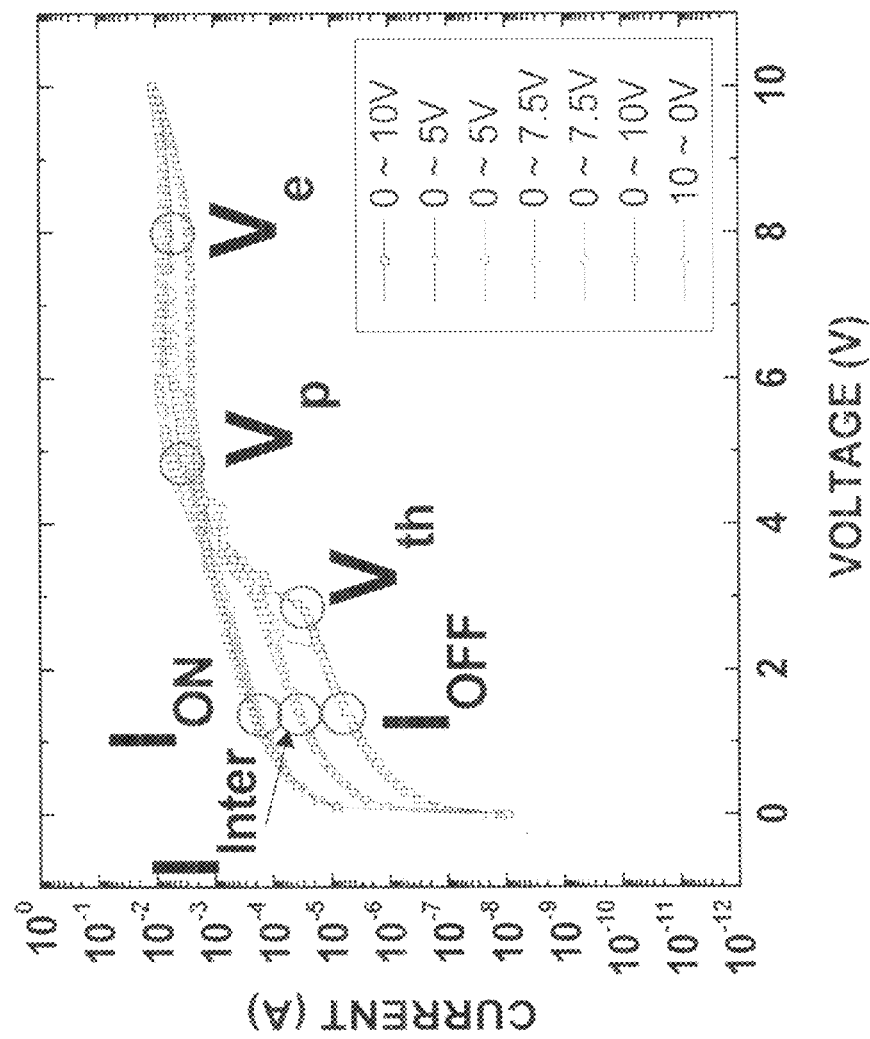

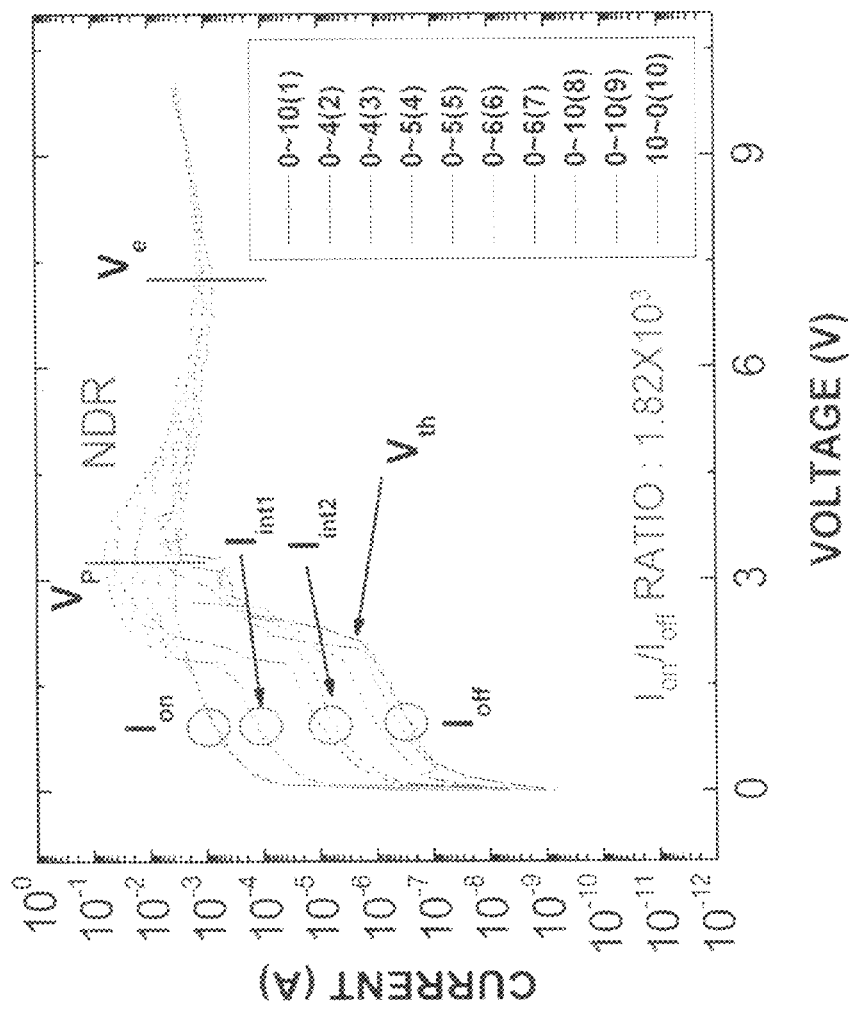

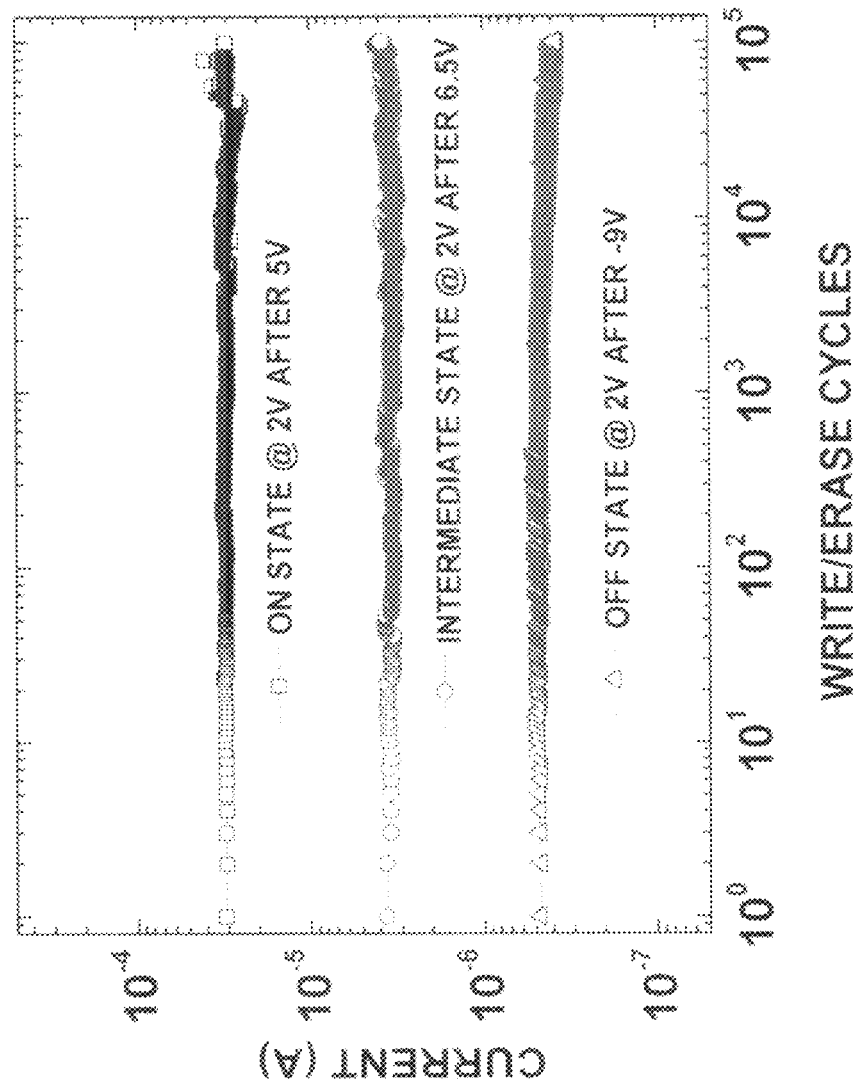

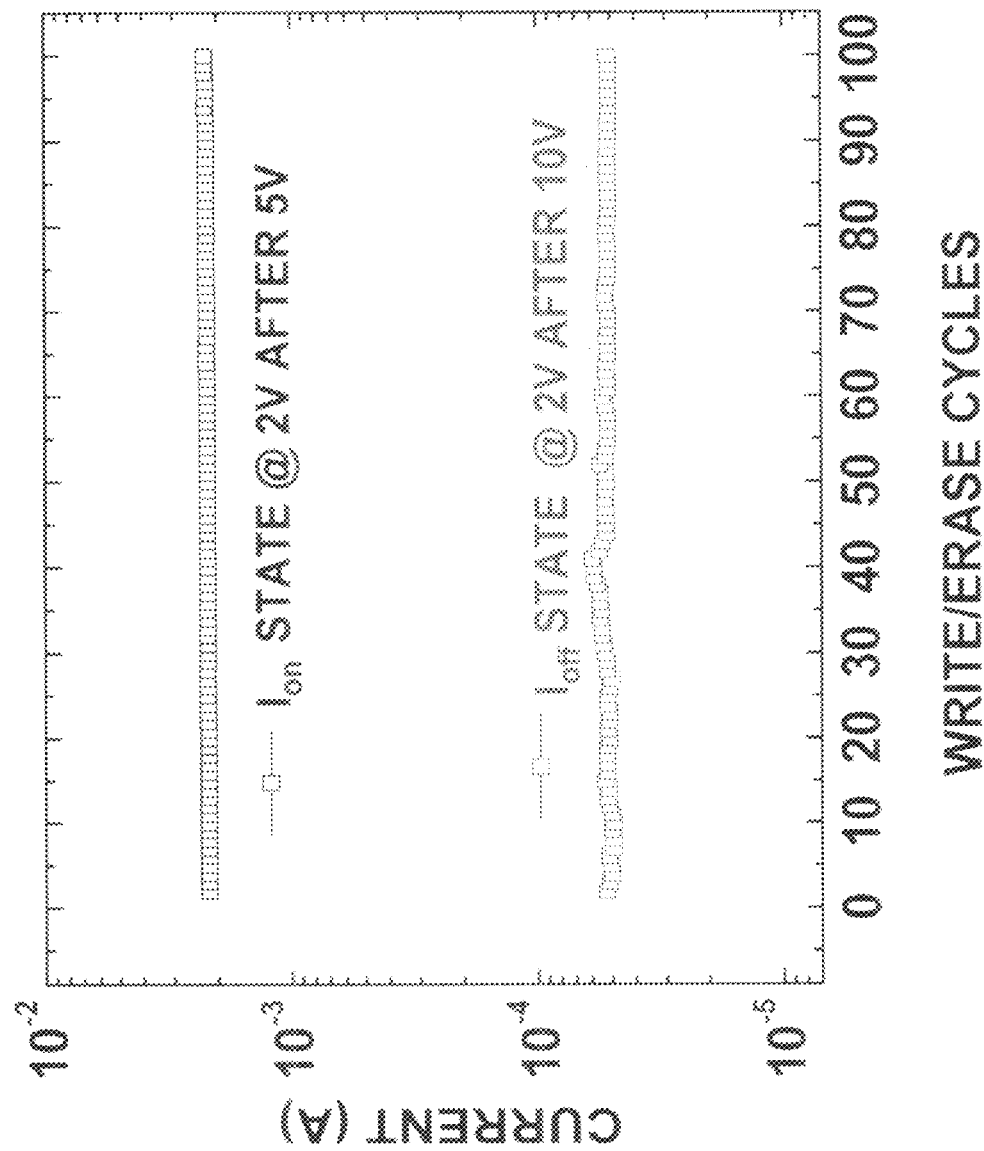

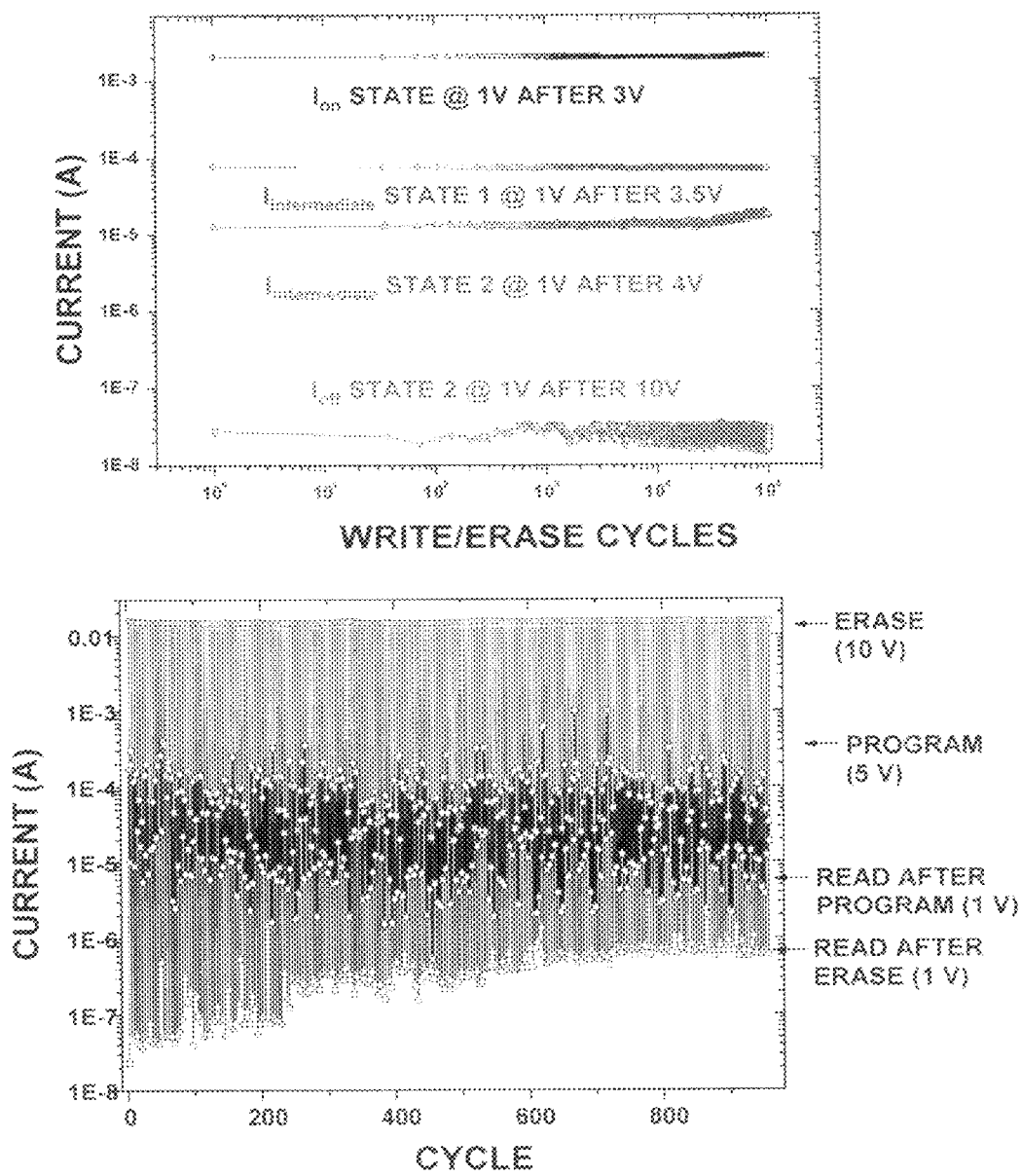

FIG. 11B
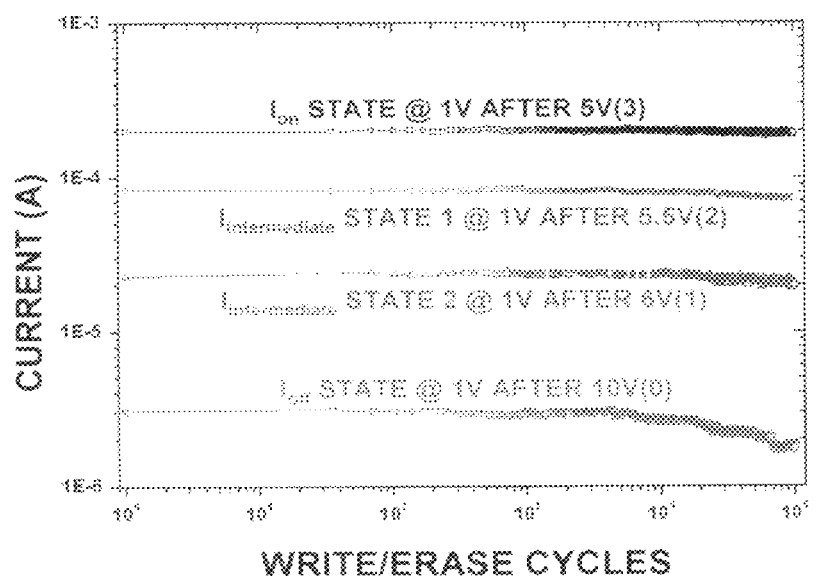
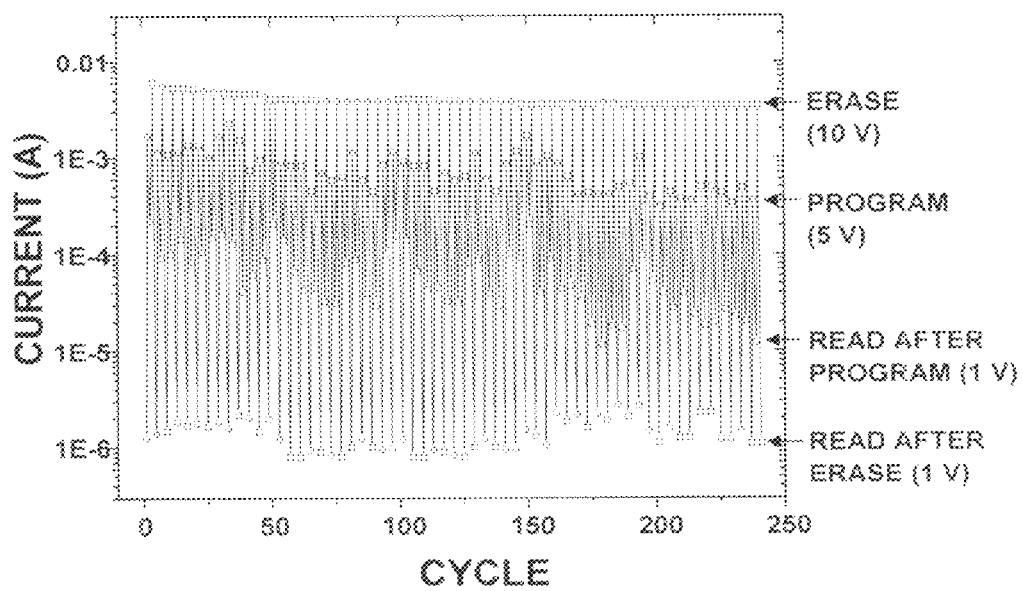

FIG. 12A
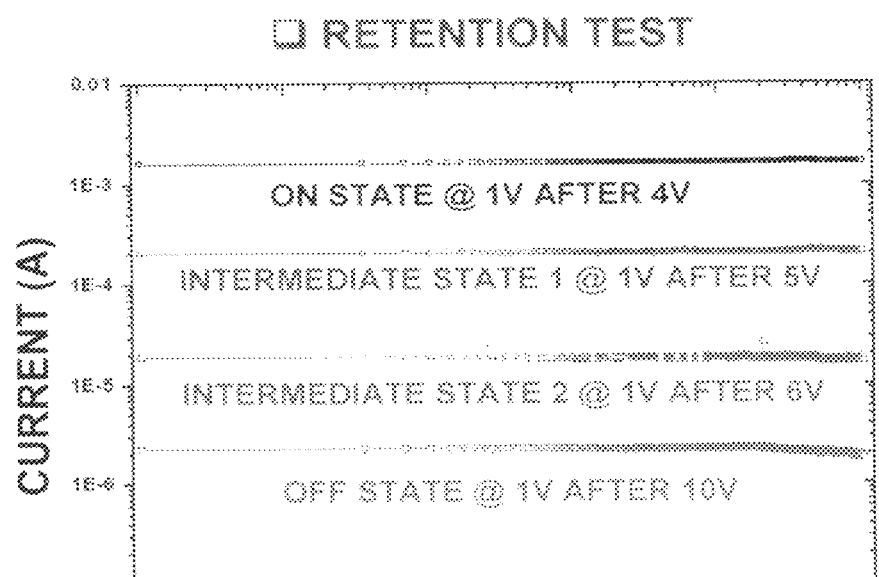
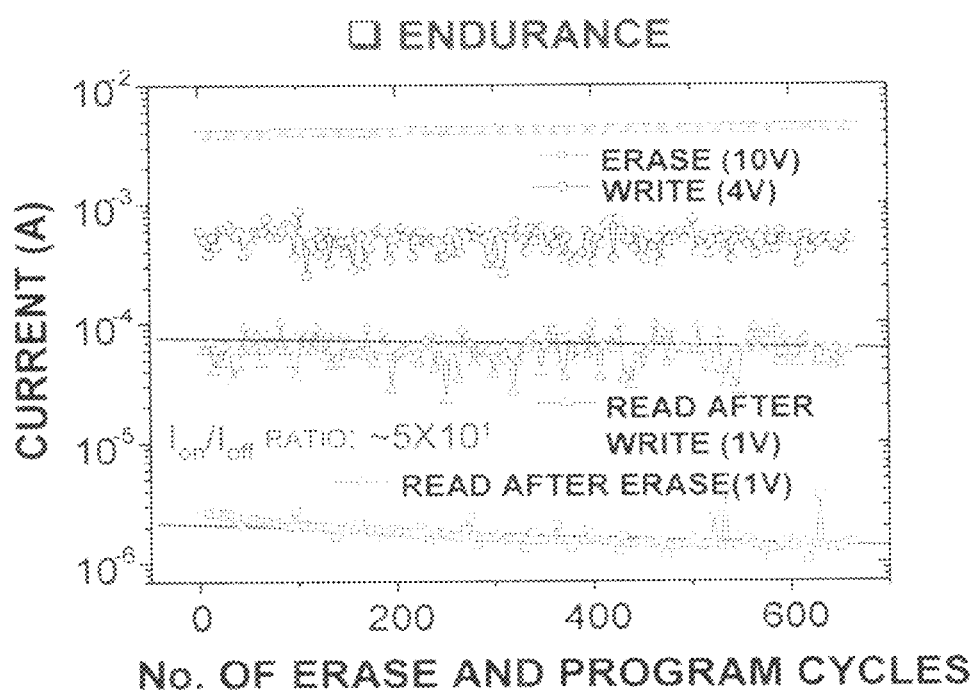

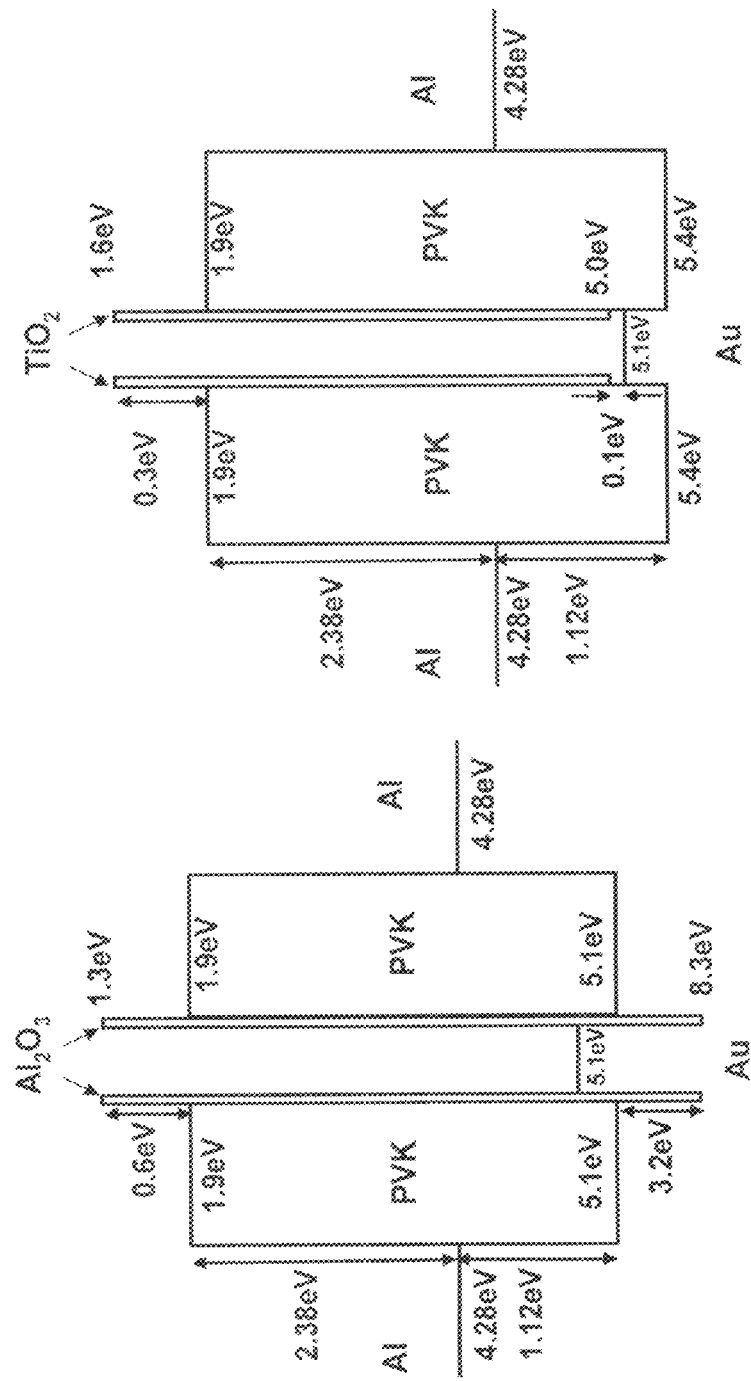

CONDUCTIVE ORGANIC NON-VOLATILE MEMORY DEVICE WITH NANOCRYSTALS EMBEDDED IN AN AMORPHOUS BARRIER LAYER

CROSS-REFERENCE TO RELATED APPLICATIONS

The present invention is a divisional of U.S. patent application Ser. No. 12/108,465, filed on Apr. 23, 2008, which claims priority of Korean patent application number 2007-0040519, filed on Apr. 25, 2007, both of which are incorporated by reference in their entirety.

BACKGROUND OF THE INVENTION

The present invention relates to a semiconductor device and, more particularly, to a non-volatile memory device having a structure where a conductive organic material layer is disposed between upper and lower electrodes and a method for fabricating the same.

A volatile dynamic random access memory (DRAM) device and a non-volatile flash memory device represent two types of memory devices. In the DRAM device, a length of a channel underneath a gate of a cell transistor is adjusted according to a voltage supplied to the gate and a cell capacitor is charged or discharged by electrons moving through the channel formed between source and drain terminals of the cell transistor, so that cell data is read by detecting the charged or discharged state of the cell capacitor. Since the DRAM device is a volatile memory device, when power is not supplied to the device, the cell data stored in the device may be lost due to a leakage current. Thus, the cell capacitor should be continuously charged to maintain the cell data, which increases power consumption.

On the other hand, in a non-volatile flash memory device such as a NAND type flash memory device, Fowler-Nordheim (FN) tunneling is generated due to a voltage supplied to a control gate and a channel region. Then, by FN tunneling, a floating gate is charged with electrons or the electrons are discharged from the floating gate. A threshold voltage of the channel region changes according to the charged or discharged state of the floating gate and the flash memory device distinguishes 0 or 1 data by detecting a change of the threshold voltage. Since the flash memory device uses FN tunneling, the voltage used in the device becomes very high. Furthermore, since a data read/write operation is performed by charging/discharging the electrons in/from the floating gate formed with polysilicon through FN tunneling, a data processing speed becomes slow, i.e., µ-second level.

To fabricate the typical memory device, since at least several tens of processes need to be performed and a memory cell size is relatively great (e.g., 8 $F^2$), it is difficult to highly integrate the device, reduce product cost, and maintain a high yield.

Accordingly, research institutes and enterprises conduct various studies to develop next generation memory devices that overcome limitations of the DRAM and the flash memory devices while keeping their advantages.

Research for the next generation memory devices are being conducted in various fields according to materials used in a unit cell of the devices. For instance, one of the devices applies current into a phase transfer material and detects 0 or 1 data by using resistance difference obtained according to whether the material is cooled to a solid state having less resistance or an amorphous state having greater resistance. Another one of the devices uses the bistable conductive characteristics having high resistance and low resistance in the same voltage when applying a voltage to a conductive organic material. Still another one of the devices uses ferroelectrics. Further still another one of the devices uses a ferromagnetic material having N and S poles to store data. Furthermore, there is study being conducted for a non-volatile memory device employing a planar floating gate using nanocrystals of metal, silicon or compound semiconductor instead of silicon of a flat structure.

However, study groups researching the next generation memory devices have a common problem of finding the optimized process conditions for applying the above materials to the highly integrated memory devices.

Particularly, a non-volatile memory device using a conductive organic material, e.g., a polymer (Po) RAM device, has not been applied to an actual fabrication process and it is not easy to find the precise fabrication conditions. That is, since it is difficult to repetitively form nanocrystals with regular size and distribution in the conductive organic material, a threshold voltage and a bistable conductive characteristic, i.e. $I_{on}/I_{off}$, become irregular.

SUMMARY OF THE INVENTION

Embodiments of the present invention relate to a non-volatile memory device, a method of operating the memory device, and a method for fabricating the memory device.

In accordance with the embodiments of the present invention, there are provided various memory devices including nanocrystals capable of stabilizing a threshold voltage and an $I_{on}/I_{off}$ rate and methods for forming the nanocrystals, so that data may be not damaged even though power is not supplied and the device is highly integrated while having a memory cell size of $4F^2$. Furthermore, the present invention provides devices and methods capable of keeping a high processing speed of a PoRAM device and securing a stable size and distribution of the nanocrystals. In addition, in accordance with the present invention, a unit cell can have a multi-level data using an intermediate resistance state of a bistable conductive characteristic and the non-volatile memory device with a stack structure of unit cells and the method for fabricating the same are provided.

In accordance with an aspect of the present invention, there is provided a non-volatile memory device including lower and upper electrodes over a substrate, a conductive organic material layer between the lower and the upper electrodes, and a nanocrystal layer located within the conductive organic material layer, wherein the nanocrystal layer includes a plurality of nanocrystals surrounded by an amorphous barrier, wherein the device has a multi-level output current according to a voltage level of an input voltage coupled to the lower and the upper electrodes during a data read operation.

In accordance with another aspect of the present invention relates to a method for operating a non-volatile memory device having a plurality of unit cells. Each unit cell has first and second electrodes, a conductive organic material layer provided between the first and second electrodes, and a nanocrystal layer provided within the conductive organic material layer. The nanocrystal layer includes a plurality of nanocrystals. Each nanocrystal is surrounded by an amorphous barrier. The method includes applying no more than a first voltage difference between the first and second electrodes of the device to place the unit cell in a first resistance state; applying no more than a second voltage difference between the first and second electrodes to place the unit cell in a second resistance state that is of a lower resistance state than the first resistance state, the second voltage difference being greater than the first voltage difference; and applying no more than a third voltage difference between the first and second electrodes to place the unit cell in a third resistance state that is of a lower resistance state than the first resistance state and a higher resistance state than the second resistance state, the third voltage difference being greater than the second voltage difference.

In accordance with still another aspect of the present invention, there is provided a non-volatile memory device including lower and upper electrodes over a substrate, a conductive organic material layer between the lower and the upper electrodes, and a nanocrystal layer located within the conductive organic material layer, wherein the nanocrystal layer includes a plurality of nanocrystals surrounded by an amorphous barrier, wherein a read operation is performed when an input voltage coupled to the lower and the upper electrodes is in a first voltage range, a first write operation is performed for writing a first input data when the input voltage is in a second voltage range higher than the first voltage range, a second write operation is performed for writing a second input data when the input voltage is in a third voltage range higher than the second voltage range, and an erase operation is performed for erasing the first or the second input data when the input voltage is in a fourth voltage range higher than the third voltage range.

In accordance with further still another aspect of the present invention, there is provided a non-volatile memory device including a first cell and a second cell, wherein the first and the second cells are vertically stacked, wherein the first cell includes first and second electrodes over a substrate, a first conductive organic material layer between the first and the second electrodes, and a first nanocrystal layer located within the first conductive organic material layer, and the second cell includes the second and third electrodes over the substrate, a second conductive organic material layer between the second and the third electrodes, and a second nanocrystal layer located within the second conductive organic material layer, wherein each of the first and the second nanocrystal layers has a plurality of nanocrystals surrounded by an amorphous barrier.

In accordance with further still another aspect of the present invention, there is provided a non-volatile memory device including lower and upper electrodes over a substrate and a polymer layer located between the lower and the upper electrodes, wherein the polymer layer includes a plurality of nanocrystals surrounded by an amorphous barrier, which are dispersed in the polymer layer.

In accordance with further still another aspect of the present invention, there is provided a non-volatile memory device including a first cell and a second cell, wherein the first and the second cells are vertically stacked, wherein the first cell includes first and second electrodes over a substrate and a first polymer layer between the first and the second electrodes, and the second cell includes the second and third electrodes over the substrate and a second polymer between the second and the third electrodes, wherein each of the first and the second polymer layers has a plurality of nanocrystals surrounded by an amorphous barrier material, which are dispersed in the polymer layer.

In accordance with further still another aspect of the present invention, there is provided a method for fabricating a non-volatile memory device, the method including providing a substrate, forming a lower electrode over the substrate, forming a first conductive organic material layer over the lower electrode, forming a nanocrystal layer over the first conductive organic material layer, wherein the nanocrystal layer includes a plurality of nanocrystals surrounded by an amorphous barrier, forming a second conductive organic material layer over the nancrystal layer, and forming an upper electrode over the second conductive organic material layer, wherein the device has a multi-level output current according to a voltage level of an input voltage coupled to the lower and the upper electrodes during a data read operation.

In accordance with further still another aspect of the present invention, there is provided a method for fabricating a non-volatile memory device, the method including providing a substrate, forming a lower electrode over the substrate, forming a first conductive organic material layer over the lower electrode, forming a first barrier material layer over the first conductive organic material layer, forming a certain metal layer over the first barrier material layer, forming a second barrier material layer over the certain metal layer, forming a second conductive organic material layer over the second barrier material layer to thereby provide a first resultant structure, curing the first resultant structure to thereby provide a second resultant structure, and forming an upper electrode over the second conductive organic material layer of the second resultant structure, wherein, during the curing of the first resultant structure, a nanocrystal layer having a plurality of nanocrystals surrounded by an amorphous barrier is formed between the first and the second conductive organic material layers, the nanocrystals formed with the certain metal and the amorphous barrier formed with the first and the second barrier materials.

In accordance with further still another aspect of the present invention, there is provided a method for fabricating a non-volatile memory device, the method including providing a substrate, forming a lower electrode over the substrate to thereby provide a resultant structure, forming a polymer layer where a plurality of nanocrystals are dispersed, wherein each of the nanocrystals is surrounded by a corresponding amorphous barrier, and forming an upper electrode over the polymer layer.

In accordance with further still another aspect of the present invention, there is provided a method for fabricating nanocrystals, including providing a substrate, forming a first barrier material layer over the substrate, forming a metal layer over the first barrier material layer, forming a second barrier material layer over the metal layer to provide a resultant structure, and curing the resultant structure to form the nanocrystals covered with the first and the second barrier materials.

BRIEF DESCRIPTION OF THE DRAWINGS

FIGS. 2A to 2F illustrate plan views and cross-sectional views of a method for fabricating a non-volatile memory device in accordance with an embodiment of the present invention.

FIG. 6B is a graph showing a voltage-current characteristic of a non-volatile memory device using an AIDCN as a conductive organic material layer and including an Al nanocrystal layer in accordance with an embodiment of the present invention.

FIG. 6C is a graph showing a voltage-current characteristic of a non-volatile memory device using an $Alq_3$ as a conductive organic material layer and including an Al nanocrystal layer in accordance with an embodiment of the present invention.

FIG. 6D is a graph showing a voltage-current characteristic of a non-volatile memory device using an $Alq_3$ as a conductive organic material layer and including a Ni nanocrystal layer in accordance with an embodiment of the present invention.

FIGS. 7A to 7H depict views of explaining a mechanism realizing the voltage-current characteristic shown in FIG. 6A.

FIGS. 9A and 9B are graphs showing a voltage-current characteristic of a non-volatile memory device with a stack structure of two cells using an $Alq_3$ as a conductive organic material layer and including a Ni nanocrystal layer.

FIG. 10A is a graph showing a retention test result of the non-volatile memory device using the α-NPD as the conductive organic material layer and including the Al nanocrystal layer.

FIG. 10C is a graph showing a retention test result of the non-volatile memory device using the $Alq_3$ as the conductive organic material layer and including the Al nanocrystal layer.

FIG. 10D provides graphs showing retention and endurance test results of the non-volatile memory device using the $Alq_3$ as the conductive organic material layer and including the Ni nanocrystal layer.

FIGS. 11A and 11B are graphs showing a retention and/or endurance test result of the non-volatile memory device with the stack structure of two cells using the $Alq_3$ as the conductive organic material layer and including the Al nanocrystal layer.

FIGS. 12A and 12B are graphs showing a retention and/or endurance test result of the non-volatile memory device with the stack structure of two cells using the $Alq_3$ as the conductive organic material layer and including the Ni nanocrystal layer.

FIG. 17A represents an energy band diagram of a non-volatile memory device using a PVK as a conductive organic material layer and including Au crystals surrounded by an $Al_2O_3$ barrier material.

FIG. 17B depicts an energy band diagram of a non-volatile memory device using a PVK as a conductive organic material layer and including Au crystals surrounded by a $TiO_2$ barrier material.

DESCRIPTION OF SPECIFIC EMBODIMENTS

Specified embodiments of the present invention relate to a non-volatile memory device, a method of operating the device, and a method for fabricating the device.

Hereinafter, non-volatile memory devices, e.g., PoRAM devices, are separately described according to type of conductive organic material used. That is, the non-volatile memory devices will be separately described in two cases, i.e., the conductive organic material being a low molecular compound (or low molecular material), e.g., AIDCN, $Alq_3$, and α-NPD, and the conductive organic material being a high molecular compound (or high molecular material), e.g., PVK. This is because it is desirable to apply different methods to fabricating the non-volatile memory devices according to the type of conductive organic material and the non-volatile memory devices have different structures according to the applied fabrication methods.

A method for fabricating the non-volatile memory device using the low molecular compound as the conductive organic material is described with reference to FIGS. 1A to 14B.

Figure 1A:
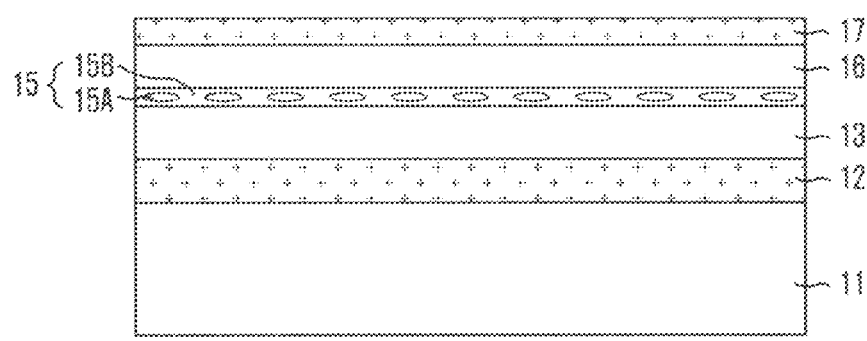
FIG. 1A illustrates a cross-sectional view of a non-volatile memory device in accordance with an embodiment of the present invention.
Figure 1B:
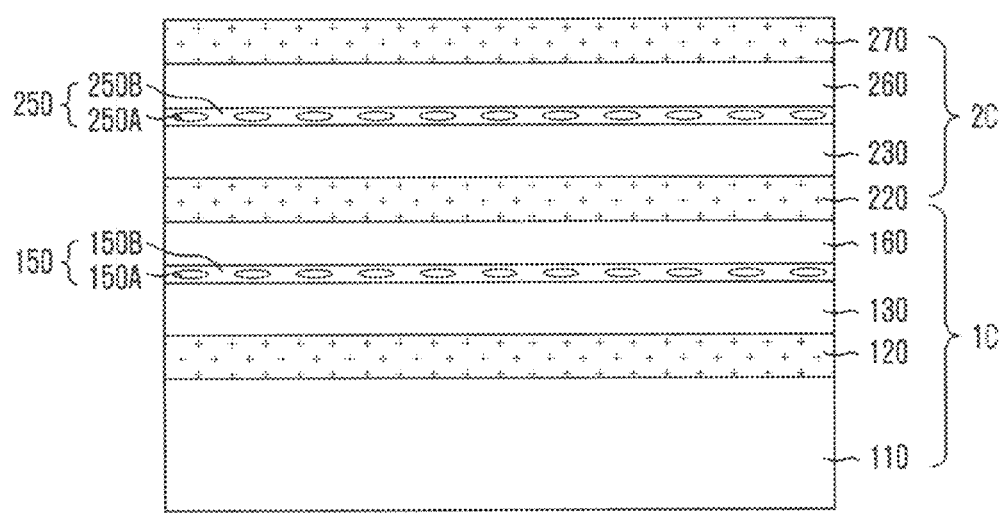
FIG. 1B illustrates a cross-sectional view of a non-volatile memory device in accordance with another embodiment of the present invention.

FIG. 1A illustrates a cross-sectional view of a nonvolatile memory device in accordance with an embodiment of the present invention. FIG. 1B illustrates a cross-sectional view of a non-volatile memory device in accordance with another embodiment of the present invention.

Referring to FIG. 1A, the non-volatile memory device includes lower and upper electrodes 12 and 17 formed over a substrate 11, first and second conductive organic material layers 13 and 16 disposed in between the lower and the upper electrodes 12 and 17, and a nanocrystal layer 15 disposed in between the first and the second conductive organic material layers 13 and 16. The nanocrystal layer 15 includes a plurality of crystalline nanocrystals 15A, each nanocrystal being surrounded by an amorphous barrier 15B. The amorphous barrier 15B defines a continuous layer where the nanocrystals 15A are inserted therein and functions as a tunneling barrier for electrons charged/discharged into/from the nanocrystals 15A. Hereinafter, each of the material layers constituting the non-volatile memory device in FIG. 1A is described in detail.

The substrate 11 may be an insulation substrate, a semiconductor substrate, or a conductive substrate. That is, the substrate 11 may be one of a plastic substrate, a glass substrate, an aluminum oxide ($Al_2O_3$) substrate, a silicon carbide (SiC) substrate, a zinc oxide (ZnO) substrate, a silicon (Si) substrate, a gallium arsenide (GaAs) substrate, a gallium phosphide (GaP) substrate, a lithium aluminum oxide ($LiAl_2O_3$) substrate, a boron nitride (BN) substrate, an aluminum nitride (AlN) substrate, a silicon-on-insulator (SOI) substrate, and a gallium nitride (GaN) substrate. When the semiconductor substrate or the conductive substrate is used, the lower electrode 12 and the substrate 11 may be separated by an insulation layer.

The lower and the upper electrodes 12 and 17 may include various types of conductive materials according to one embodiment. The lower and the upper electrodes 12 and 17 may also include metal having low electrical resistance and a good interfacial characteristic for the conductive organic material. For example, the lower and the upper electrodes 12 and 17 may include one selected from a group consisting of aluminum (Al), titanium (Ti), zinc (Zn), iron (Fe), nickel (Ni), stannum (Sn), plumbum (Pb), copper (Cu), and a combination thereof.

The first and the second organic material layers 13 and 16 are made of low molecular compounds and may include one of 5-imidazoledicarbonitrile (AIDCN), α-N-diphenyl bendizine (α-NPD) and tris (8-hydroxyquinoline) aluminum ($Alq_3$). The AIDCN is expressed as the following formula.

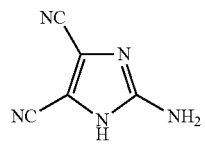

[Chemical formula 1]

The α-NPD is expressed as the following formula.

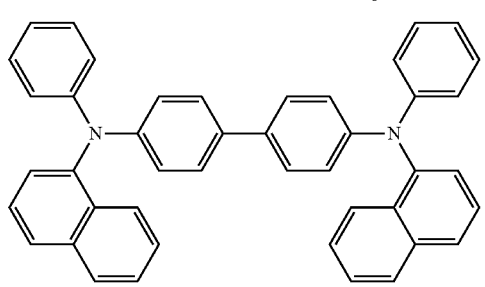

[Chemical formula 2]

The $Alq_3$ is expressed as the following formula.

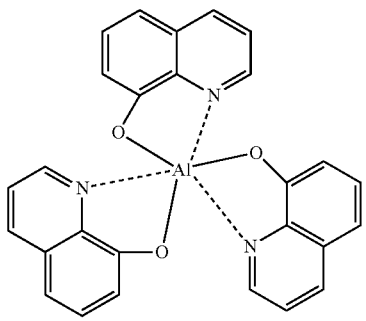

[Chemical formula 3]

As described above, the nanocrystal layer 15 includes the plurality of nanocrystals 15A and the amorphous barrier 15B surrounding the nanocrystals 15A. The nanocrystal layer 15 may be formed by depositing a first metal layer which can be oxidized and then performing a plasma oxidation process on the first metal layer. This is for forming nanocrystals 15A with a constant size and distribution to thereby secure a stable device performance and form the amorphous barrier 15B through a simple process. Accordingly, the nanocrystals 15A are made of the first metal and the amorphous barrier 15B includes the first metal oxide material. For instance, when the nanocrystals 15A include Al, the amorphous barrier 15B may include $Al_xO_y$, particularly $Al_2O_3$, where x and y are positive integers. When the nanocrystals 15A include Ni, the amorphous barrier 15B may include $Ni_xO_y$, particularly NiO. However, the nanocrystals 15A may also include other metals that can be oxidized. For instance, the nanocrystals 15A may include one of Al, Mg, Ti, Zn, Fe, Ni, Sn, Pb, Cu, and an alloy thereof. The amorphous barrier 15B may include an oxide material of the above-selected metal. The method for fabricating the nanocrystal layer 15 will be described in detail with reference to FIGS. 2A and 3D.

The nanocrystal layer 15 may be formed to have a thickness of approximately 1 nm to approximately 40 nm. In one embodiment, the nanocrystal layer 15 is approximately 10 nm to approximately 15 nm. In this embodiment, the nanocrystal layer 15 has a single layer. However, the nanocrystal layer 15 may include a stack structure having multiple layers. Such a stack structure may have from 2 to 8 layers and, more desirably, from 2 to 4 layers. When forming the nanocrystal layer 15 with the stack structure, it is possible to secure improved data retention and maintain an effective energy gap. In one embodiment, the layers of the stack structure of the nanocrystal layer 15 are of substantially the same thickness.

When a unit cell is formed to include the nanocrystal layer 15 with the nanocrystals 15A and the amorphous barrier 15B surrounding the nanocrystals 15A between the first and the second conductive organic material layers 13 and 16, the device can have various resistance states and thus output various levels of current according to voltage levels of voltages coupled to the lower and the upper electrodes 12 and 17, so that more than one bit data can be stored in the unit cell. The above device operation will be described with reference to FIGS. 6A and 7H.

Referring to FIG. 1B, there is shown the non-volatile memory device with a double cell structure with two unit cells of the unit cell being described in FIG. 1A. That is, the non-volatile memory device in this embodiment includes first and second cells 1C and 2C. The first cell 1C includes first and second electrodes 120 and 220 that correspond to lower and upper electrodes of the first cell 1C, respectively, and formed over a substrate 110, first and second conductive organic material layers 130 and 160 formed between the first and the second electrodes 120 and 220, and a first crystal layer 150. The second cell 2C includes second and third electrodes 220 and 270 that correspond to lower and upper electrodes of the second cell 2C, respectively, third and fourth conductive organic material layers 230 and 260 formed between the second and third electrodes 220 and 270, and a second nanocrystal layer 250 formed between the third and the fourth conductive organic material layers 230 and 260. Here, the second electrode 220 is shared by the first and the second cells. In another embodiment, the first and second cells may use separate electrodes. Each of the material layers in the non-volatile memory device with the double-cell structure is substantially the same as that in FIG. 1A. Thus, detailed description thereof is omitted.

As described, two cells are stacked and thus it is possible to highly integrate the device within a certain area. More than three cells can be stacked by repeatedly performing the same process as shown above. Furthermore, even though more than two cells are stacked, each of the cells can have various resistance states and output multi levels of current. Operational characteristics thereof will be described with reference to FIGS. 13A to 14B.

FIGS. 2A to 2F illustrate plan views and cross-sectional views of a method for fabricating a non-volatile memory device in accordance with an embodiment of the present invention. A left side view of each figure is a plan view illustrating the method for fabricating the non-volatile memory device and a right side view is a cross-sectional view illustrating the method taken by cutting the plan view along line A-A.

Referring to FIG. 2A, a first electrode 212 is formed over a substrate 211. In this embodiment, the first electrode 212 has a straight line shape formed in a certain direction, e.g., a horizontal direction over the substrate 211 using an evaporation process.

In detail, the substrate 211 is loaded in a chamber (not shown) for metal deposition. A region of the substrate 211 where the first electrode 212 is to be formed is exposed using a first shadow mask (not shown). Then metal is evaporated with a chamber pressure of approximately $10^{-6}$ Pa to approximately $10^{-3}$ Pa, a deposition rate of approximately 2 Å/s to approximately 7 Å/s and a temperature of approximately 1,000° C. to approximately 1,500° C., so that a metal layer is formed on the exposed region of the substrate 211. This metal layer becomes the first electrode 212. A cleaning process may be performed before and/or after depositing the metal layer for the first electrode 212.

The first electrode 212 is made of Al in the present embodiment. However, the first electrode 212 may also include one selected from a group consisting of Ti, Zn, Fe, Ni, Sn, Pb, Cu and an alloy thereof. The first electrode 212 is formed to have a thickness of approximately 50 nm to approximately 100 nm.

It is effective to use a silicon (Si) substrate or a glass substrate as the substrate 211. When the substrate 211 is the Si substrate, an insulation layer should be deposited thereon. The insulation layer may be an oxide- or a nitride-based material layer.

Referring to FIG. 2B, a first conductive organic material layer 213 is formed over the substrate 211 where the straight line shaped first electrode 212 is formed. In this embodiment, the first conductive organic material layer 213 is formed by the evaporation process to overlap with a portion of the first electrode 212. More specifically, the substrate 211 where the first electrode 212 is formed is loaded in a chamber (not shown) for depositing the conductive organic material to form the first conductive organic material layer 213. A region where the first conductive organic material layer 213 is to be formed is exposed using a second shadow mask (not shown). The exposed region has a square shape including an exposed portion of the first electrode 212 in the middle, so that a portion of the first conductive organic material layer 213 surrounds the exposed portion of the first electrode 212. The exposed region can be formed in a circle, an oval, a triangle or a polygon shape. Subsequently, the first conductive organic material layer 213 is formed in the exposed region over the substrate 211 and the first electrode 212 by evaporating the organic material. In the evaporation process, the organic material is evaporated with a chamber pressure of approximately $10^{-6}$ Pa to approximately $10^{-3}$ Pa, a deposition rate of approximately 0.2 Å/s to approximately 1.5 Å/s and a temperature of approximately 150° C. to approximately 400° C.

The first conductive organic material 213 may be made of one of the AIDCN, the α-NPD, and the Alq$_3$. The first conductive organic material layer 213 is formed to have a thickness of approximately 10 nm to approximately 100 nm.

Referring to FIGS. 2C and 2D, a metal layer 214 is deposited on the first conductive organic material layer 213 and then, a plasma oxidation process is performed on the metal layer 214, forming a nanocrystal layer 215 including a plurality of nanocrystals 215A, each nanocrystal being surrounded by an amorphous barrier 215B. The nanocrystals 215A include pure metal, and the amorphous barrier 215B includes an oxide material of the metal layer 214. The nanocrystal layer 215 is formed to have a thickness of approximately 1 nm to approximately 40 nm corresponding to the thickness of the metal layer 214. In other words, the nanocrystal layer 215 includes the amorphous barrier 215B that defines a continuous layer and the nanocrystals 215A provided therein.

In detail, the substrate 211 with the first conductive organic material layer 213 is loaded in a chamber (not shown) for depositing metal. A portion of the first conductive organic material layer 213 where the nanocrystal layer 215 is to be formed is exposed using a third shadow mask (not shown). At this time, the portion of the first conductive organic material layer 213 is exposed to make the nanocrystal layer 215 overlap with a portion of the first electrode 212 below the first conductive organic material layer 213. Thus, the nanocrystal layer 215 partially overlaps with the first electrode 212. The region exposed by the third shadow mask has substantially the same shape as that of the first conductive organic material layer 213, e.g., a square shape.

The metal layer 214 is formed to have a thickness of approximately 1 nm to approximately 40 nm on the exposed portion of the first conductive organic material layer 213 by performing the evaporation process with a chamber pressure of approximately $10^{-6}$ Pa to $10^{-3}$ Pa, a deposition rate of approximately 0.1 Å/s to approximately 7.0 Å/s, and a temperature of approximately 800° C. to approximately 1,500° C. When the metal layer 214 is made of Al, the deposition rate ranges from approximately 1.0 Å/s to approximately 5.0 Å/s. When the metal layer 214 is made of Ni, the deposition rate ranges approximately 0.1 Å/s to approximately 1.0 Å/s. Since the metal layer 214 has a high deposition rate, it is formed as a metal film with a grain boundary (refer to FIG. 3A), not nanocrystals.

The substrate 211 having the metal layer 214 is loaded in a plasma oxidation chamber. The plasma oxidation process is performed by injecting an O$_2$ gas with an RF power of approximately 50 W to approximately 300 W, an AC bias of approximately 100 V to approximately 200 V, and a pressure of approximately 0.5 Pa to approximately 3.0 Pa. The plasma oxidation process may be performed for approximately 50 seconds to approximately 500 seconds. The $O_2$ plasma is implanted along a boundary of the metal layer 214 with the grain boundary, so that the metal layer 214 is oxidized along its boundary. As a result, a plurality of nanocrystals 215A and an amorphous metal oxide material, i.e., the amorphous barrier 215B surrounding the nanocrystals 215A, are formed (refer to FIGS. 3B and 3D). At this time, a thickness of the nanocrystal layer 215 ranges from approximately 1 nm to approximately 40 nm that corresponds to the thickness of the metal layer 214. The metal layer 214 may be thicker than the above. However, when the metal layer 214 is thicker than approximately 50 nm, the $O_2$ plasma is insufficiently implanted into the grain boundary of the metal layer 214, so that the nanocrystal layer 215 may not be effectively formed. Other than the plasma oxidation process, the metal layer 214 can be oxidized in the chamber to form nanocrystals. However, to form the nanocrystals with regular size and distribution, the metal layer 214 may be forcibly oxidized by performing the $O_2$ plasma process along the grain boundary.

The deposition and the plasma oxidation processes may be performed a plurality of times on the metal layer 214 to form the nanocrystal layer 215 having a stack structure with a plurality of nanocrystal films. The nanocrystal films constituting the nanocrystal layer 215 may have the same thickness or different thicknesses according to thicknesses of deposited metal layers therefore. In one embodiment, each of the nanocrystal films has substantially the same thickness.

Referring to FIG. 2E, a second conductive organic material layer 216 is formed over the first conductive organic material layer 213 on which the nanocrystal layer 215 is formed. In this embodiment, the evaporation process is performed to form the second conductive organic material layer 216 overlapping with the first conductive organic material layer 213.

In detail, the substrate 211 having the nanocrystal layer 215 is loaded in a chamber (not shown) for depositing the conductive organic material to form the second conductive organic material layer 216. The first conductive organic material layer 213 on which the nanocrystal layer 215 is formed is exposed using the second shadow mask. The second conductive organic material layer 216 is formed over the exposed portions of the nanocrystal layer 215 and the first conductive organic material layer 213 by performing an evaporation process. The evaporation process is performed with a chamber pressure of approximately $10^{-6}$ Pa to approximately $10^{-3}$ Pa, a deposition rate of approximately 0.2 Å/s to approximately 1.5 Å/s and a temperature of approximately 150° C. to approximately 400° C.

In the present embodiment, the second conductive organic material layer 216 is made of the same material as that for the first conductive organic material layer 213 and it is formed to have a thickness of approximately 10 nm to approximately 100 nm. The second conductive organic material layer 216 may be of a different material in another embodiment. Since the nanocrystal layer 215 is formed over a portion of the first conductive organic material layer 213 and then, the second conductive organic material layer 216 is deposited thereon, the second conductive organic material layer 216 is formed to cover the nanocrystal layer 215. The second conductive organic material layer 216 may have the same thickness as that of the first conductive organic material layer 213, or be thinner or thicker.

Referring to FIG. 2F, a second electrode 217 is formed over the substrate 211 with the second conductive organic material layer 216. The second electrode 217 is formed in a straight line shape while crossing the first electrode 212 through the evaporation process. In this case, a memory cell of $4F^2$ can be embodied. In detail, the substrate 211 where the second conductive organic material layer 216 is formed is loaded in the chamber for depositing metal and then, a region where the second electrode 217 is to be formed is exposed using a fourth shadow mask. That is, portions of the second conductive organic material layer 216 and the substrate 211 are exposed. Herein, the second electrode 217 may be formed partially overlapping with the nanocrystal layer 215 below the second conductive organic material layer 216. The exposure is adjusted to dispose the nanocrystal layer 215 in the region where the first electrode 212 and the second electrode 217 overlap with each other. Subsequently, a metal layer is formed over exposed portions of the second conductive organic material layer 216 and the substrate 211 by performing the evaporation process. The evaporation process is executed with a chamber pressure of approximately $10^{-6}$ Pa to $10^{-3}$ Pa, a deposition rate of approximately 2 Å/s to approximately 7 Å/s and a temperature of approximately 1,000° C. to approximately 1,500° C. The metal layer becomes the second electrode 217.

The second electrode 217 is made of Al. However, the second electrode 217 may be made of one selected from a group consisting of Al, Ti, Zn, Fe, Ni, Sn, Pb, Cu, and a combination thereof. The second electrode 217 may be formed to have a thickness of approximately 60 nm to approximately 100 nm.

Although it is not shown, a separate metal line forming process can be performed to respectively connect the first and the second electrodes 212 and 217 to external electrodes. The first and the second electrodes 212 and 217, the first and the second conductive organic material layers 213 and 216, and the nanocrystal layer 215 may be formed in-situ in a vacuum atmosphere. That is, the chambers for forming the first and the second electrodes 212 and 217, the first and the second conductive organic material layers 213 and 216, and the nanocrystal layer 215 can be disposed in a singular deposition system. For instance, the deposition processes are performed in a singular system where the chamber for depositing metal, the chamber for depositing the conductive organic material, the plasma generation chamber for the plasma oxidation, a cooling chamber, a load lock chamber, and a shadow mask chamber are connected to one transfer module. Thus, when the substrate in the chamber for depositing metal is transferred to the chamber for depositing the conductive organic material, the substrate is not exposed onto the atmosphere and can move in the transfer module in the vacuum atmosphere. Of course, each of the chambers may be connected to different systems.

In accordance with the above embodiment, the metal layer, the conductive organic material layer, and the nanocrystal layer are formed by performing the evaporation processes using the shadow mask without performing an etch process. However, other methods can be applied to form the non-volatile memory devices. The metal layer, the conductive organic material layer, and the nanocrystal layer can be formed by performing a thermal evaporation process, an E-beam deposition process, a sputtering process, a chemical vapor deposition (CVD) process, or an atomic layer deposition (ALD) process. Particularly, the metal layer and the conductive organic material layer are formed over a whole surface of the substrate and then, a patterning process is performed thereon. That is, after depositing the metal or the conductive organic material over the whole surface of the substrate, an etch process using a mask is performed to remove the deposited metal or conductive organic material on a region where the metal layer or the conductive organic material layer is not formed. For the oxidation, a wet or a dry oxidation process may be performed.

FIGS. 3A to 3D illustrate cross-sectional views of a method for fabricating the nanocrystal layer with, e.g., Al.

Figure 3A:
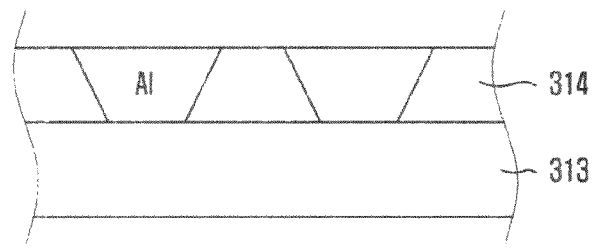
FIGS. 3A to 3D illustrate cross-sectional views of a method for fabricating a nanocrystal layer.

Referring to FIG. 3A, a metal layer 314 for the nanocrystal layer is formed over a first conductive organic material layer 313. At this time, since a deposition rate of metal is high during the deposition process, the metal layer 314 is formed as a metal film with a grain boundary, not nanocrystals.

Figure 3B:
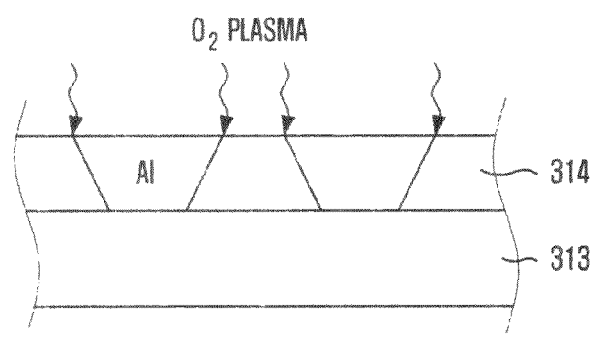
Figure 3C:
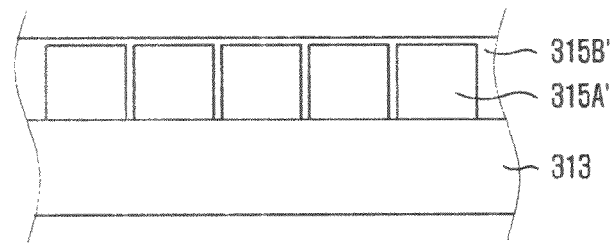

Referring to FIG. 3B, an $O_2$ plasma oxidation process is performed on the metal layer 314. The $O_2$ plasma is implanted into the metal layer 314 along the grain boundary of the metal layer 314. Accordingly, referring to FIG. 3C, the grain boundary of the metal layer 314 is oxidized to form a metal oxide material 315B'. Thus, a plurality of metal nanocrystals 315A' having substantially the same size is formed separated from each other by the metal oxide material 315B'.

Figure 3D:
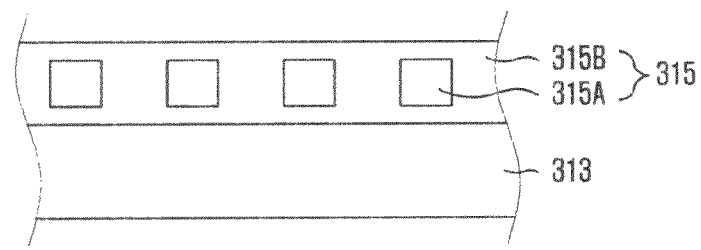

Referring to FIG. 3D, when the plasma oxidation process is completed, the nanocrystal layer 315, including nanocrystals 315A that are crystalline and a barrier 315B of an amorphous metal oxide surrounding the nanocrystals 315A, is formed. That is, when the metal layer 314 is made of Al, the nanocrystals 315A include the pure Al and the barrier 315B includes $Al_xO_y$, e.g., $Al_2O_3$. Likewise, when the metal layer 314 includes various metals capable of being oxidized, the nanocrystals 315A include pure metal and the barrier 315B includes the metal oxide material, e.g., the amorphous metal oxide material. For instance, when the metal layer 314 includes Ni, the nanocrystals 315A include pure Ni and the barrier 315B includes $Ni_xO_y$, e.g., NiO.

Hereinafter, experimental examples for forming the Al nanocrystal layer and the Ni nanocrystal layer are described to show characteristics of the nanocrystal layer formed by the deposition of the metal layer and the plasma oxidation processes.

Figure 4A:
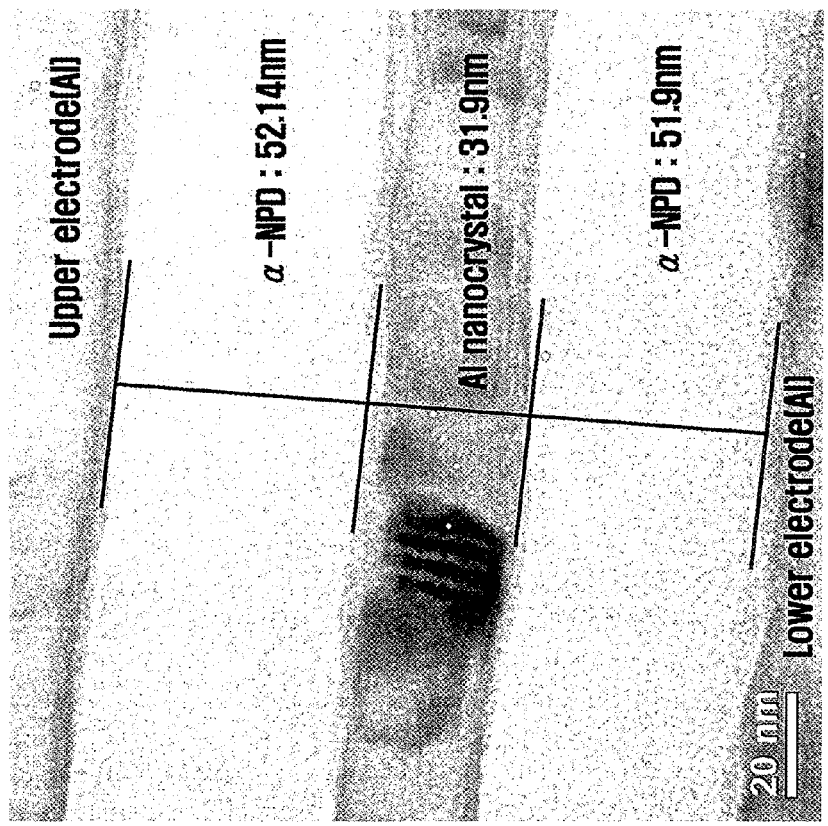
FIGS. 4A to 4D show micrographic views of a section and a lattice of a non-volatile memory device including an Al nanocrystal layer.
Figure 4B:
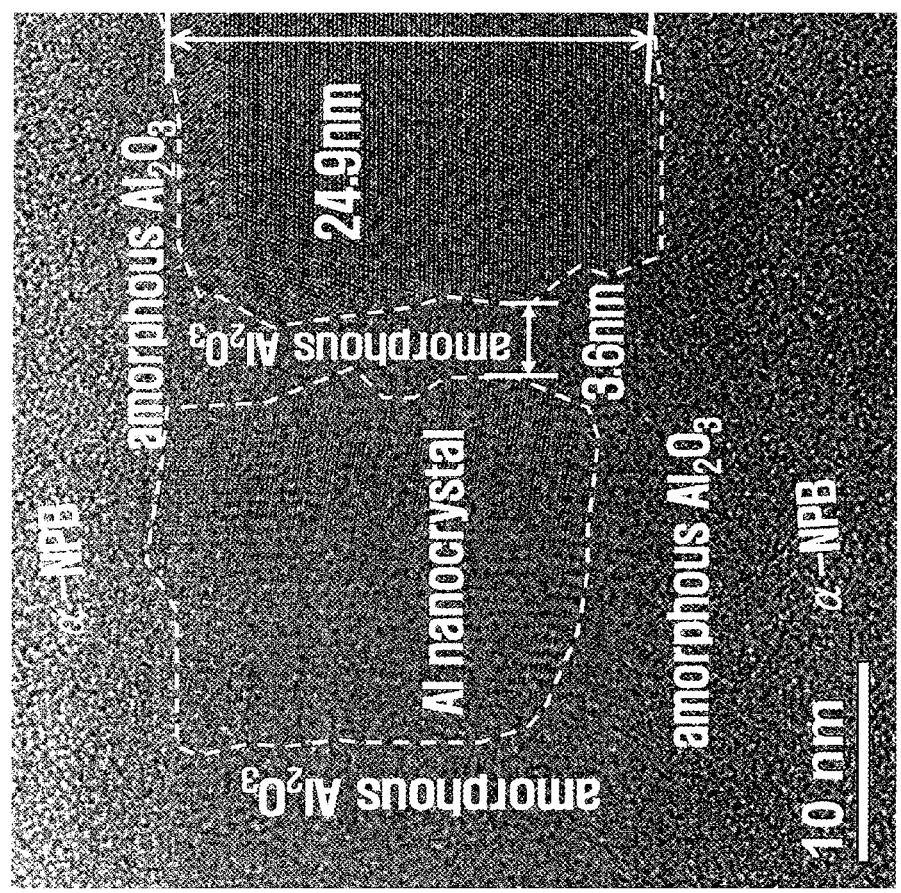
Figure 4C:
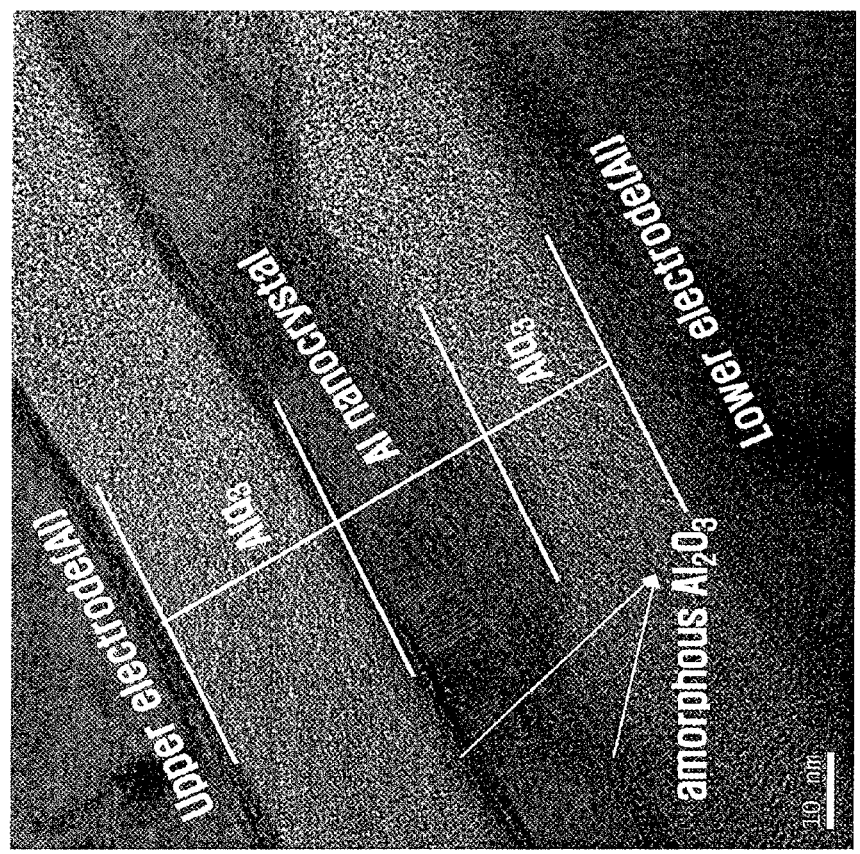
Figure 4D:
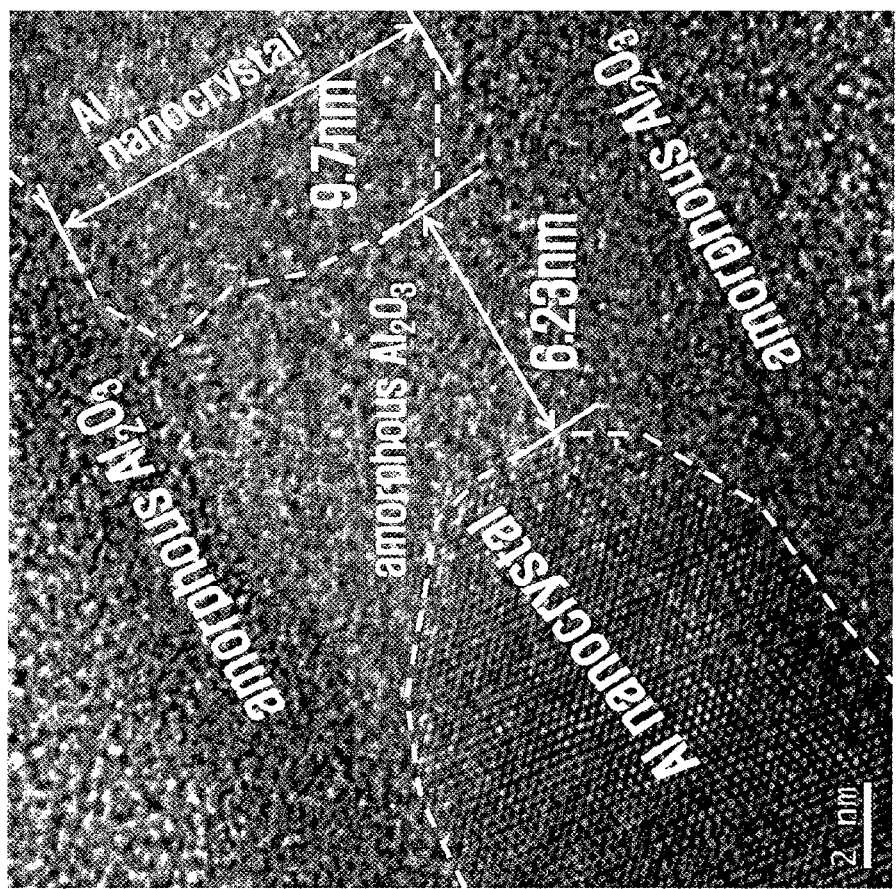
Figure 4E:
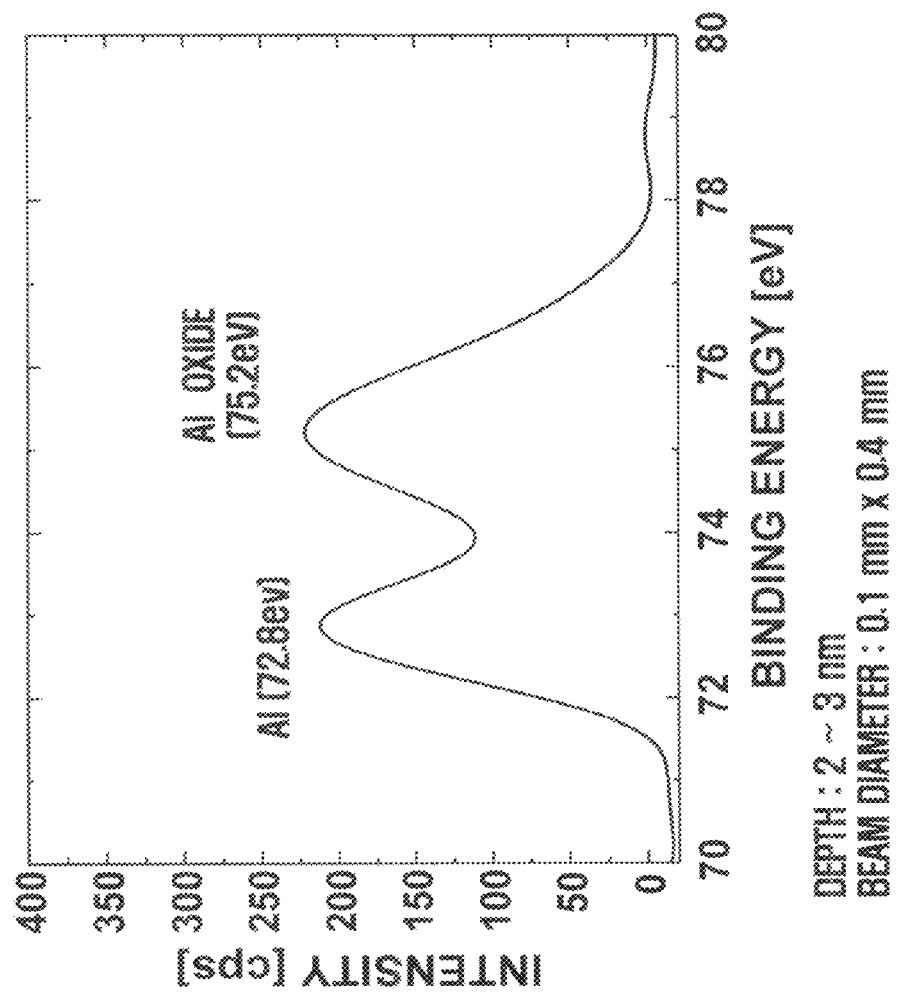
FIGS. 4E and 4F describe graphs of XPS and AES analysis results of the non-volatile memory device including the Al nanocrystal layer.
Figure 4F:
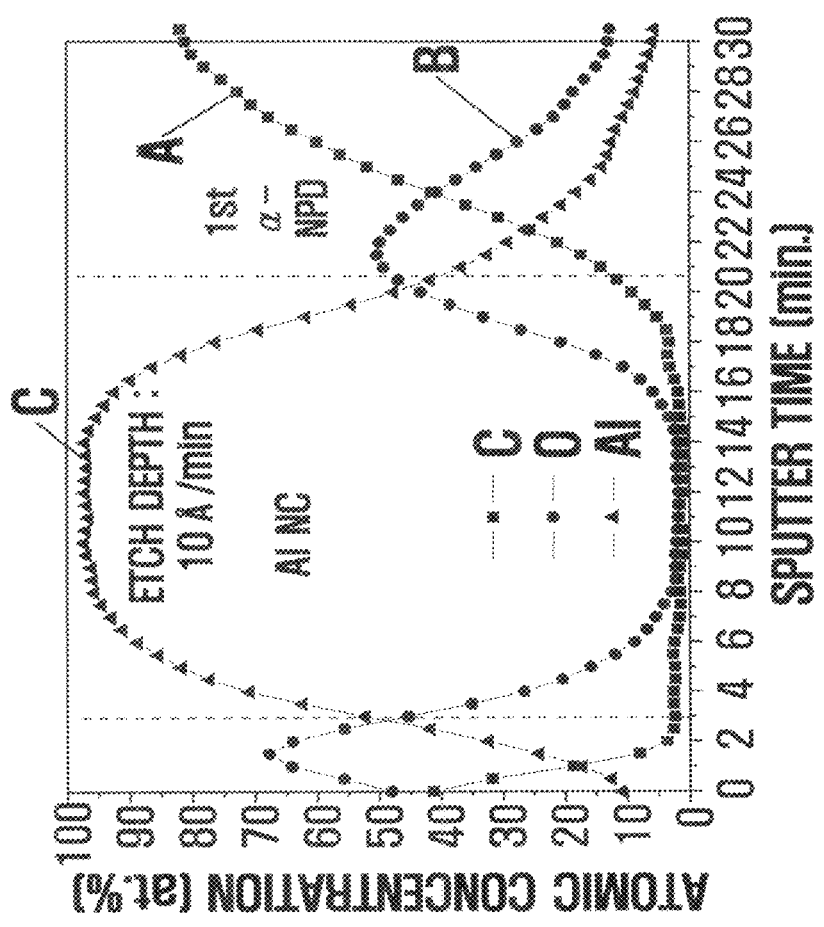

FIGS. 4A to 4D show micrographic views of a section and a lattice of a non-volatile memory device including an Al nanocrystal layer formed by using the method illustrated in FIGS. 2A to 3D. FIGS. 4E and 4F describe graphs of X-ray photoelectron spectroscopy (XPS) and auger electron spectroscopy (AES) analysis results of the non-volatile memory device including the Al nanocrystal layer. Particularly, FIGS. 4A and 4B show a case of employing a conductive organic material layer including α-NPD. FIGS. 4C and 4D provide a case of employing a conductive organic material layer including $Alq_3$.

Referring to FIGS. 4A to 4D, the Al nanocrystal layer includes the crystalline Al nanocrystals and the amorphous $Al_2O_3$. The Al nanocrystals are separated from each other by the amorphous $Al_2O_3$ surrounding them.

Referring to FIG. 4E, peaks of the Al with a binding energy of 72.8 eV and the Al oxide material with a binding energy of 75.2 eV are simultaneously generated. This result indicates that the Al nanocrystal layer includes not only the Al nanocrystals but also the Al oxide material, e.g. $Al_2O_3$.

Referring to FIG. 4F, the graph shows the dispersion of $O_2$ in a direction of the upper conductive organic material (α-NPD) layer to the Al nanocrystal layer. $O_2$ peaks occur at both borders of the Al nanocrystal layer.

This result indicates that the $O_2$ plasma is implanted along the boundary of the metal layer from on the lower conductive organic material layer during the plasma oxidation process for forming the Al nanocrystal layer and then, the lower border of the metal layer interfacing with the lower conductive organic material layer is also sufficiently oxidized. As a result, the Al nanocrystals are separated by the amorphous $Al_2O_3$, thereby being properly isolated.

Figure 5A:
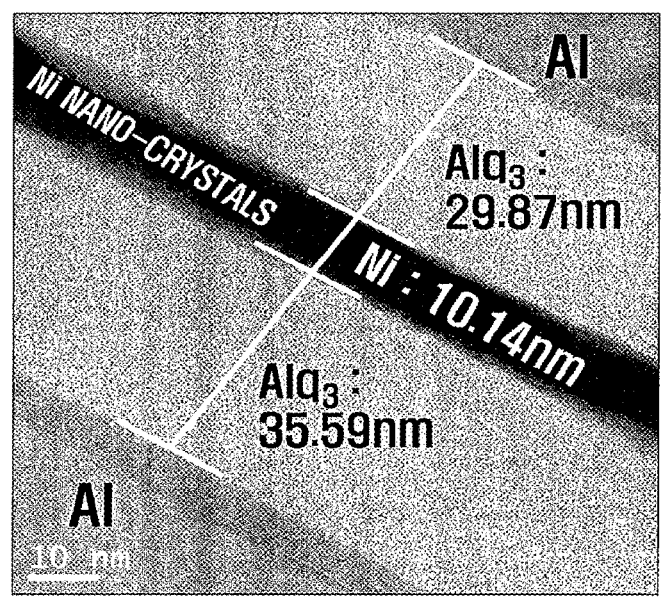
FIGS. 5A and 5B are micrographic views of a section and a lattice of a non-volatile memory device including a Ni nanocrystal layer.
Figure 5B:
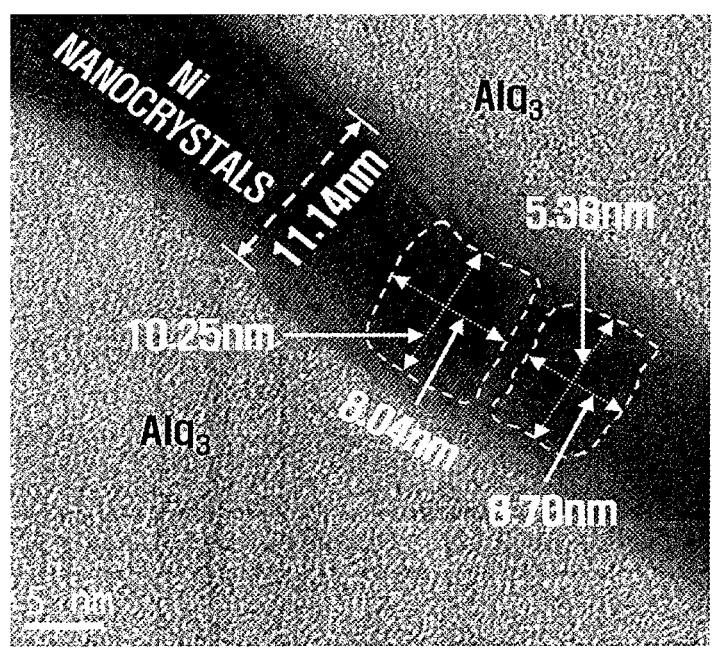
Figure 5C:
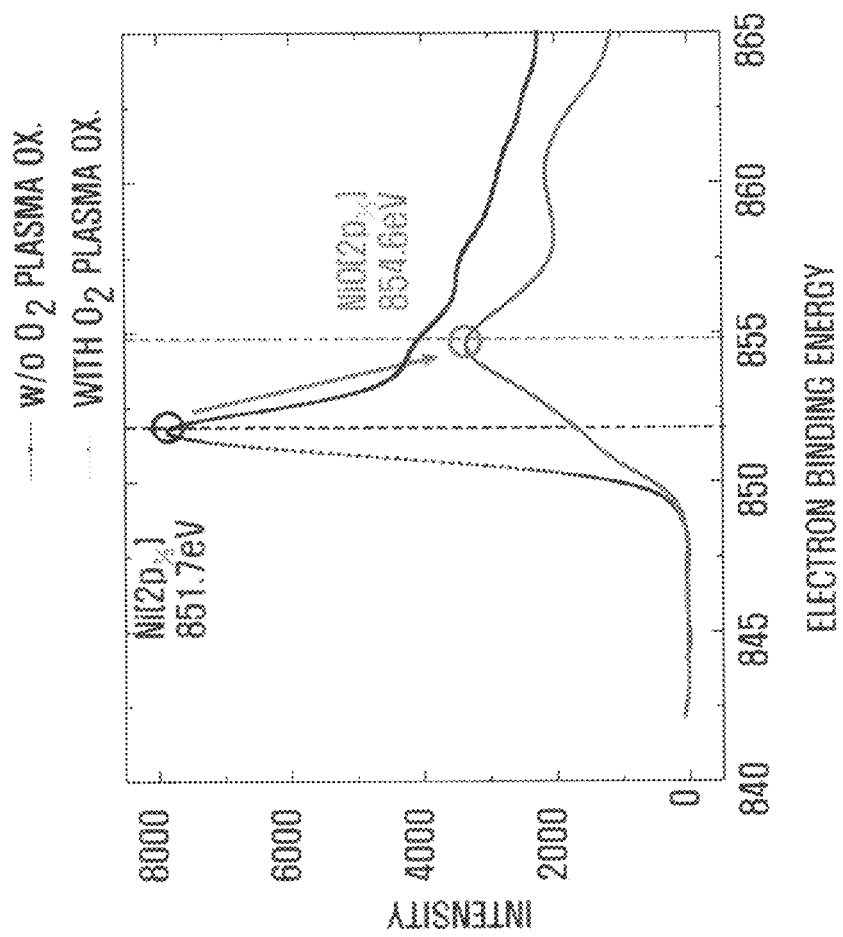
FIGS. 5C and 5D represent graphs of XPS and AES analysis results of the non-volatile memory device including the Ni nanocrystal layer.
Figure 5D:
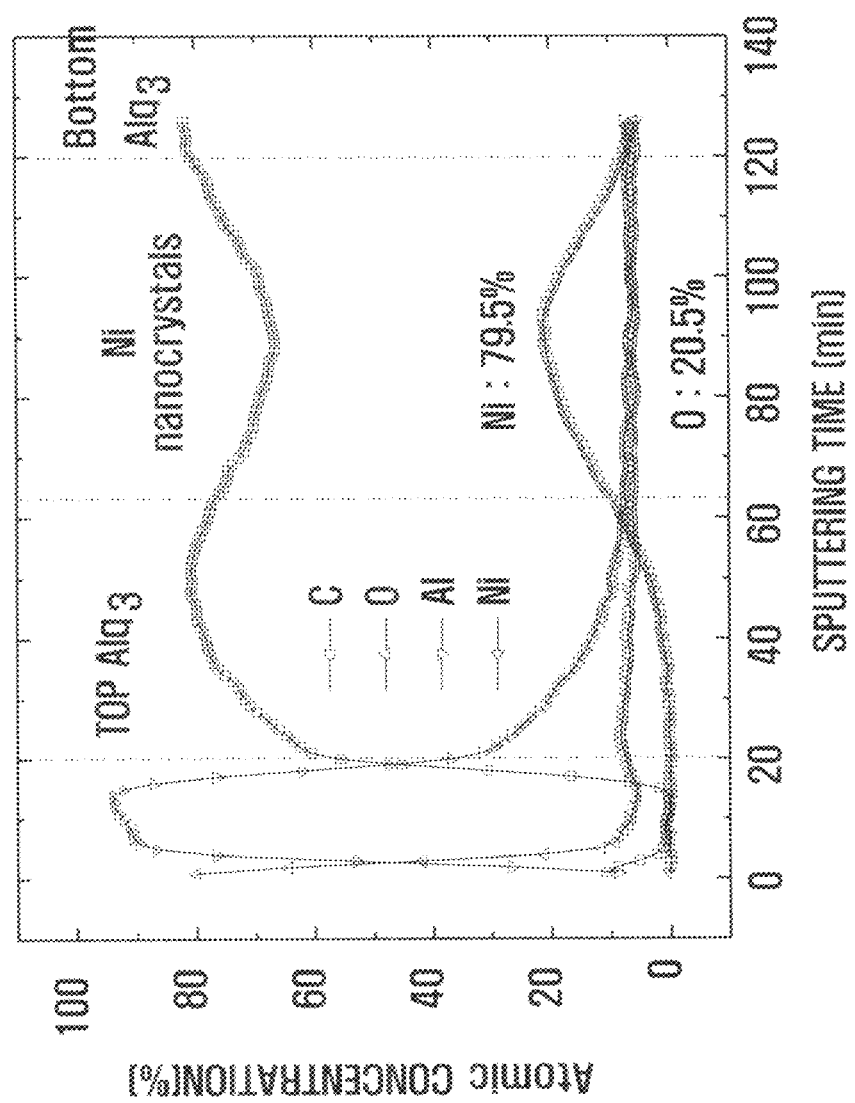

FIGS. 5A and 5B are micrographic views of a section and a lattice of a non-volatile memory device including a Ni nanocrystal layer formed by using the method illustrated in FIGS. 2A to 3D. FIGS. 5C and 5D represent graphs of XPS and AES analysis results of the non-volatile memory device including the Ni nanocrystal layer. Particularly, FIGS. 5A and 5D show a case of employing a conductive organic material layer including $Alq_3$.

Referring to FIGS. 5A and 5B, since the Ni nanocrystals have a smaller size than the Al nanocrystals, the Ni nanocrystals and the amorphous Ni oxide material surrounding the Ni nanocrystals are not obviously distinguished from each other. However, it is noticed that the pure Ni nanocrystals exist.

Referring to FIG. 5C, after the deposition of the Ni metal layer and the $O_2$ plasma oxidation process are performed, the Ni oxide material (nickel oxide (NiO)) reaches a peak with a binding energy of 854.6 eV. This indicates that the Ni nanocrystal layer includes not only the Ni nanocrystals but also the Ni oxide material secured by oxidizing the Ni metal layer.

Referring to FIG. 5D, the graph shows that the Ni nanocrystal layer contains 79.5% Ni and 20.5% O. That is, the Ni nanocrystal layer includes both of the Ni nanocrystals and the Ni oxide material. The reason the Al nanocrystal layer in FIG. 4F does not coincide with that in this graph is that an electron beam penetrates the region where the Ni nanocrystals substantially overlap with the amorphous Ni oxide material during the AES analysis since the Ni nanocrystals have a small size.

That is, it is noted that when the Ni metal layer is deposited and the $O_2$ plasma oxidation process is performed thereon, the Ni nanocrystals and the amorphous Ni oxide material surrounding the Ni nanocrystals are formed.

Hereinafter, the non-volatile memory device with a stack structure of the first conductive organic material layer/the nanocrystal layer/the second conductive organic material layer between the lower and the upper electrodes is described. Particularly, the experiment was carried out in forming the Al nanocrystal layer and the Ni nanocrystal layer by employing the method illustrated in FIGS. 2A to 3D.

Figure 6A:
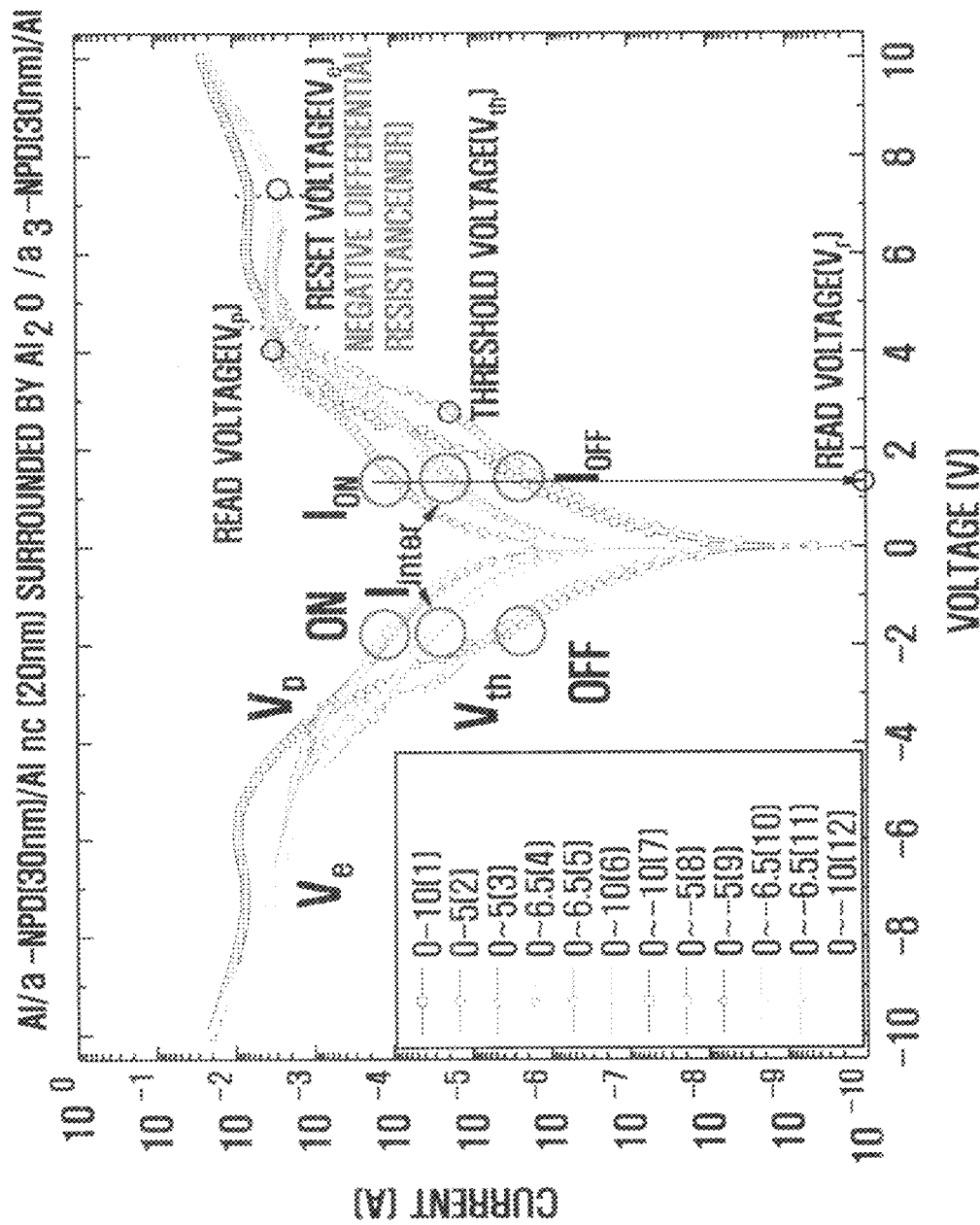
FIG. 6A is a graph showing a voltage-current characteristic of a non-volatile memory device using an α-NPD as a conductive organic material layer and including an Al nanocrystal layer in accordance with an embodiment of the present invention.

FIG. 6A is a graph showing a voltage-current characteristic of a non-volatile memory device using an α-NPD as a conductive organic material layer and including an Al nanocrystal layer in accordance with an embodiment of the present invention. FIG. 6B is a graph showing a voltage-current characteristic of a non-volatile memory device using an AIDCN as a conductive organic material layer and including an Al nanocrystal layer in accordance with another embodiment of the present invention. FIG. 6C is a graph showing a voltage-current characteristic of a non-volatile memory device using an $Alq_3$ as a conductive organic material layer and including an Al nanocrystal layer in accordance with still another embodiment of the present invention. FIG. 6D is a graph showing a voltage-current characteristic of a non-volatile memory device using an $Alq_3$ as a conductive organic material layer and including a Ni nanocrystal layer in accordance with further still another embodiment of the present invention. FIGS. 7A to 7H depict views of explaining a mechanism realizing the voltage-current characteristic shown in FIG. 6A. Particularly, FIGS. 6A to 7H describe a voltage-current characteristic of a unit cell.

Referring to FIGS. 6A to 7H, the unit cell has various current and resistance states in a certain voltage range according to voltages applied to the lower and the upper electrodes 12 and 17.

For instance, when connecting the lower electrode 12 to the ground and the upper electrode 17 to a certain voltage source to sequentially increase the voltage of the voltage source in a positive direction, the unit cell has a high resistance state $I_{off}$. In the high resistance state, the current increases slowly until a threshold voltage $V_{th}$ is reached. Then, when the voltage difference between the electrodes 12 and 17 is greater than a certain level, i.e., a critical voltage or a threshold voltage $V_{th}$, the unit cell is transformed to have a low resistance state $I_{on}$ where the current increases rapidly. The current output by the unit cell increases as the voltage applied to the upper electrode increases to a peak current voltage $V_p$. Beyond the peak current voltage $V_p$, the unit cell is transformed to have a negative differential resistance (NDR) state where the current decreases as the voltage increases. The unit cell is in the NDR state until the voltage applied to the upper electrode reaches a reset voltage $V_e$ (or erase voltage). The unit cell again outputs a current increasing as the voltage applied to the upper electrode increases. That is, the unit cell has various current and resistance states according to the potential difference between the upper and lower electrodes. Here, the peak current voltage $V_p$ indicates a voltage at the point where the current of the unit cell reaches the peak or where a negative current is generated.

The non-volatile memory device having various current or resistance states performs a data read operation in a first voltage range, a data write operation in a second voltage range, an intermediate data write operation in a third voltage range, and an erase operation in a fourth voltage range. The second voltage range is higher than the first voltage range. The third voltage range is higher than the second voltage range. The fourth voltage range is higher than the third voltage range. The first voltage range has a voltage not more than the threshold voltage $V_{th}$, the second voltage range has a voltage more than the threshold $V_{th}$ and not more than the peak current voltage $V_p$, the third voltage range has a voltage more than the peak current voltage $V_p$ and not more than a certain voltage $V_e$, and the fourth voltage range has a voltage more than a certain voltage $V_e$. Hereinafter, this mechanism is described in detail.

Figure 7B:
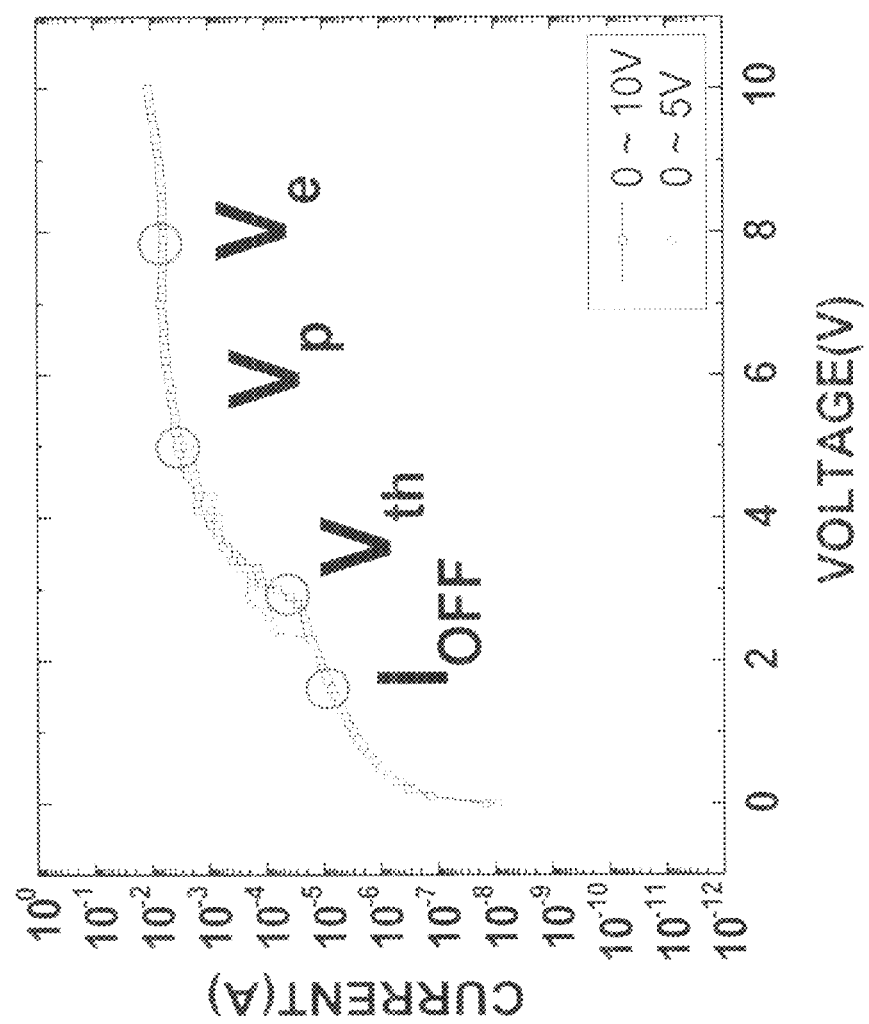

To place the non-volatile memory device in the low resistance state $I_{on}$, a voltage more than the threshold voltage $V_{th}$, i.e., a first program voltage, is supplied to the memory device. That is, as illustrated in FIGS. 7B and 7C, when increasing the voltage from 0 V to 5 V and then supplying the voltage again, it is checked that the resistance state is in the low resistance state $I_{on}$. At this time, if performing the data read operation by supplying a voltage not more than the threshold voltage $V_{th}$, i.e., in the first voltage range, the memory device where the data is stored maintains the low resistance state $I_{on}$ and outputs current corresponding to the low resistance state $I_{on}$. That is, it is noted that the output current generated when the read operation is performed after writing data in the device is several orders higher than that generated when the read operation is performed while data is not written in the device.

Figure 7D:
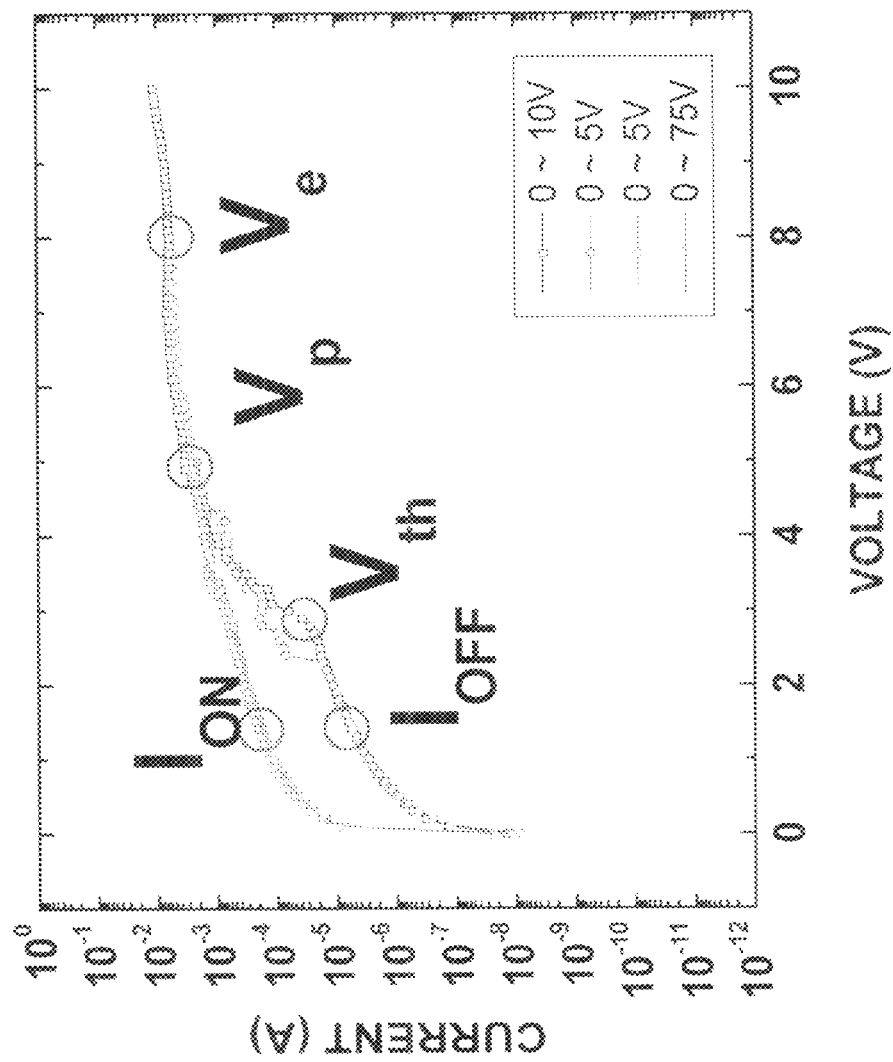
Figure 7E:
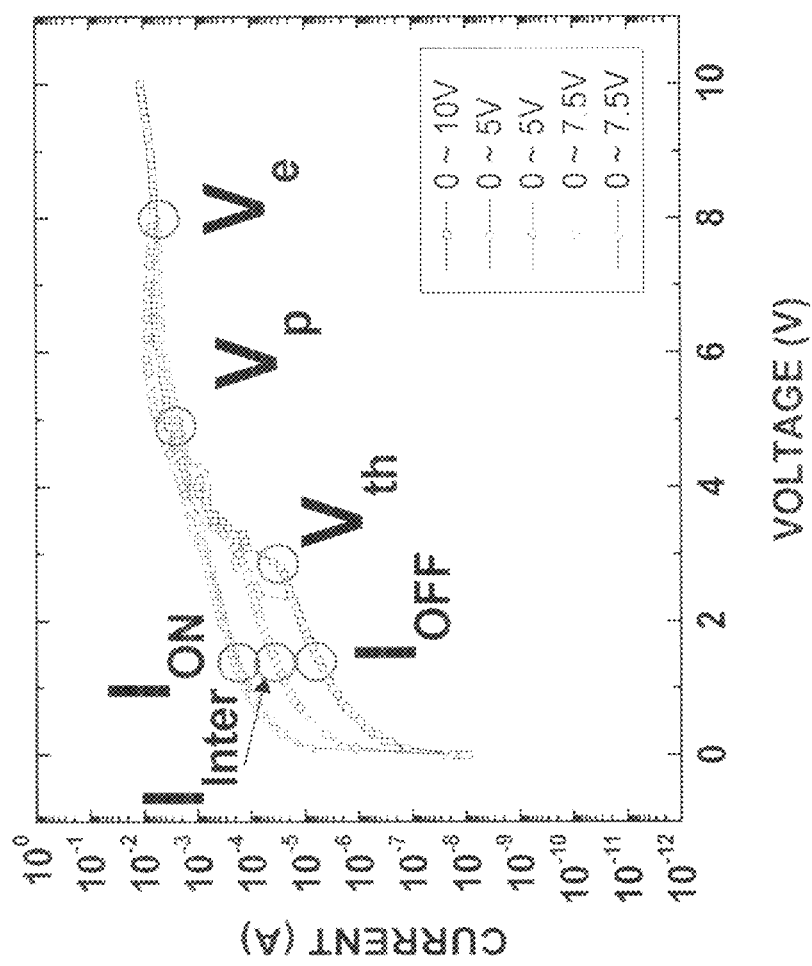
Figure 7F:
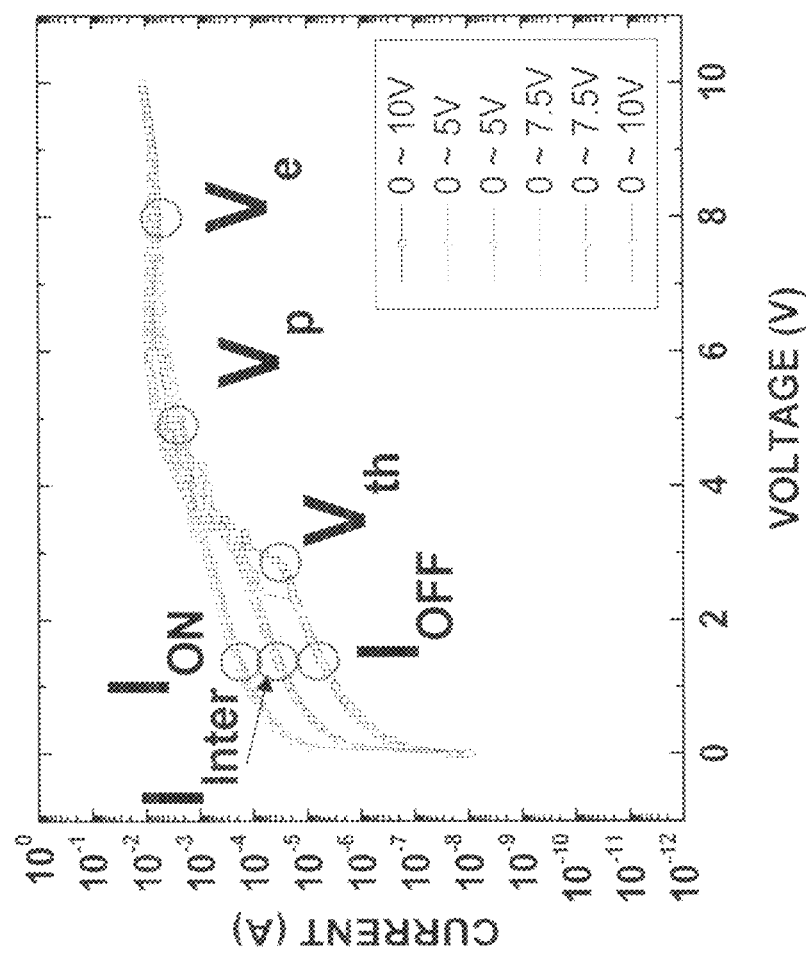
Figure 7H:
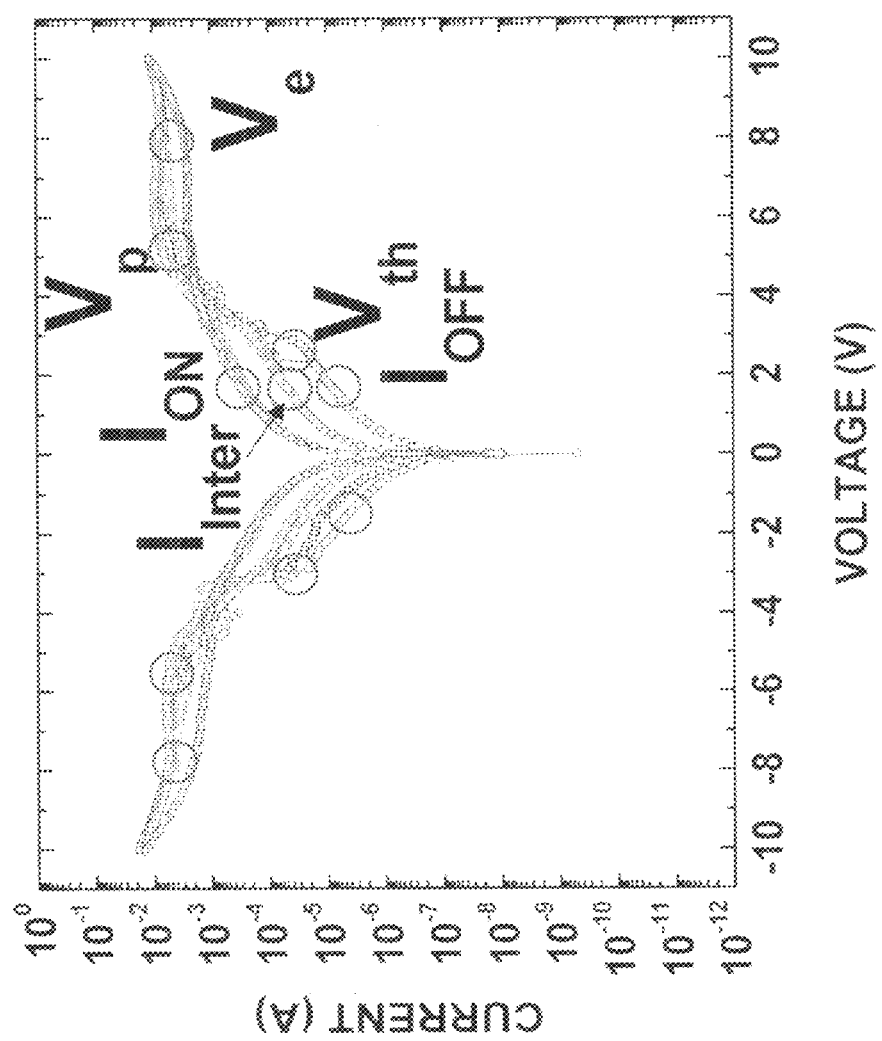

To place the memory device in the NDR state, a voltage more than the peak current voltage V, and not more than a reset voltage $V_e$, i.e., the second program voltage, is supplied to the memory device. That is, as illustrated in FIGS. 7D and 7E, when increasing the voltage from 0 V up to 7.5 V and then supply the voltage again, it is checked that the resistance state is an intermediate resistance state Enter. At this time, if performing the data read operation by supplying a voltage not more than the threshold voltage $V_{th}$, it is noted that the memory device where the data is stored outputs current corresponding to the low intermediate resistance state $I_{inter}$. The intermediate resistance state $I_{inter}$ is a resistance state between the high resistance state $I_{off}$ and the low resistance state $I_{on}$, so that the memory device outputs current in an intermediate state. That is, in the intermediate resistance state $I_{inter}$, there is outputted current lower than that in the low resistance state $I_{on}$ and higher than that in the high resistance state $I_{off}$. Thus, referring to FIG. 6A, at the read voltage level, e.g. 2V, there is shown that the output current of intermediate level is outputted in the intermediate resistance state $I_{inter}$ between the high resistance state $I_{off}$ and the low resistance state $I_{on}$.

When supplying the certain voltage $V_e$ after the NDR state range, the resistance state of the device is changed to the high resistance state. That is, the device is reset.

As a result, it is possible that the first program voltage in the low resistance state $I_{on}$ is supplied to store a value corresponding to a first data in the device and the second program voltage in the NDR state is supplied to store a value corresponding to a second data in the device.

Particularly, since the level of the output current changes according to the voltage level supplied in the NDR range, various values corresponding to the second data can be stored in the device. For instance, as shown in FIG. 6D, when the voltage of approximately 5 V or approximately 6V in the NDR range is supplied to the device, the currents of various levels, i.e. $I_{inter1}$, $I_{inter2}$, are outputted at a voltage for the read operation, e.g., approximately 2V. At this time, as shown above, the currents $I_{inter1}$ and $I_{inter2}$ outputted according to the voltage supplied in the NDR range is higher than the output current $I_{off}$ in an erase operation and lower than the output current $I_{on}$ in the first data writing operation.

As a result, the unit cell is embodied as a multi-level cell with at least three levels.

Hereinafter, the unit cell is described as having various current or resistance states.

When carriers are not charged in the nanocrystals due to a gap of energy levels between the nanocrystal layer (including the nanocrystals and the amorphous barrier surrounding the nanocrystals) and the conductive organic material layer, the flowing current delicately increases at a certain voltage. However, when the voltage coupled to both of the conductive organic material layers is more than a certain critical voltage, e.g., the threshold voltage $V_{th}$, the carriers are charged in the nanocrystals and thus the flowing current rapidly increases. When the carriers are charged in the nanocrystals, the flowing current increases tens of times to tens of thousands times compared to the case when the carriers are not charged. Furthermore, when the voltage coupled to both of the conductive organic material layers is in the NDR range, the carriers are partially charged or partially discharged, so that the flowing current has an intermediate current lower than that in the case of the carriers being completely charged and higher than that in the case of the carriers not being charged. When the voltage higher than that in the NDR range, e.g. the reset voltage $V_e$, is coupled to both of the conductive organic material layers, the carriers charged in the nanocrystals are completely discharged.

Meanwhile, as shown in FIG. 6A, when sequentially increasing a voltage of the power source in a negative direction, the voltage-current characteristic is almost symmetrical to that obtained by increasing the voltage of the power source in the positive direction. That is, the current delicately increases up to a certain level of the voltage and rapidly increases when the voltage over a certain level, e.g. the threshold voltage $V_{th}$, is supplied. Then, when the voltage over the peak current voltage $V_p$ is supplied, the NDR state is obtained and the current increases when the voltage becomes higher than the reset voltage $V_e$. This result is acquired because of the symmetrical structure of the device using substantially the same mechanism as that used for the voltage in the positive direction.

As described above, in accordance with an embodiment of the present invention, the non-volatile memory device may have a double cell structure of two unit cells sequentially stacked (refer to FIG. 1B). In accordance with another embodiment of the present invention, the non-volatile memory device may have a multi cell structure having at least three unit cells sequentially stacked.

FIGS. 8A to 9B illustrate operations of the non-volatile memory device with the double cell structure. Particularly, in one experiment, cells including the Al nanocrystal layer are stacked and in the other experiment, cells including the Ni nanocrystal layer are stacked.

Figure 8A:
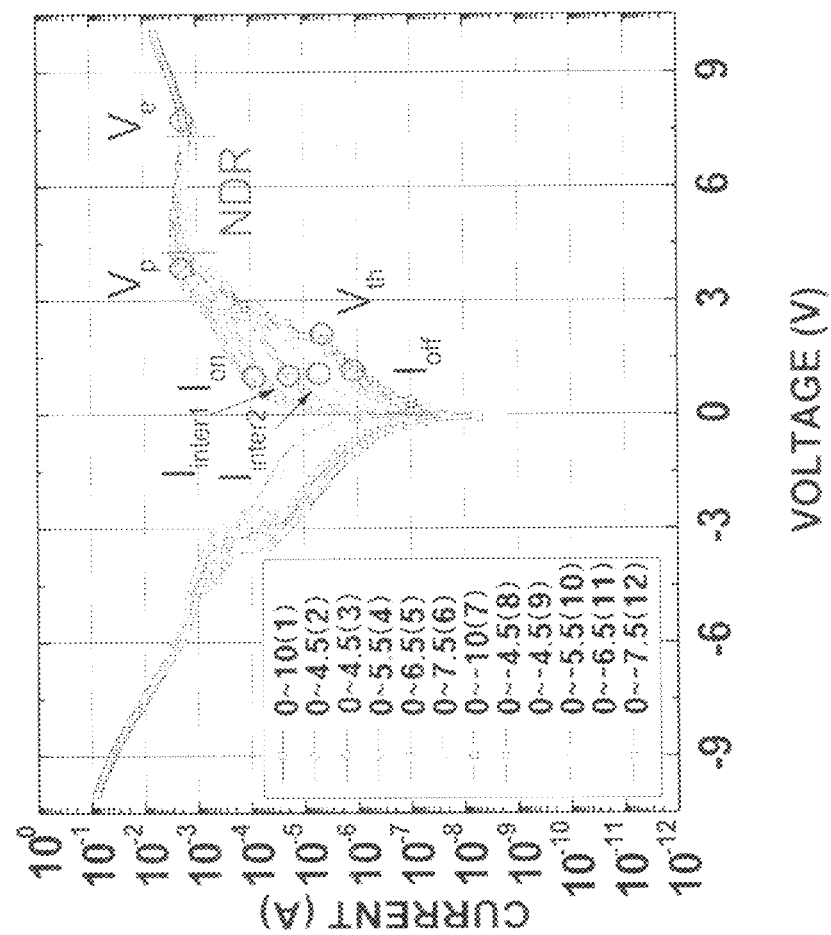
FIGS. 8A to 8B are graphs showing a voltage-current characteristic of a non-volatile memory device with a stack structure of two cells using an $Alq_3$ as a conductive organic material layer and including an Al nanocrystal layer.
Figure 8B:
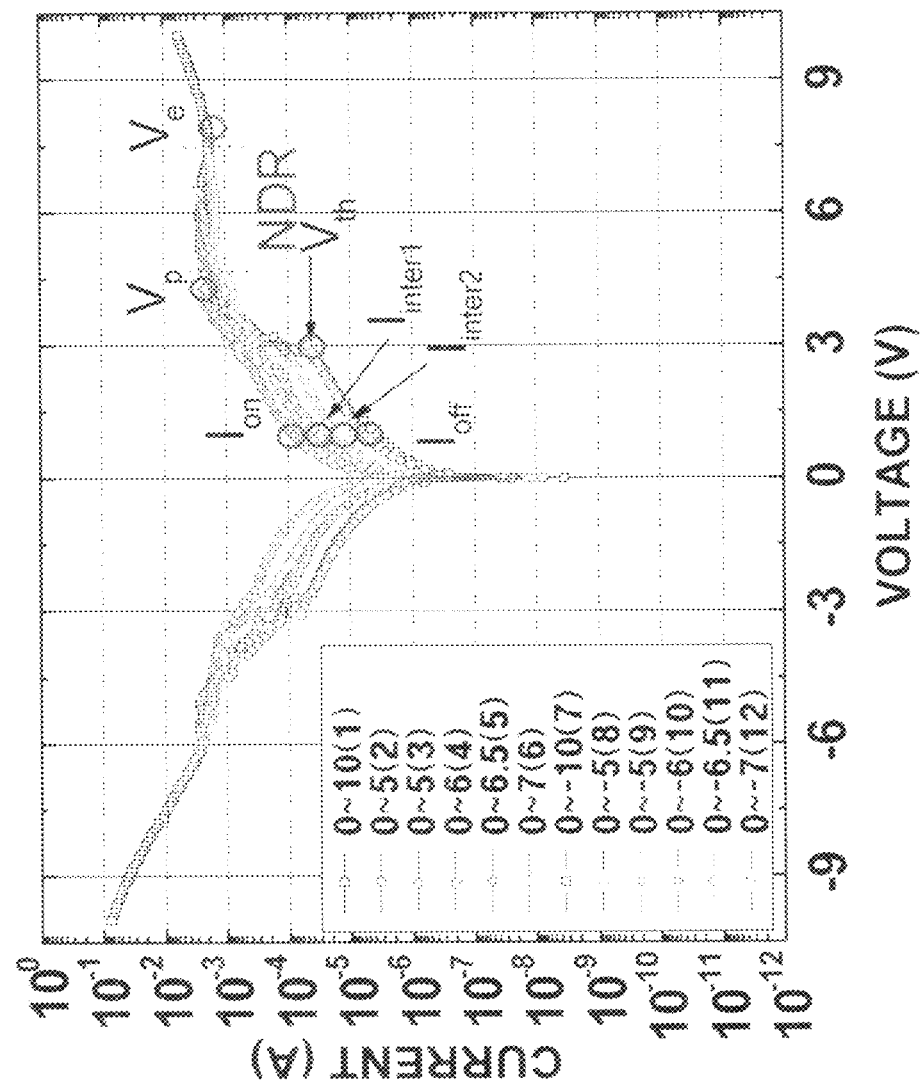
Figure 9B:
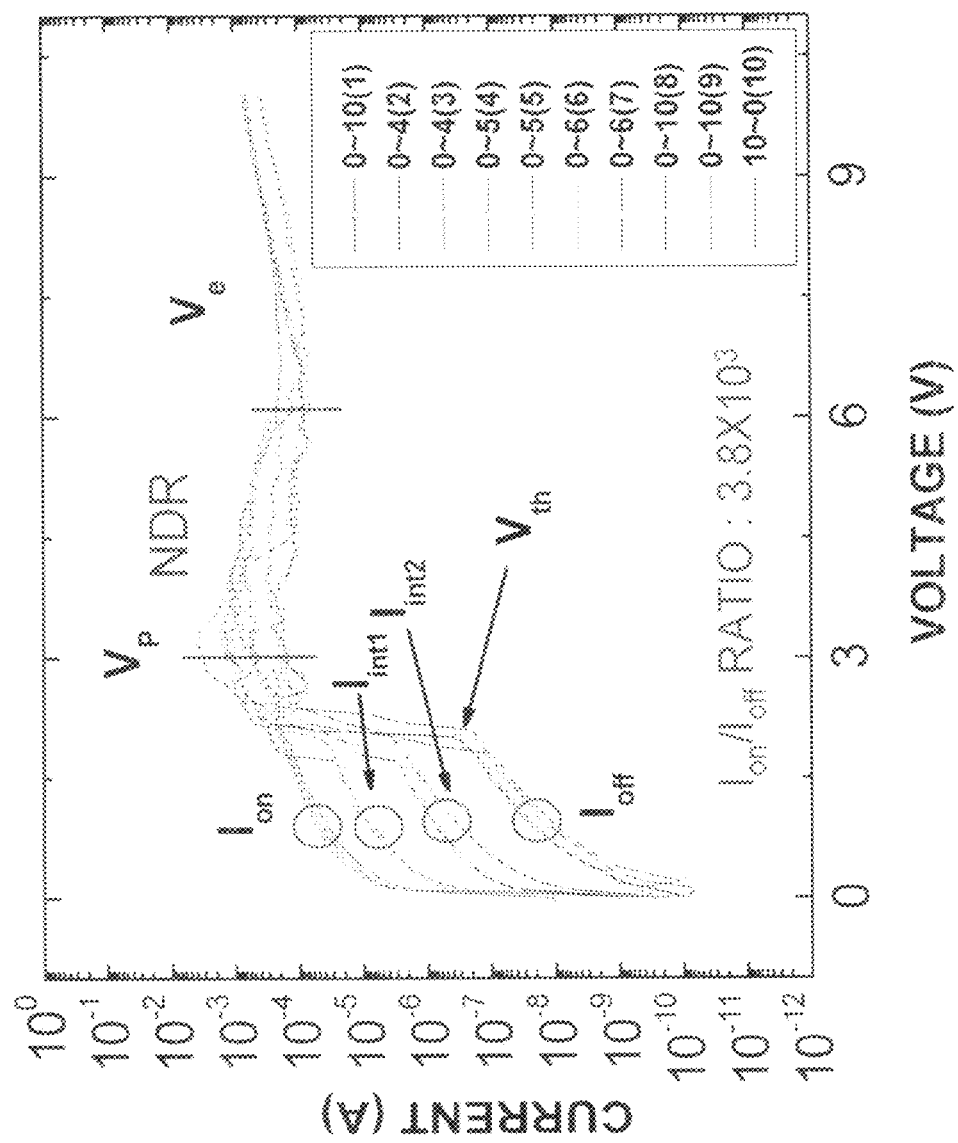

FIGS. 8A to 8B are graphs showing a voltage-current characteristic of the non-volatile memory device with the double cell structure employing conductive organic material layers made of $Alq_3$ and including the Al nanocrystal layer. FIGS. 9A and 9B are graphs showing a voltage-current characteristic of the non-volatile memory device with the double cell structure employing conductive organic material layers made of $Alq_3$ and including the Ni nanocrystal layer. Particularly, FIGS. 8A and 9A show a lower cell characteristic and FIGS. 8B and 9B show an upper cell characteristic.

Referring to FIGS. 8A to 9B, even though the double cell structure of two unit cells is formed, each cell maintain a multi-level cell characteristic to output various current levels during the read operation according to the supplied voltage, i.e., the program state. By stacking the multi-level cells, more resistance or current states are obtained. Accordingly, when more cells are stacked, more data can be stored and the device can be highly integrated.

Hereinafter, retention and endurance of the non-volatile memory device are described.

Figure 10B:
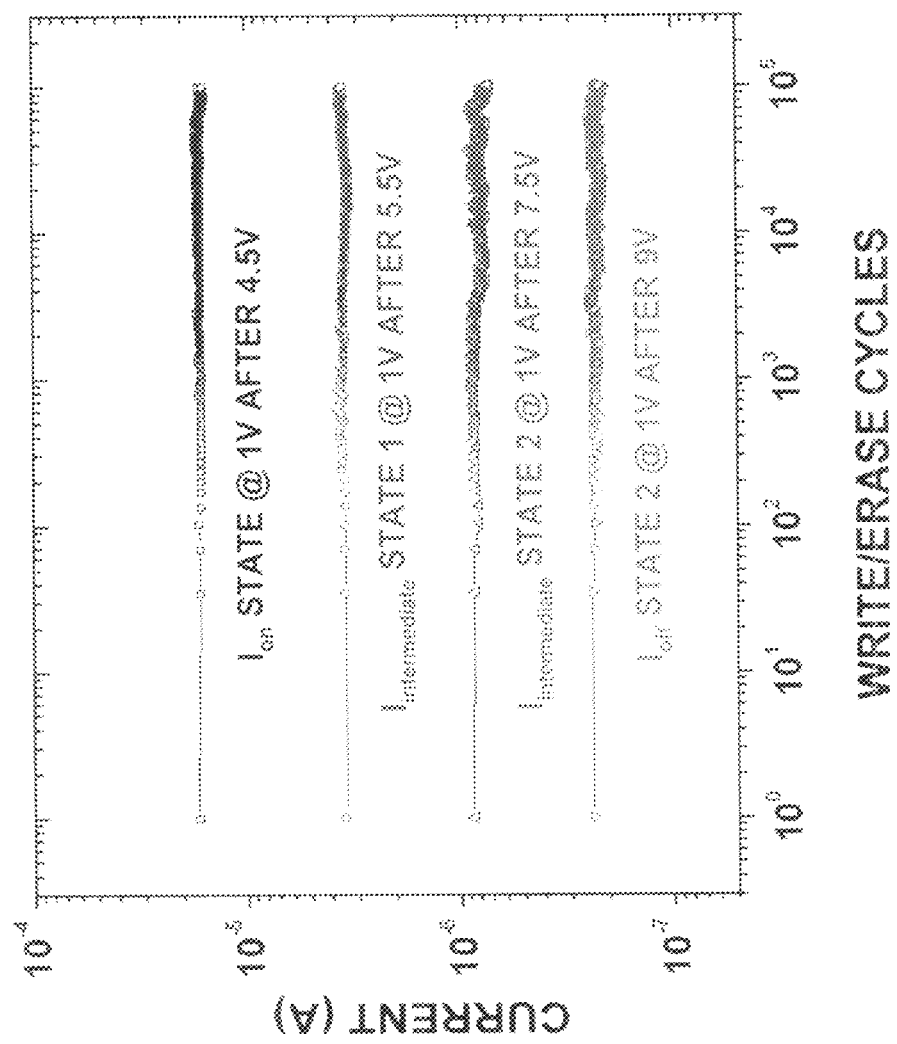
FIG. 10B is a graph showing a retention test result of the non-volatile memory device using the AIDCN as the conductive organic material layer and including the Al nanocrystal layer.

FIG. 10A is a graph showing a retention test result of the non-volatile memory device using the α-NPD as the conductive organic material layer and including the Al nanocrystal layer. FIG. 10B is a graph showing a retention test result of the non-volatile memory device using the AIDCN as the conductive organic material layer and including the Al nanocrystal layer. FIG. 10C is a graph showing a retention test result of the non-volatile memory device using the $Alq_3$ as the conductive organic material layer and including the Al nanocrystal layer. FIG. 10D provides graphs showing retention and endurance test results of the non-volatile memory device using the $Alq_3$ as the conductive organic material layer and including the Ni nanocrystal layer. FIGS. 10A to 10D illustrate retention and/or endurance test results for a unit cell.

Referring to FIG. 10A, when memorizing one resistance state in the non-volatile memory device with three resistance states and repeatedly reading out the memorized resistance state, the non-volatile memory device stably maintains the low, intermediate, high resistance states $I_{on}$, $I_{inter}$, and $I_{off}$ for $10^5$ cycles.

Referring to FIG. 10B, when memorizing one resistance state in the non-volatile memory device with four resistance states and repeatedly reading out the memorized resistance state, the non-volatile memory device stably maintains the four resistance states for $10^5$ cycles.

Referring to FIG. 10C, when memorizing one resistance state in the non-volatile memory device with two resistance states and repeatedly reading out the memorized resistance state, the non-volatile memory device stably maintains the two resistance states for $10^2$ cycles.

Referring to FIG. 10D, when memorizing one resistance state in the non-volatile memory device with four resistance states and repeatedly reading out the memorized resistance state, the non-volatile memory device stably maintains the four resistance states for $10^5$ cycles.

Figure 11A:
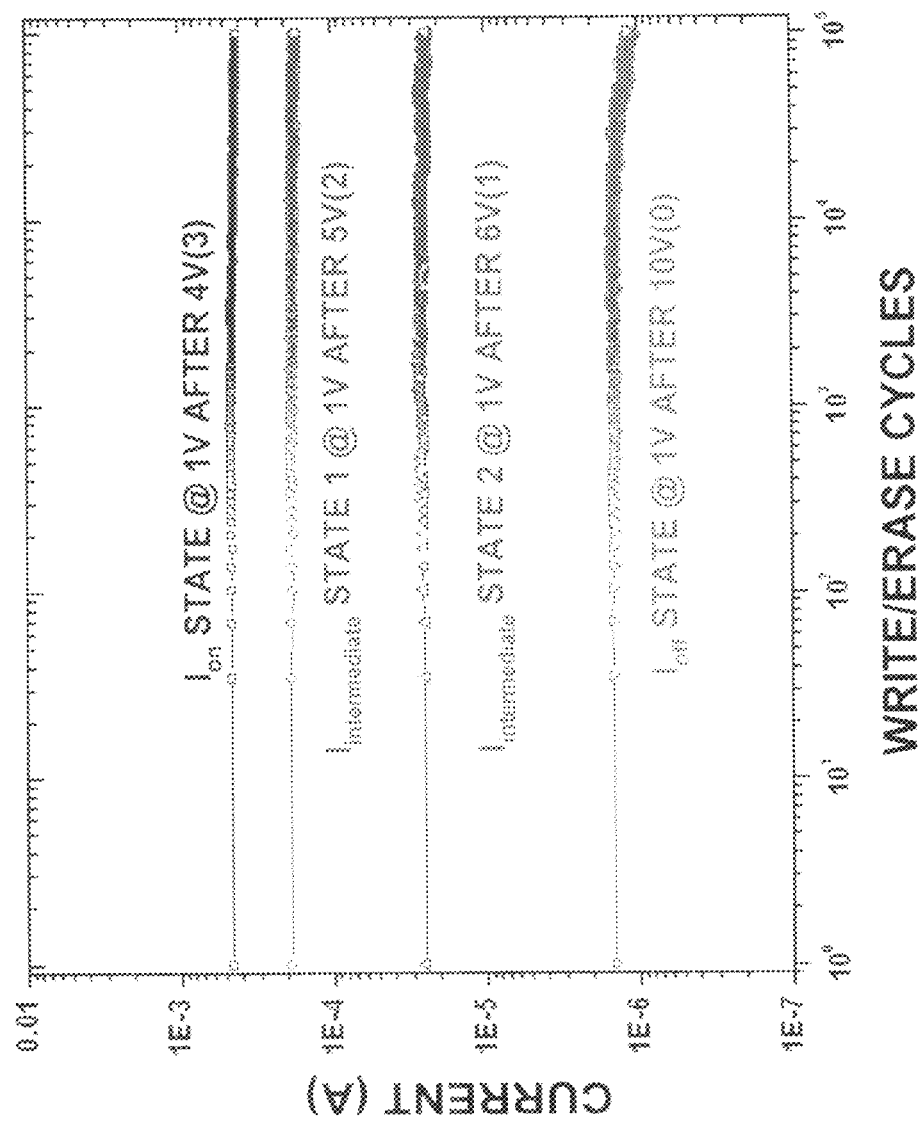
Figure 12B:
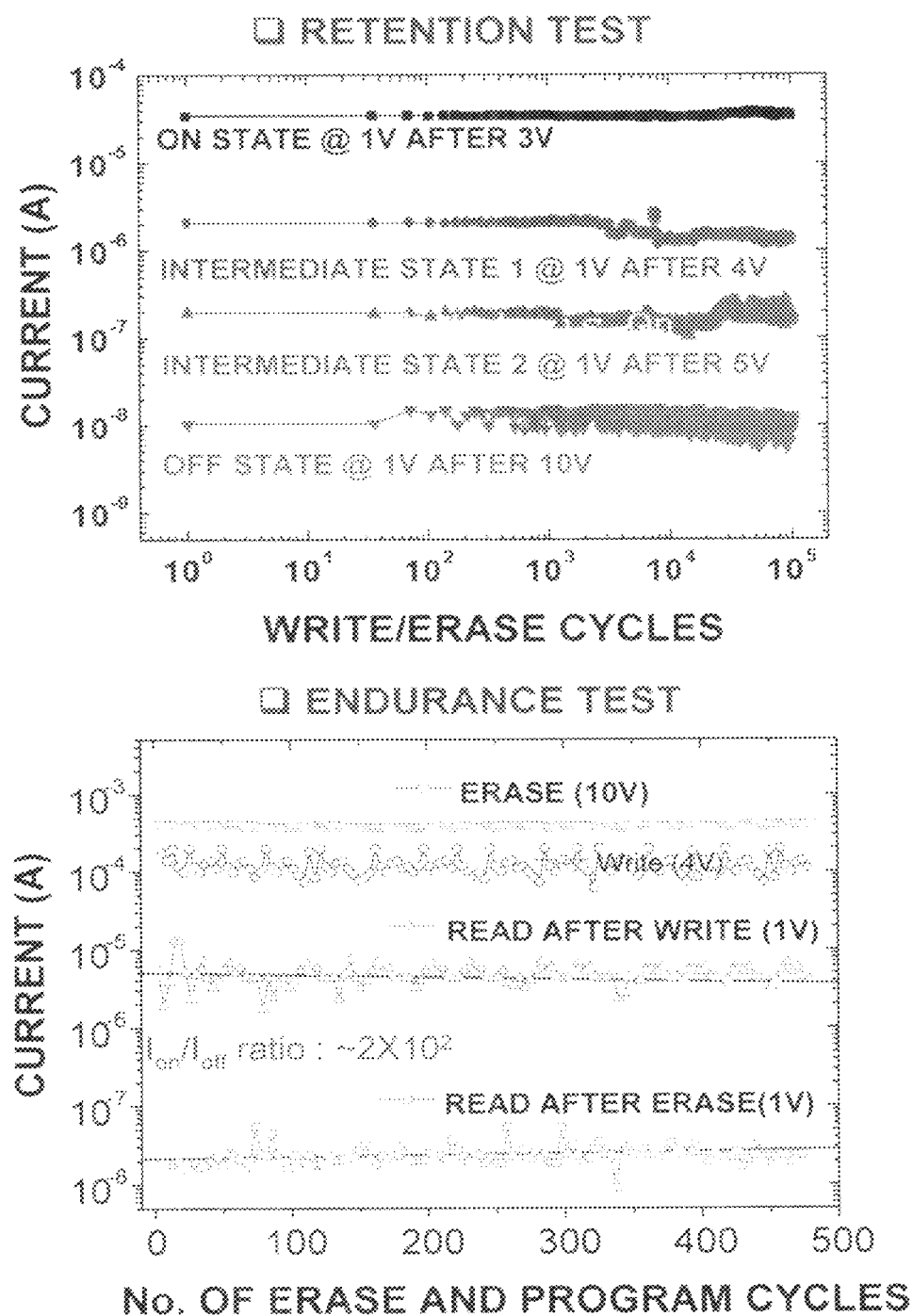

FIGS. 11A and 11B are graphs showing a retention and/or endurance test result of the non-volatile memory device with the stack structure of two cells using the $Alq_3$ as the conductive organic material layer and including the Al nanocrystal layer. FIGS. 12A and 12B are graphs showing a retention and/or endurance test result of the non-volatile memory device with the stack structure of two cells using the $Alq_3$ as the conductive organic material layer and including the Ni nanocrystal layer. Particularly, FIGS. 11A and 12A show a lower cell characteristic and FIGS. 11B and 12B show an upper cell characteristic.

Referring to FIGS. 11A to 12B, in the non-volatile memory device with the stack structure of two cells, each cell has four resistance states and it is noted that, when memorizing one resistance state and repeatedly reading out the memorized resistance state, the non-volatile memory device stably maintains the four resistance states for $10^5$ cycles.

In the drawings, the lower graphs in FIGS. 10D, 11B, 12A and 12B show the endurance test results. The endurance test result is obtained by performing the write, the read, the erase, and the read data operations in one cycle and repeating the operations for several cycles. As can be seen from the drawings, since the resistance states are different when each read voltage is supplied, the current levels are clearly classified.

Figure 13:
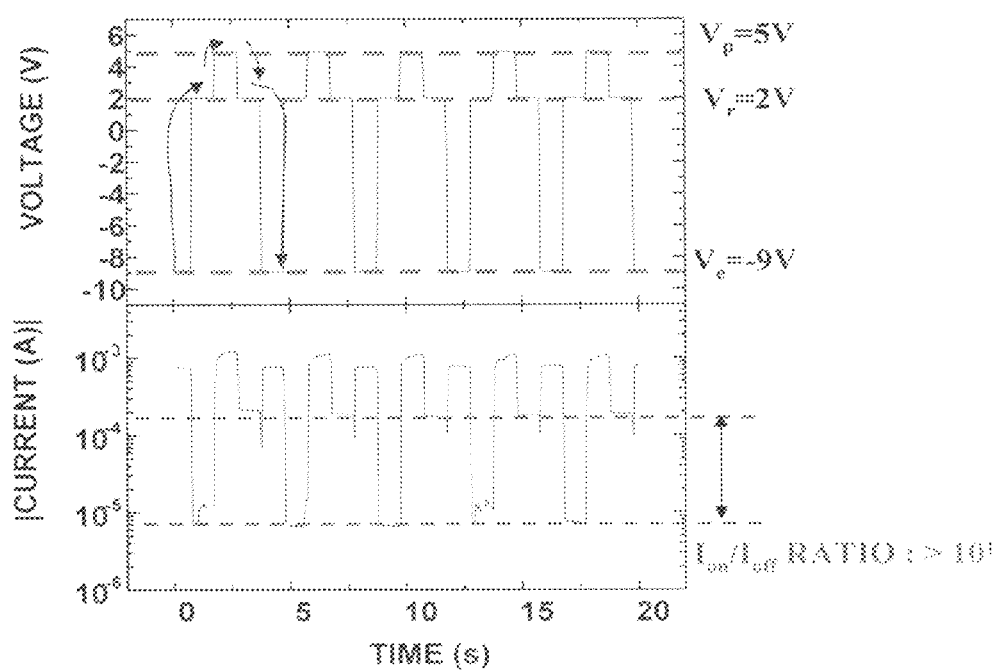
FIG. 13 is a graph showing an operational characteristic of a device according to the input of a pulse signal.

The non-volatile memory device including actual circuits operates in response to a pulse signal coupled thereto. FIG. 13 is a graph showing an operational characteristic of the device according to the input of a pulse signal.

Referring to FIG. 13, there is shown the operational characteristic obtained by inputting the pulse signal with a write voltage of 5 V, a read voltage of 2 V, and a reset voltage of −9 V to the non-volatile memory device employing the α-NPD as the conductive organic material layer and including the Al nanocrystal layer. A ratio of the two currents respectively generated in the read voltage after the write operation and generated in the read voltage after the erase process, i.e. $I_{on}/I_{off}$ maintains at least $10^1$. As a result, the stable device operational characteristic can be secured. At this time, since the device has a symmetrical characteristic, any voltages of negative and positive voltage levels can be supplied to the device. For instance, the reset voltage of +9 V can be used.

Figure 14A:
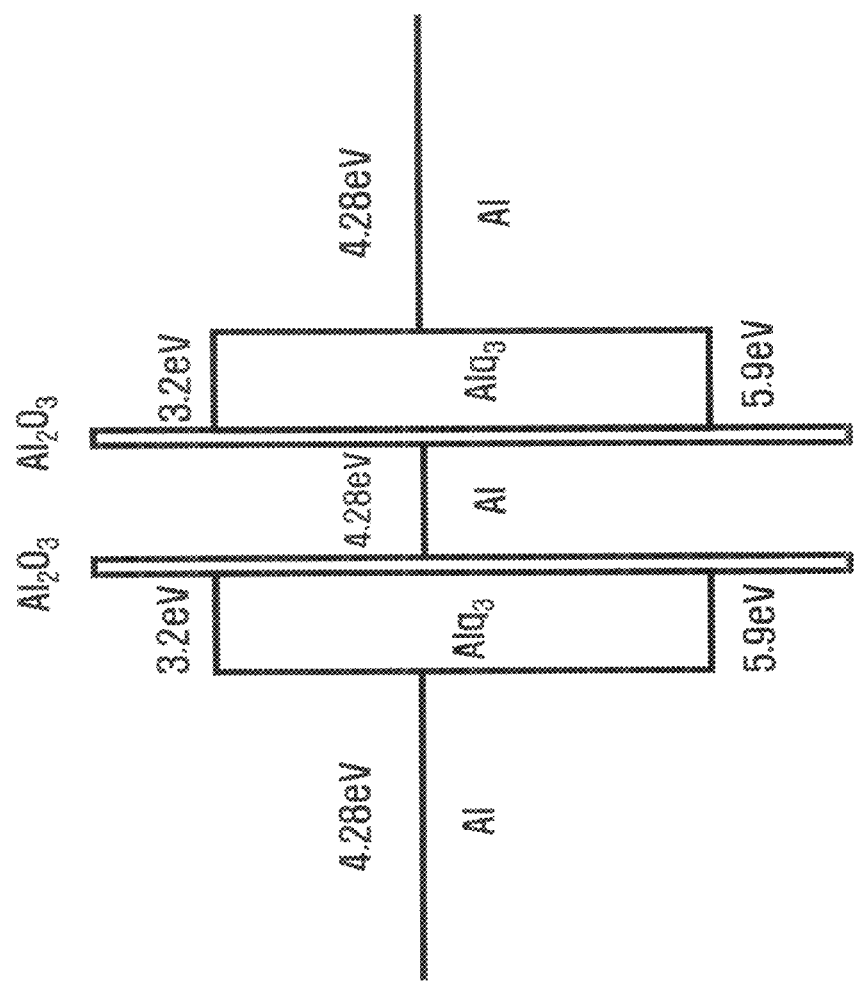
FIG. 14A describes an energy band diagram of the non-volatile memory device using the $Alq_3$ as the conductive organic material layer and including the Al nanocrystal layer.
Figure 14B:
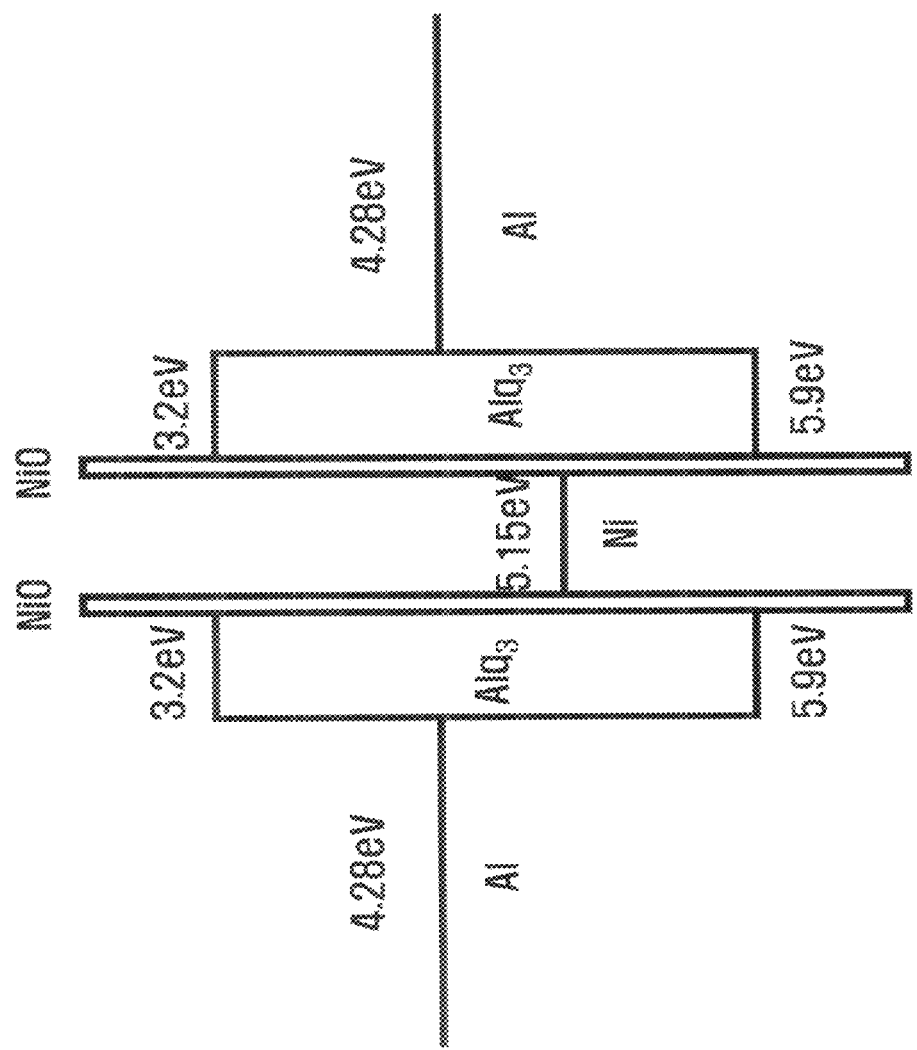
FIG. 14B shows an energy band diagram of the non-volatile memory device using the $Alq_3$ as the conductive organic material layer and including the Ni nanocrystal layer.

FIG. 14A describes an energy band diagram of the non-volatile memory device using the $Alq_3$ as the conductive organic material layer and including the Al nanocrystal layer. FIG. 14B shows an energy band diagram of the non-volatile memory device using the $Alq_3$ as the conductive organic material layer and including the Ni nanocrystal layer.

Referring to FIGS. 14A and 14B, Ni has a work function approximately 0.87 eV higher than Al. Therefore, in the non-volatile memory device including the Ni nanocrystal layer, an electron well formed by the conductive organic material layer and the nanocrystal layer becomes deeper compared to that of the device including the Al nanocrystal layer. Accordingly, while the $I_{on}/I_{off}$ ratio of the non-volatile memory device including the Al nanocrystal layer is approximately $10^2$ (refer to FIGS. 6C and 8A), that of the non-volatile memory device including the Ni nanocrystal layer increases up to approximately $10^4$ (refer to FIGS. 6D and 9A). Thus, the device including the Ni nanocrystal layer can have more intermediate resistance states between the low resistance state and the high resistance state and have improved data retention. That is, it is possible to use any metals capable of being oxidized to form the nanocrystal layer, however, it is desirable to use metals having a high work function.

In FIGS. 1A to 14B, the non-volatile memory device using one of AIDCN, Alq$_3$, α-NPD as a conductive organic material is described. Particularly, the metal layer is deposited on the conductive organic material layer and the plasma oxidation process is performed thereon to form the nanocrystal layer.

However, it is possible to use a high molecular compound so as to form a conductive material layer and other processes than the deposition of the metal layer and the plasma oxidation process can be employed to form the nanocrystal layer. Hereinafter, the other processes are described with reference to FIGS. 15A to 21. Particularly, since the high molecular compound is generally a polymer, the high molecular compound and the polymer indicate the same material hereinafter.

The detailed description of the processes already described referring to FIGS. 1A to 14B is omitted to focus on differences from the afore-mentioned embodiments. The differences are shown in forming the nanocrystals and the nanocrystal layer when using the high molecular compound as a conductive organic material. That is, instead of employing the deposition of the metal layer and the plasma oxidation process, a method employing, e.g. deposition and curing processes, is performed to form the nanocrystal layer as described in FIGS. 15A to 17B and another method for forming the nanocrystal layer dispersed in the polymer layer is described with reference to FIGS. 18A to 21.

FIGS. 15A to 15H illustrate cross-sectional views of a method for fabricating a non-volatile memory device in accordance with another embodiment of the present invention. Each of the material layers are substantially the same as that illustrated in FIGS. 2A to 2F and thus detailed description thereof is omitted.

Figure 15A:
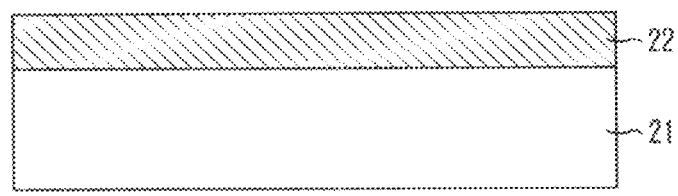
FIGS. 15A to 15H illustrate cross-sectional views of a method for fabricating a non-volatile memory device in accordance with another embodiment of the present invention.

Referring to FIG. 15A, a lower electrode 22 is formed over a substrate 20. The material and the method for forming the lower electrode 22 is substantially the same as those used for forming the first electrode 212 in FIG. 2A.

Figure 15B:
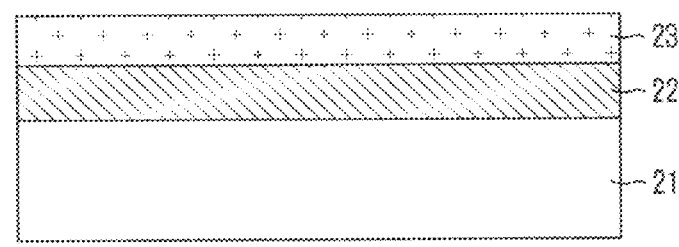

Referring to FIG. 15B, a first polymer layer 23 is formed over the lower electrode 22. The first polymer layer 23 may be made of PVK (Poly (N-vinylcarbazole)) and may be formed by employing a spin coating method. The PVK is expressed as the following chemical formula.

[Chemical formula 4]

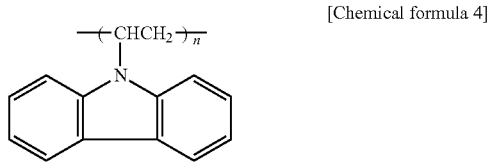

Figure 15C:
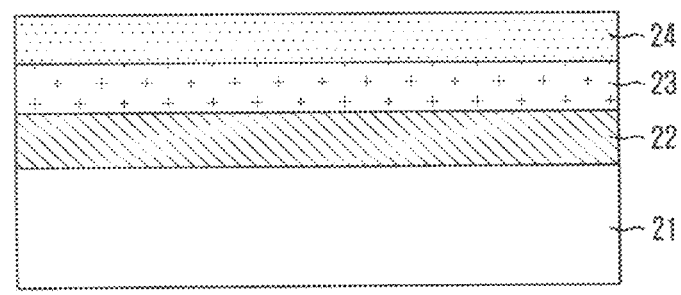

Referring to FIG. 15C, a first barrier material layer 24 is formed over the first polymer layer 23. The first barrier material layer 24 is used later to form an electron tunneling barrier surrounding nanocrystals in a nanocrystal layer. The first barrier material layer 24 is formed by performing an ALD method. The first barrier material layer 24 may include a metal oxide material, e.g., aluminum oxide (Al$_2$O$_3$) or titanium oxide (TiO$_2$).

Figure 15D:
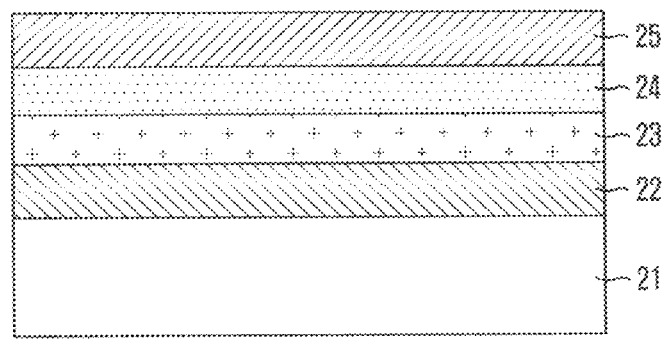

Referring to FIG. 15D, a metal layer 25 is formed over the first barrier material layer 24. The metal layer 25 is formed by the deposition method. The metal layer 25 may include metal that can be oxidized or cannot be oxidized, e.g., gold (Au). The metal layer 25 is formed to have a thickness of approximately 1 nm to approximately 10 nm.

Figure 15E:
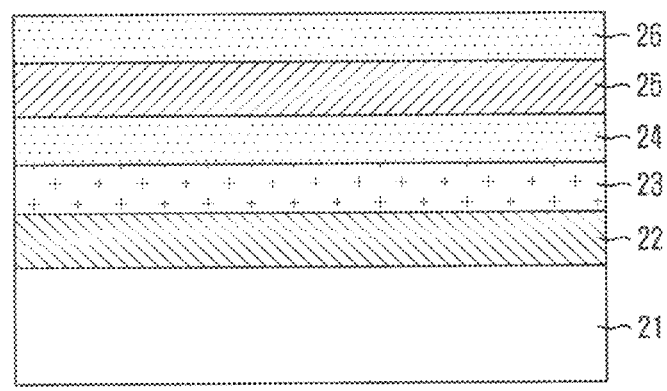

Referring to FIG. 15E, a second barrier material layer 26 is formed over the metal layer 25. Like the first barrier material layer 24, the second barrier material layer 26 will be used to form the electron tunneling barrier surrounding the nanocrystals in the nanocrystal layer. The second barrier material layer 26 is formed by substantially the same process as that used for forming the first barrier material layer 24. That is, the second barrier material layer 26 is formed by the ALD process and includes the metal oxide material, i.e., Al$_2$O$_3$ or the TiO$_2$.

Figure 15F:
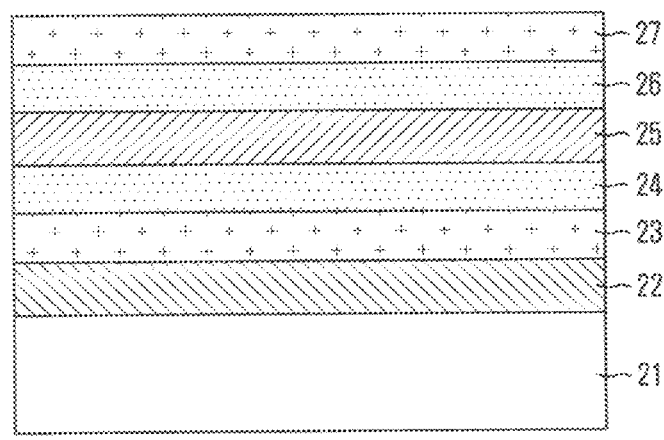

Referring to FIG. 15F, a second polymer layer 27 is formed over the second barrier material layer 26. The second polymer layer 27 is formed by substantially the same process as that used for forming the first polymer layer 23. That is, the second polymer layer 27 includes the PVK and is formed by the spin coating method.

Figure 15G:
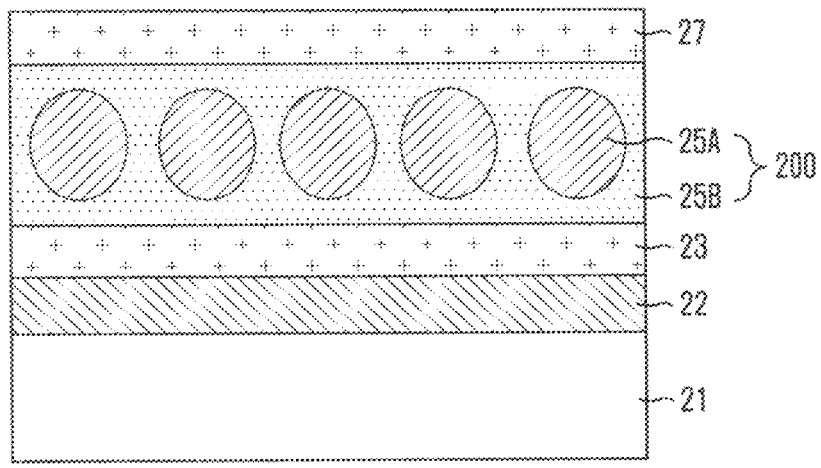

Referring to FIG. 15G, the curing process is performed on a resultant substrate where the second polymer layer 27 is formed. Through the curing process, the first and the second barrier material layers 24 and 26 change their structure to surround the nanocrystals 25A in the metal layer 25. Thus, a nanocrystal layer 200 is formed to include the nanocrystals 25A and a barrier 25B surrounding the nanocrystals 25A as described in FIG. 15G, wherein the nanocrystals 25A are formed from the metal layer 25 and the barrier 25B is formed from the first and the second barrier material layers 24 and 26. The curing process may be performed at a temperature of approximately 150° C. to approximately 300° C. for approximately four hours.

Figure 15H:
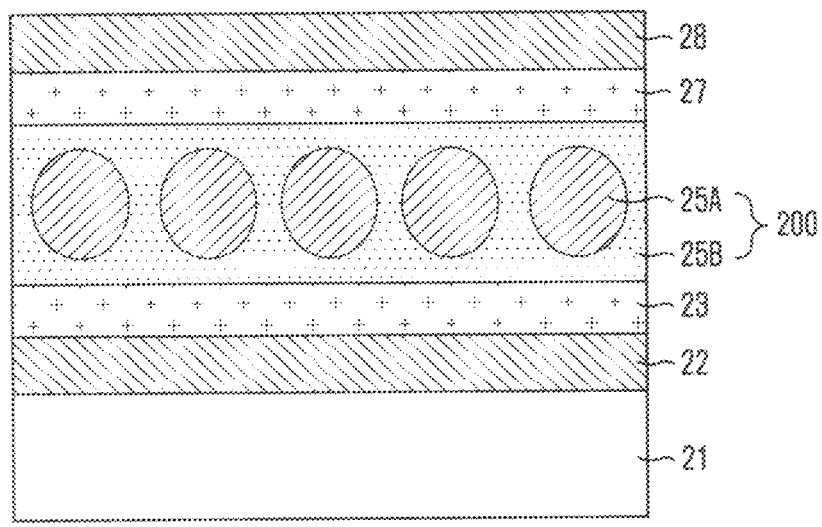

Referring to FIG. 15H, after forming the nanocrystal layer 200, an upper electrode 28 is formed over the second polymer layer 27. The material and the method to form the upper electrode 28 is the same as those used for forming the upper electrode 217 in FIG. 2F.

Different from the method described in FIGS. 2A to 3D, the method for forming the nanocrystal layer illustrated in FIGS. 15A to 15H employs the curing process which is performed on a stack structure of the polymer layer/the barrier material layer/the metal layer/the barrier material layer/the polymer layer so that the polymer layer including the nanocrystal layer therein is formed. In this process, the nanocrystals with a regular size and dispersion are formed to thereby secure the stable device performance.

Figure 16A:
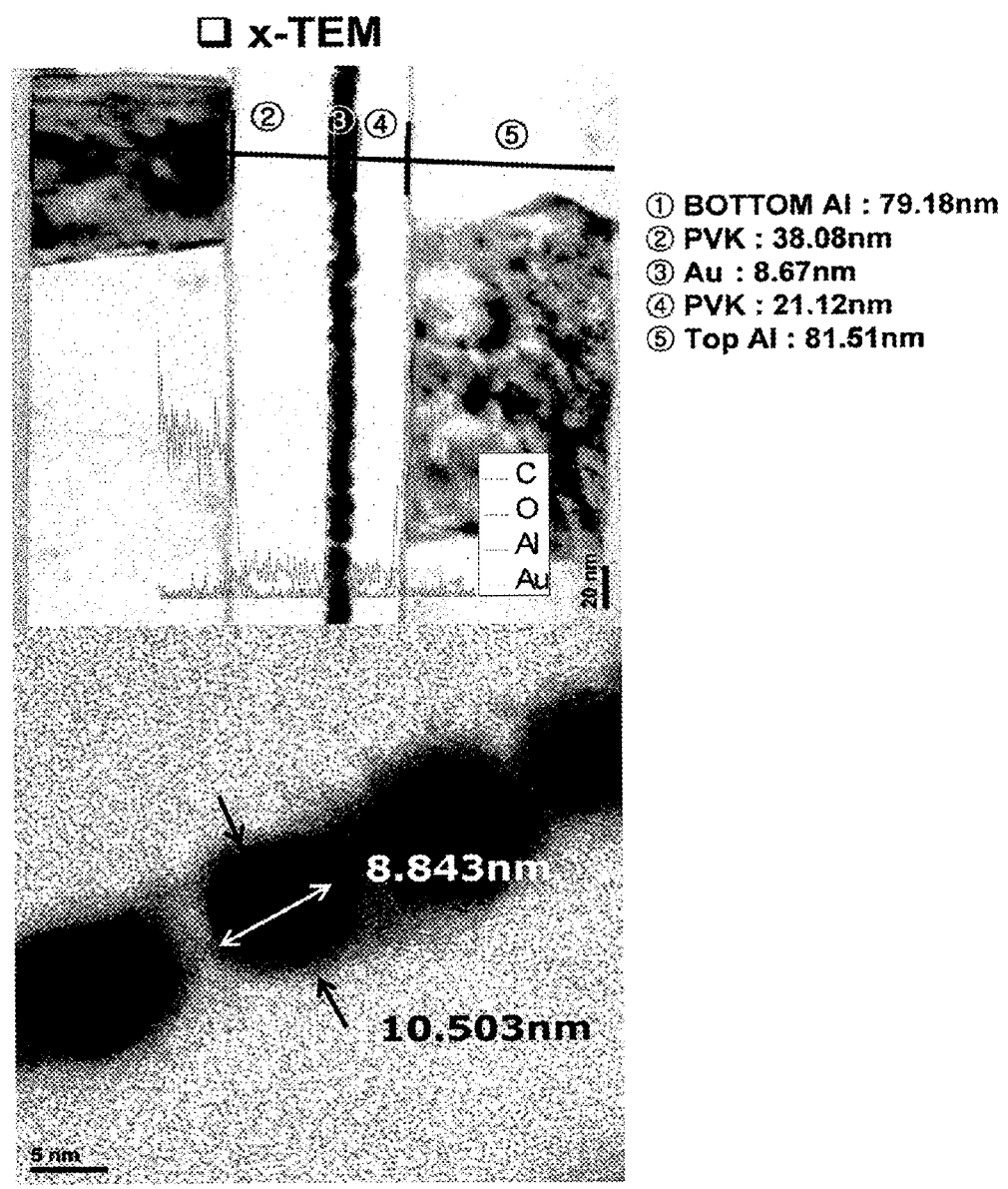
FIGS. 16A and 16B are micrographic views of a section of the non-volatile memory device formed by the method illustrated in FIGS. 15A to 15H.
Figure 16B:
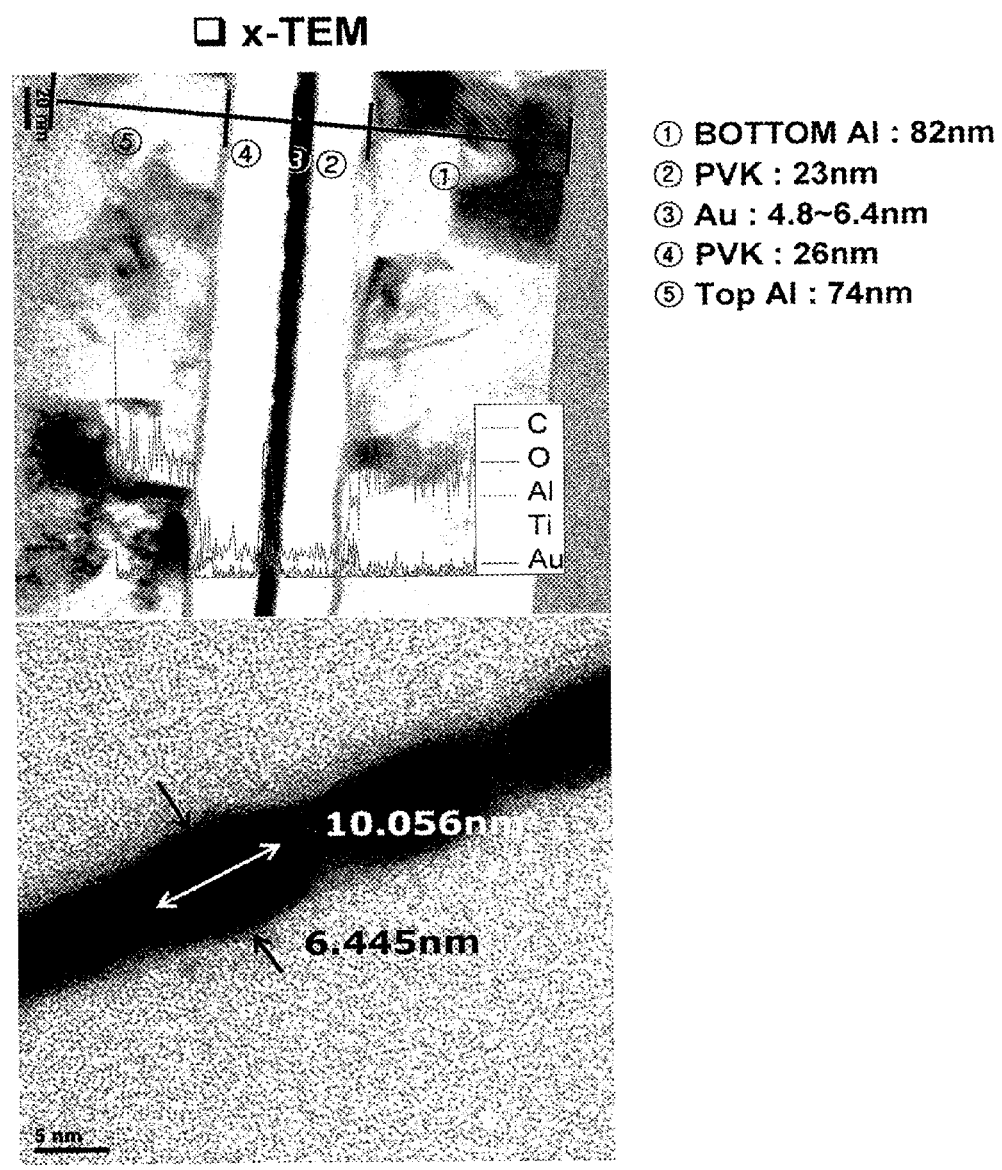

FIGS. 16A and 16B are micrographic views of a section of the non-volatile memory device formed by the method illustrated in FIGS. 15A to 15H. FIG. 16A is a micrographic view of the non-volatile memory device using the PVK as the conductive organic material layer, i.e., the polymer layer, and including the Au nanocrystals surrounded by the Al$_2$O$_3$ barrier and FIG. 16B is a micrographic view of the non-volatile memory device using the PVK as the conductive organic material layer and including the Au nanocrystals surrounded by the TiO$_2$ barrier.

Referring to FIGS. 16A and 16B, it is noted that the Au nanocrystals are surrounded and separated from each other by the barrier material, i.e. Al$_2$O$_3$ or TiO$_2$.

FIGS. 17A and 17B illustrate energy band diagrams of the non-volatile memory device using the PVK as the conductive organic material layer and including the Au nanocrystals surrounded by the Al$_2$O$_3$ barrier and the TiO$_2$ barrier, respectively.

The energy bands shown in FIGS. 17A and 17B are substantially the same as those described in FIGS. 14A and 14B. That is, the nanocrystal layer including the Au nanocrystals and the amorphous barrier material, i.e. the Al$_2$O$_3$ or the TiO$_2$, and the PVK which is the conductive organic material have an energy level gap therebetween so that the electrons are charged in the Au nanocrystals. Thus, it is expected that the resistance state and the operational characteristic of the device are substantially the same as those of the non-volatile memory device in FIGS. 1A to 14B.

Figure 18A:
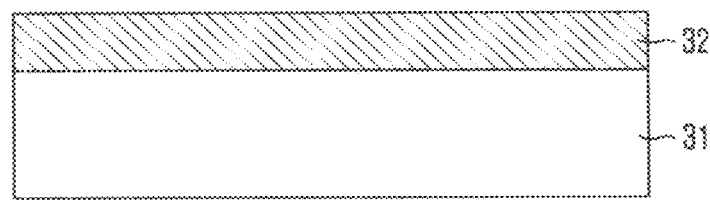
FIGS. 18A to 18C illustrate cross-sectional views of a method for fabricating a non-volatile memory device in accordance with still another embodiment of the present invention.
Figure 18B:
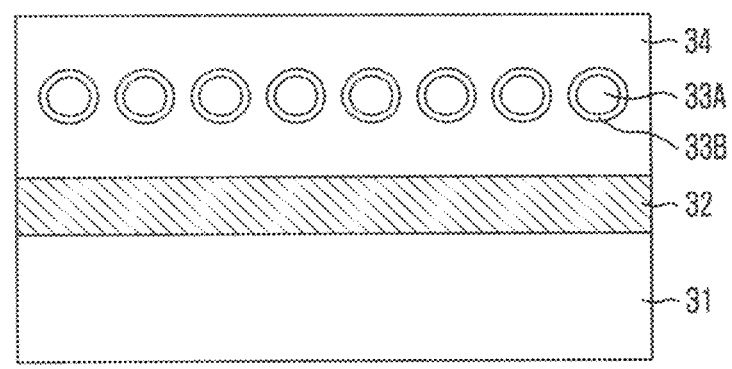
Figure 18C:
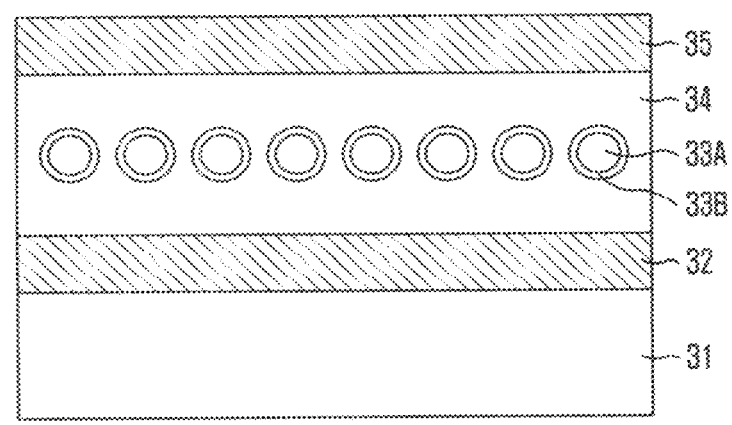

FIGS. 18A to 18C illustrate cross-sectional views of a method for fabricating the non-volatile memory device in accordance with still another embodiment of the present invention.

Unlike the aforementioned embodiments, formation of the polymer layer and the nanocrystals surrounded by the barrier material is simultaneously performed in this embodiment. Therefore, in accordance with this embodiment, the nanocrystals and the barrier material surrounding the nanocrystals are separately disposed in the polymer layer.

Referring to FIG. 18A, a lower electrode 32 is formed over a substrate 31. The method and the material used for forming the lower electrode 32 are substantially the same as those used in FIGS. 2A.

Referring to FIG. 18B, a polymer layer 34 including a plurality of nanocrystals 33A is formed over the lower electrode 32, wherein each of the nanocrystals 33A is surrounded by its corresponding barrier 33B. The method for forming the polymer layer 34 including the nanocrystals 33A surrounded by corresponding barriers 33B is described later with reference to FIG. 19.

Referring to FIG. 18C, an upper electrode 35 is formed over the polymer layer 34. The material and the method used for forming the upper electrode 35 is substantially the same as those used for forming the upper electrode 17 in FIG. 2F.

Figure 19:
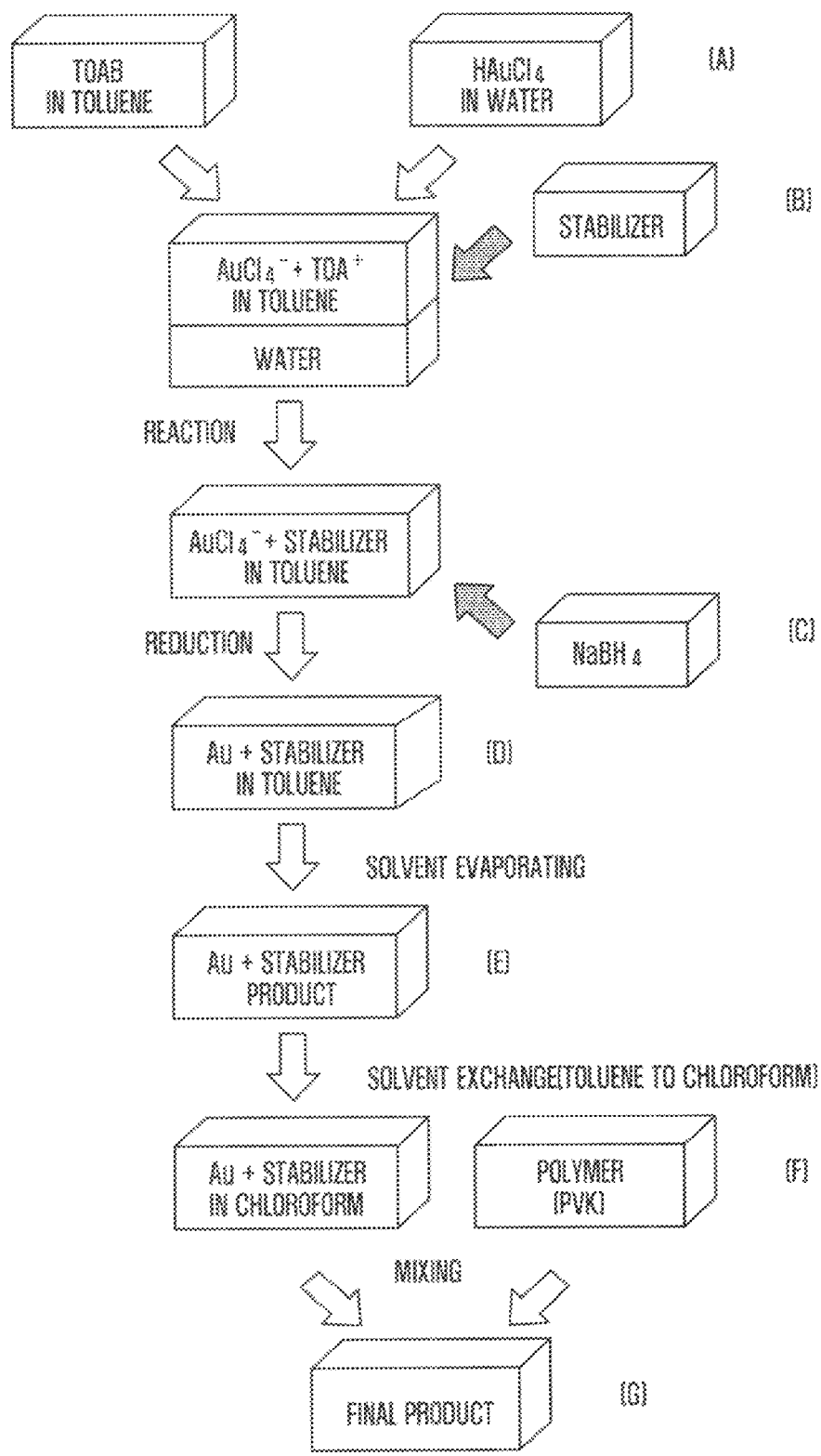
FIG. 19 illustrates a view of explaining a method for forming a polymer layer described in FIG. 18B in detail.

FIG. 19 illustrates a diagram explaining a method for forming the polymer layer described in FIG. 18B in detail. Particularly, in FIG. 19, the polymer layer including Au nanocrystals surrounded by CB barriers is formed. The Au nanocrystals surrounded by CB barriers are horizontally dispersed in the polymer layer.

Referring to FIG. 19, processes (A) and (B) are performed to compound the nanocrystals 33A surrounded by the barriers 33B.

In the process (A), metal salt, e.g., chloroauric acid ($HAuCl_4$) is soluble in deionized (DI) water which is an aqueous solvent to make an aqueous solution of metal salt. At this time, the metal salt, i.e., $HAuCl_4$, is ionized to $H^+$ and $AuCl_4^-$ to function as an Au source. Further, a tetraoctylammonium (TOAB) is soluble in a toluene solvent that is a non-aqueous solvent, so that a toluene solution including ionized TOAB is formed. In a subsequent process, the ionized TOAB functions as a phase transfer catalyzer for transferring the aurum tetrachloride complex ion $AuCl_4^-$ containing metal to the toluene solution.

In the process (B), when stirring the aqueous solution of the metal salt and the toluene solution where the TOAB is soluble, the $AuCl_4^-$ is transferred to the toluene solution. The stirring process may be performed at a rate of more than 500 rpm.

Then, carbazole terminated thiol (CB) is added as a stabilizer into the toluene solution to stabilize the dispersion of the Au nanocrystals and then stirred. This stirring process may be performed for approximately 5 minutes to approximately 20 minutes. A molecular formula of the CB which is the dispersion stabilizer is $C_{23}H_{31}NS$ and a chemical name thereof is 11-carbazolyl dodecane thiol.

In the process (c), sodium brohydride ($NaBH_4$) is added as a reducer for reducing the $AuCl_4^-$ into the toluene solution where the CB is added in the process (B) and then stirred. This stirring process may be performed at a rate of more than approximately 500 rpm and at room temperature for approximately 3 hours to approximately 10 hours.

As a result, as shown in the process (D), the compound of the Au nanocrystals and the CB is formed in the toluene solution. The CB is formed to surround the Au nanocrystals, so that the CB functions as not only the dispersion stabilizer but also the electron tunneling barrier like the aforementioned barrier materials.

In the process (E), the toluene solution is evaporated, so that the compound of the Au nanocrystals and the CB remains. The evaporation may be performed in a rotary evaporator by applying a low pressure of not more than approximately −1 Bar.

In the process (F), the compound of the Au nanocrystals and the CB is soluble in a non-aqueous solution, e.g., a chloroform solution, to be mixed with the polymer. The PVK as the polymer is mixed with the chloroform solution.

Finally, in the process (G), a final solution including the Au nanocrystals surrounded by the CB and the polymer is formed. When this solution is spin coated on the substrate, a structure of the polymer layer 34 in FIG. 18B is formed. In this embodiment, the nanocrystals 33A horizontally dispersed in the polymer layer 34 are Au and the barriers 33B surrounding the nanocrystals 33A is CB. When the method illustrated in FIGS. 18A to 19 is used, the nanocrystals with a stable size and dispersion can also be obtained. Particularly, since the polymer layer including the nanocrystals is formed by the spin coating process, the fabrication process is simplified.

Figure 20:
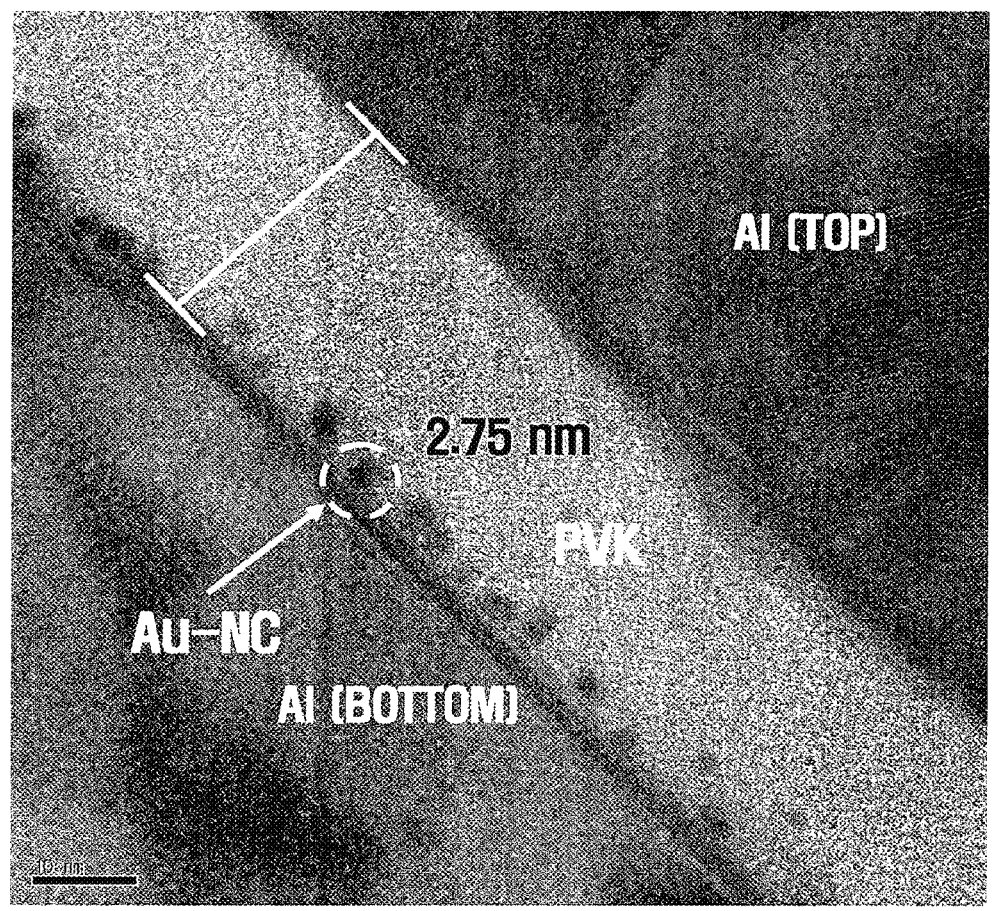
FIG. 20 is a micrographic view of the non-volatile memory device formed by using the method illustrated in FIGS. 18A to 18C and FIG. 19.

FIG. 20 is a micrographic view of the non-volatile memory device formed by using the method illustrated in FIGS. 18A to 18C and FIG. 19. Referring to FIG. 20, it is noted that the Au nanocrystals are horizontally dispersed in the PVK polymer layer and separated from each other.

Figure 21:
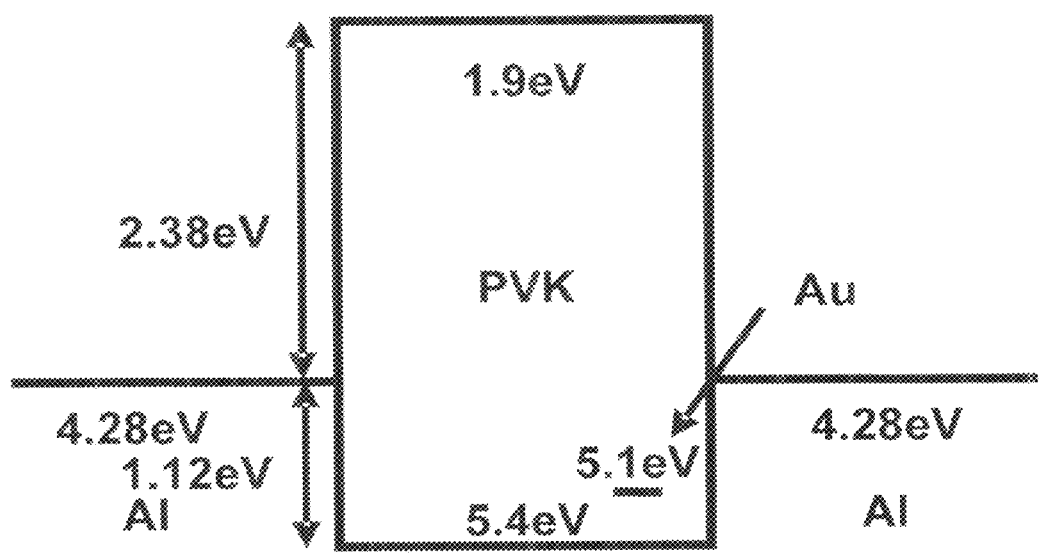
FIG. 21 presents an energy band diagram of a non-volatile memory device including a PVK polymer layer where Au nanocrystals surrounded by a CB barrier material are dispersed.

FIG. 21 presents an energy band diagram of the non-volatile memory device including the PVK polymer layer where the Au nanocrystals surrounded by the CB barriers are dispersed.

The energy band in FIG. 21 is similar to those in FIGS. 14A and 14B. That is, the Au nanocrystals surrounded by the CB barriers and the PVK which is the conductive organic material have an energy level gap therebetween so that electrons are charged in the Au nanocrystals. Thus, it is expected that the resistance state and the operational characteristic of the device are also similar to those of the non-volatile memory device in FIGS. 1A to 14B.

Figure 22:
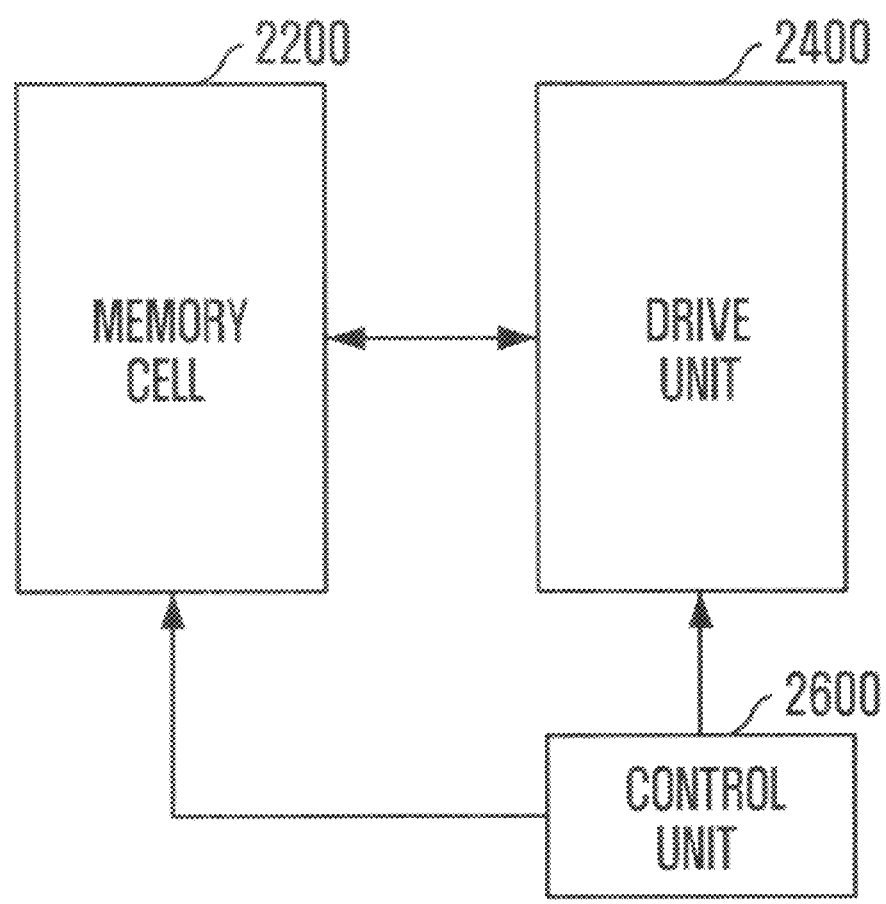
FIG. 22 illustrates a block diagram of a non-volatile memory device in accordance with an embodiment of the present invention.

FIG. 22 illustrates a block diagram of a non-volatile memory device in accordance with an embodiment of the present invention.

Referring to FIG. 22, the non-volatile memory device includes a memory cell 2200, a drive unit 2400 and a control unit 2600.

A non-volatile memory device generally includes a cell array having a plurality of cells and a peripheral circuit performing an operation of reading data from a memory cell or writing data to the memory cell. Since the non-volatile memory device in accordance with the present invention has a structure similar to that of the general non-volatile memory device, the memory cell 2200 is located in the cell array, and the drive unit 2400 and the control unit 2600 are arranged in the peripheral circuit.

In particular, the memory cell 2200 has substantially the same structure as that described in FIG. 1A. That is, the memory cell 2200 includes the lower electrode 12, the upper electrode 17, the first and the second conductive organic material layers 13 and 16 disposed between the lower and the upper electrodes 12 and 17, and the nanocrystal layer 15 disposed in the first and the second conductive organic material layers 13 and 16, wherein the nanocrystal layer 15 includes the plurality of crystalline nanocrystals 15A surrounded by the amorphous barrier layer 15B. As illustrated in FIG. 1B, the memory cell 2200 may be substituted by two vertically stacked cells, i.e., the first cell 1C and the second cell 2C.

Furthermore, the memory cell 2200 may have the structure described in FIG. 18C. Namely, the memory cell 2200 may include the lower electrode 32, the upper electrode 35, the polymer layer 34 including the plurality of nanocrystals 33A surrounded by the barriers 33B between the lower and the upper electrodes 32 and 35. Likewise, the cell shown in FIG. 18C may also be stacked to substitute the memory cell 2200.

The drive unit 2400 drives the memory cell 2200. That is, the drive unit 2400 provides an input voltage to the lower and the upper electrodes of the memory cell 220 and thus the memory cell 2200 becomes to have a high resistance state, a low resistance state and a negative resistance state according to a voltage level of the input voltage. As a result, the memory cell 2200 has a multi-level output current during a read operation.

The drive unit 2400 supplies biases for the program operation, the read operation and the erase operation described above in detail with reference to FIGS. 6A to 7H. The drive unit 2400 is configured to obtain multi-level data values determined by the resistance state or the output current of the memory cell 2200 during the read operation.

The control unit 2600 controls the memory cell 2200 and the drive unit 2400 according to an operation mode of the device.

In accordance with the embodiments of the present invention, there are introduced various methods for forming the nanocrystals capable of stabilizing a threshold voltage and an $I_{on}/I_{off}$ rate of the non-volatile memory device. When the methods are applied, data may be retained even though power is not supplied and the device is highly integrated while having a memory cell size of $4F^2$. Furthermore, a high processing speed of the PoRAM device can be kept and a stable size and distribution of the nanocrystals are secured. In addition, in accordance with the present invention, a unit cell can have a multi-level data using an intermediate resistance state of a bistable conductive characteristic and the non-volatile memory device with a stack structure of unit cells and the method for fabricating the same are provided.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A non-volatile memory device including a plurality of unit cells, each unit cell comprising:
    lower and upper electrodes over a substrate;
    a conductive organic material between the lower and the upper electrodes; and
    a nanocrystal layer located within the conductive organic material, wherein the nanocrystal layer includes a plurality of nanocrystals, each nanocrystal being surrounded by an amorphous barrier,
    wherein the unit cell is configured to receive a plurality of voltage ranges to perform a plurality of operations, where
    a read operation is performed when an input voltage coupled to the lower and the upper electrodes is in a first voltage range;
    a first write operation is performed for writing a first input data when the input voltage is in a second voltage range higher than the first voltage range;
    a second write operation is performed for writing a second input data when the input voltage is in a third voltage range higher than the second voltage range; and
    an erase operation is performed for erasing the first or the second input data when the input voltage is in a fourth voltage range higher than the third voltage range.

2. The non-volatile memory device of claim 1, wherein the nanocrystal layer is formed by depositing a first metal layer capable of being oxidized and performing a plasma oxidation process on the first metal layer, and the nanocrystals includes the first metal and the amorphous barrier includes an oxide material of the first metal layer,
    wherein the amorphous barrier defines a continuous layer where the nanocrystals are distributed therein.

3. The non-volatile memory device of claim 1, wherein the nanocrystal layer is formed by a curing process performed on a structure having a certain material included in the conductive organic material and a second metal included in the certain material, the nanocrystals including the second metal and the amorphous barrier including the certain material.

4. The non-volatile memory device of claim 1, wherein the nanocrystal layer includes the nanocrystals having one selected from the group consisting of Al, Mg, Ti, Zn, Fe, Ni, Sn, Pb, Cu, and a combination thereof, and the amorphous barrier having an oxide material of the selected one.

5. The non-volatile memory device of claim 1, wherein the nanocrystals include Al and the amorphous barrier includes $Al_xO_y$, wherein x and y are positive integers.

6. The non-volatile memory device of claim 1, wherein the nanocrystals include Ni and the amorphous barrier includes $Ni_xO_y$, wherein x and y are positive integers.

7. The non-volatile memory device of claim 1, wherein the nanocrystals include Au.

8. The non-volatile memory device of claim 7, wherein the amorphous barrier includes $Al_2O_3$ or $TiO_2$, or both.

9. The non-volatile memory device of claim 1, wherein the conductive organic material includes at least one selected from the group consisting of $Alq_3$, α-NPD, and AIDCN.

10. The non-volatile memory device of claim 1, wherein the conductive organic material includes a polymer.

11. The non-volatile memory device of claim 10, wherein the polymer includes PVK.

12. The non-volatile memory device of claim 1, wherein, a peak current is outputted during a read operation of the first input data, a minimum current is outputted during a read operation after data is erased, a current having various levels between the peak current and the minimum current is outputted according to a voltage level of the voltage supplied in the third voltage range during a read operation of the second input data.

13. The non-volatile memory device of claim 1, wherein the first voltage range has 0.1 V to a threshold voltage, the second voltage range has the threshold voltage to a peak current voltage, the third voltage range has the peak current voltage to a voltage in a negative resistance range, and the fourth voltage range has a voltage higher than the voltage in the negative resistance range, wherein, a current decreases as the input voltage increases in the negative resistance range.

14. A non-volatile memory device, comprising:
    a plurality of unit cells; and
    a control unit for providing an input voltage to each unit cell,
    wherein each unit cell has a multi-level output current according to a voltage level of the input voltage coupled to its electrodes during a data read operation and includes:

first and second electrodes provided over a substrate and coupled with the input voltage;

a conductive organic material layer between the first and the second electrodes; and a nanocrystal layer located within the conductive organic material layer, wherein the nanocrystal layer includes a plurality of nanocrystals, each nanocrystal being surrounded by an amorphous barrier.

* * * * *